(12) United States Patent
Samuels et al.

(10) Patent No.: US 9,582,193 B2
(45) Date of Patent: *Feb. 28, 2017

(54) TRIGGERING A PROCESS TO REDUCE DECLARED CAPACITY OF A STORAGE DEVICE IN A MULTI-STORAGE-DEVICE STORAGE SYSTEM

(71) Applicant: SanDisk Technologies LLC, Plano, TX (US)

(72) Inventors: Allen Samuels, San Jose, CA (US); Warren Fritz Kruger, Sunnyvale, CA (US); Linh Tien Truong, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/621,237

(22) Filed: Feb. 12, 2015

(65) Prior Publication Data

US 2016/0062665 A1 Mar. 3, 2016

Related U.S. Application Data

(60) Provisional application No. 62/044,890, filed on Sep. 2, 2014.

(51) Int. Cl.
*G06F 3/06* (2006.01)
*G06F 12/02* (2006.01)

(52) U.S. Cl.
CPC .......... *G06F 3/0608* (2013.01); *G06F 3/0616* (2013.01); *G06F 3/0629* (2013.01);
(Continued)

(58) Field of Classification Search
None
See application file for complete search history.

(56) References Cited

U.S. PATENT DOCUMENTS 5,524,231 A 6/1996 Brown
5,953,255 A 9/1999 Lee
(Continued)

FOREIGN PATENT DOCUMENTS

WO WO 2011/031903 3/2011
WO WO 2012/174216 12/2012

OTHER PUBLICATIONS

International Search Report and Written Opinion dated Nov. 6, 2015, received in International Patent Application No. PCT/US2015/047892 which corresponds to U.S. Appl. No. 14/621,237, 9 pages (Samuels).

(Continued)

*Primary Examiner* — Kaushikkumar Patel
(74) *Attorney, Agent, or Firm* — Morgan, Lewis & Bockius LLP

(57) ABSTRACT

Systems, methods and/or devices are used to enable triggering a process to reduce declared capacity of a storage device in a multi-storage-device storage system. In one aspect, the method includes: (1) obtaining, for each storage device of a plurality of storage devices of the storage system, one or more metrics of the storage device, the storage device including non-volatile memory, (2) detecting a trigger condition for reducing declared capacity of the non-volatile memory of a respective storage device of the plurality of storage devices, the trigger condition detected in accordance with the one or more metrics of one or more storage devices, and (3) enabling an amelioration process associated with the detected trigger condition, the amelioration process to reduce declared capacity of the non-volatile memory of the respective storage device. In some embodiments, the respective storage device includes one or more flash memory devices.

28 Claims, 32 Drawing Sheets

(52) U.S. Cl.
CPC .......... *G06F 3/0661* (2013.01); *G06F 3/0688* (2013.01); *G06F 12/0246* (2013.01); *G06F 2212/7201* (2013.01); *G06F 2212/7204* (2013.01); *G06F 2212/7205* (2013.01); *G06F 2212/7211* (2013.01)

(56) References Cited

U.S. PATENT DOCUMENTS

| | | |
|---|---|---|
| 7,609,561 B2 | 10/2009 | Cornwell et al. |
| 7,761,678 B1 | 7/2010 | Bodmer et al. |
| 8,711,665 B1 | 4/2014 | Abdul Hamid |
| 8,898,548 B1 | 11/2014 | Mullendore et al. |
| 9,292,440 B2 | 3/2016 | Shalvi et al. |
| 2003/0051090 A1 | 3/2003 | Bonnett et al. |
| 2005/0172068 A1 | 8/2005 | Sukegawa |
| 2006/0158933 A1 | 7/2006 | Ryu |
| 2008/0112222 A1 | 5/2008 | Shirakawa |
| 2008/0159007 A1 | 7/2008 | Sekar et al. |
| 2008/0235432 A1 | 9/2008 | Chen et al. |
| 2008/0320214 A1 | 12/2008 | Ma et al. |
| 2009/0046509 A1 | 2/2009 | Annavajjhala et al. |
| 2009/0240873 A1 | 9/2009 | Yu et al. |
| 2009/0300269 A1 | 12/2009 | Radke et al. |
| 2009/0319720 A1 | 12/2009 | Stefanus et al. |
| 2010/0008140 A1 | 1/2010 | Lee |
| 2010/0017557 A1 | 1/2010 | Nakanishi et al. |
| 2010/0023682 A1 | 1/2010 | Lee et al. |
| 2010/0332895 A1 | 12/2010 | Billing et al. |
| 2010/0332922 A1* | 12/2010 | Chang .................... G11C 5/143 714/704 |
| 2010/0332950 A1 | 12/2010 | Billing et al. |
| 2011/0099321 A1 | 4/2011 | Haines et al. |
| 2011/0199833 A1 | 8/2011 | Shim et al. |
| 2011/0209031 A1 | 8/2011 | Kim et al. |
| 2011/0219259 A1 | 9/2011 | Frost et al. |
| 2011/0302477 A1* | 12/2011 | Goss .................... G06F 11/1068 714/773 |
| 2012/0005451 A1 | 1/2012 | Lee et al. |
| 2012/0023285 A1 | 1/2012 | Kim |
| 2012/0144110 A1 | 6/2012 | Smith |
| 2012/0240012 A1* | 9/2012 | Weathers ............. G06F 11/1072 714/773 |
| 2012/0300527 A1 | 11/2012 | Shim et al. |
| 2013/0086454 A1* | 4/2013 | Rub ...................... H03M 13/05 714/773 |
| 2013/0138870 A1 | 5/2013 | Yoon et al. |
| 2013/0170297 A1 | 7/2013 | Nam et al. |
| 2013/0176784 A1 | 7/2013 | Cometti et al. |
| 2013/0242667 A1 | 9/2013 | Shim et al. |
| 2014/0006688 A1 | 1/2014 | Yu et al. |
| 2014/0122787 A1* | 5/2014 | Shalvi .................... G06F 11/10 711/103 |
| 2014/0136927 A1 | 5/2014 | Li et al. |
| 2014/0149641 A1 | 5/2014 | Avila et al. |
| 2014/0189421 A1 | 7/2014 | Werner et al. |
| 2014/0281126 A1 | 9/2014 | Bleyer et al. |
| 2014/0281152 A1 | 9/2014 | Karamcheti et al. |
| 2014/0351486 A1 | 11/2014 | Baryudin |
| 2014/0365719 A1* | 12/2014 | Kuzmin .............. G06F 12/0246 711/103 |
| 2014/0379968 A1 | 12/2014 | Yao et al. |

OTHER PUBLICATIONS

International Search Report and Written Opinion dated Nov. 6, 2015, received in International Patent Application No. PCT/US2015/04789 which corresponds to U.S. Appl. No. 14/621,253, 9 pages (Samuels).

International Search Report and Written Opinion dated Oct. 8, 2015, received in International Patent Application No. PCT/US2015/047898 which corresponds to U.S. Appl. No. 14/621,263, 9 pages (Samuels).

International Search Report and Written Opinion dated Nov. 6, 2015 received in International Patent Application No. PCT/US2015/047901, which corresponds to U.S. Appl. No. 14/621,212, 9 pages (Samuels).

International Search Report and Written Opinion dated Oct. 29, 2015 received in International Patent Application No. PCT/US2014/053941, which corresponds to U.S. Appl. No. 14/621,121, 9 pages (Samuels).

International Search Report and Written Opinion dated Nov. 6, 2015 received in International Patent Application No. PCT/US2014/047908, which corresponds to U.S. Appl. No. 14/621,148, 9 pages (Samuels).

Kgil et al., "Improving NAND Flash Based Disk Cached", ISCA '08, 35th International Symposium on Computer Architecture, Jun. 21, 2008, 12 pages.

International Search Report and Written Opinion dated Jul. 23, 2015, received in International Patent Application No. PCT/US2015/030847, which corresponds to U.S. Appl. No. 14/321,701, 13 pages (Thuong).

International Search Repost and Written Opinion dated Jul. 23, 2015, received in International Patent Application No. PCT/US2015/030851 which corresponds to U.S. Appl. No. 14/298,841, 15 pages (Higgins).

International Search Report and Written Opinion dated Oct. 27, 2014 received in International Patent Application No. PCT/US2014/053868, which corresponds to U.S. Appl. No. 14/470,580, 8 pages (Kruger).

International Search Report and Written Opinion dated Oct. 29, 2014 received in International Patent Application No. PCT/US2014/053879, which corresponds to U.S. Appl. No. 14/470,596, 8 pages (Kruger).

International Search Report and Written Opinion dated Nov. 6, 2014 received in International Patent Application No. PCT/US2014/053941, 8 pages (Samuels).

International Search Report and Written Opinion dated Oct. 29, 2015 received in International Patent Application No. PCT/US2015/047904, which corresponds to U.S. Appl. No. 14/621,121, 9 pages (Samuels).

* cited by examiner

TRIGGERING A PROCESS TO REDUCE DECLARED CAPACITY OF A STORAGE DEVICE IN A MULTI-STORAGE-DEVICE STORAGE SYSTEM

RELATED APPLICATIONS

This application claims priority to U.S. Provisional Patent Application Ser. No. 62/044,890, filed Sep. 2, 2014, which is herein incorporated by reference in its entirety.

This application is related to the following applications, each of which is herein incorporated by reference in its entirety:

U.S. patent application Ser. No. 14/621,200, filed Feb. 12, 2015, which claims priority to U.S. Provisional Patent Application Ser. No. 62/044,883, filed Sep. 2, 2014;

U.S. patent application Ser. No. 14/621,219, filed Feb. 12, 2015, which claims priority to U.S. Provisional Patent Application Ser. No. 62/044,919, filed Sep. 2, 2014;

U.S. patent application Ser. No. 14/621,235, filed Feb. 12, 2015, which claims priority to U.S. Provisional Patent Application Ser. No. 62/044,898, filed Sep. 2, 2014;

U.S. patent application Ser. No. 14/621,263, filed Feb. 12, 2015, which claims priority to U.S. Provisional Patent Application Ser. No. 62/044,905, filed Sep. 2, 2014;

U.S. patent application Ser. No. 14/621,275, filed Feb. 12, 2015, which claims priority to U.S. Provisional Patent Application Ser. No. 62/044,981, filed Sep. 2, 2014;

U.S. patent application Ser. No. 14/621,289, filed Feb. 12, 2015, which claims priority to U.S. Provisional Patent Application Ser. No. 62/044,989, filed Sep. 2, 2014;

U.S. patent application Ser. No. 14/621,292, filed Feb. 12, 2015, which claims priority to U.S. Provisional Patent Application Ser. No. 62/044,983, filed Sep. 2, 2014;

U.S. patent application Ser. No. 14/621,212, filed Feb. 12, 2015, which claims priority to U.S. Provisional Patent Application Ser. No. 62/044,963, filed Sep. 2, 2014;

U.S. patent application Ser. No. 14/621,090, filed Feb. 12, 2015, which claims priority to U.S. Provisional Patent Application Ser. No. 62/044,930, filed Sep. 2, 2014;

U.S. patent application Ser. No. 14/621,107, filed Feb. 12, 2015, which claims priority to U.S. Provisional Patent Application Ser. No. 62/044,969, filed Sep. 2, 2014;

U.S. patent application Ser. No. 14/621,121, filed Feb. 12, 2015, which claims priority to U.S. Provisional Patent Application Ser. No. 62/044,976, filed Sep. 2, 2014;

U.S. patent application Ser. No. 14/621,135, filed Feb. 12, 2015, which claims priority to U.S. Provisional Patent Application Ser. No. 62/044,932, filed Sep. 2, 2014; and U.S. patent application Ser. No. 14/621,148, filed Feb. 12, 2015, now U.S. Pat. No. 9,158,681, which claims priority to U.S. Provisional Patent Application Ser. No. 62/044,936, filed Sep. 2, 2014.

TECHNICAL FIELD

The disclosed embodiments relate generally to memory systems, and in particular, to triggering a process to reduce declared capacity of a storage device (e.g., comprising one or more flash memory devices) in a multi-storage-device storage system.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell.

Repeated erasure and reprogramming of flash memory cells causes degradation of the charge storage capability (wear). Eventually, the charge storage capability degrades to the point where it becomes impossible or infeasible to recover the original data (e.g., an unrecoverable codeword is read from the flash memory device, the computational resources required to recover a codeword exceed a predefined threshold, or a count of program-erase (P/E) cycles for the flash memory device exceeds a threshold value) and the device is considered worn out. Wear-leveling technology is often used to distribute the wear across the multiple portions of a flash memory device. In a typical system, once the wear limit of a portion of a flash memory device is reached, the entire flash memory device is considered to have failed.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to enable triggering a process to reduce declared capacity of a storage device in a multi-storage-device storage system. In one aspect, a trigger condition is detected in accordance with one or more metrics of one or more storage devices of a plurality of storage devices of a storage system, and an amelioration process associated with the detected trigger condition is enabled, the amelioration process to reduce declared capacity of non-volatile memory of a respective storage device.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIG. 2A-2 is a block diagram illustrating an implementation of a management module, in accordance with some embodiments.

FIG. 2B-1 is a block diagram illustrating an implementation of a system management module, in accordance with some embodiments.

FIG. 2B-2 is a block diagram illustrating an implementation of a system management module, in accordance with some embodiments.

FIG. 2C-1 is a block diagram illustrating an implementation of a cluster management module, in accordance with some embodiments.

FIG. 2C-2 is a block diagram illustrating an implementation of a cluster management module, in accordance with some embodiments.

Figure 1A:
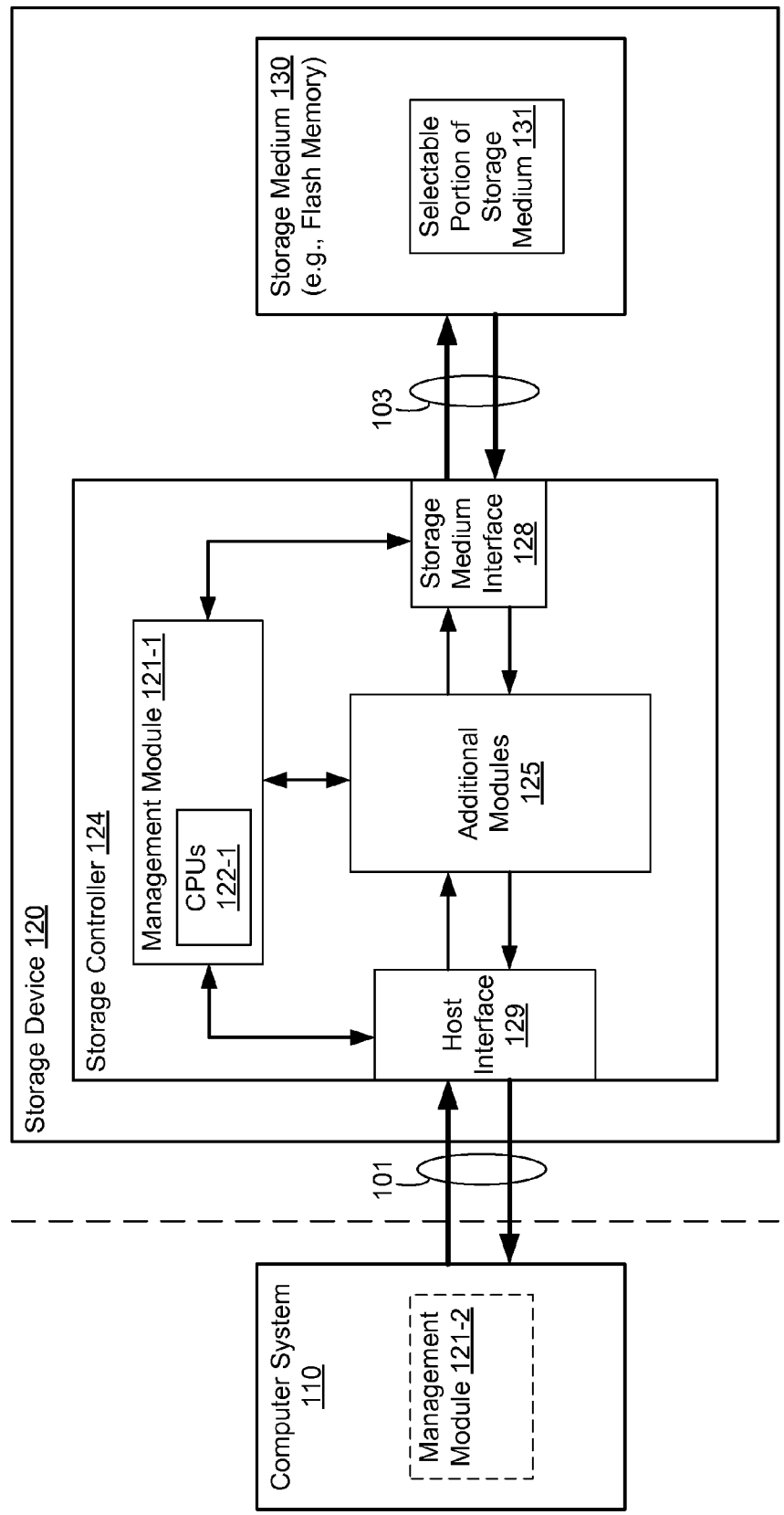
FIG. 1A is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

When a multi-level flash cell has reached its wear limit it typically still has charge retention capability sufficient to store a reduced number of charge levels. Often it is the case that a substantial number of erasure and reprogramming cycles can be performed on a wear-limited multi-level flash cell with full recovery of the stored data, provided that a reduced number of charge levels is used and expected. For example, a flash memory device operating in 3 bits per cell mode (TLC) typically can perform between 500 and 1500 erasure and reprogramming cycles before being considered worn out. However, at that point in time it will typically still have sufficient charge storage capability to operate in the single bit per cell mode (SLC) for an additional 10,000 to 20,000 erasure and reprogramming cycles before the SLC wear limit is encountered. Thus the lifetime of the flash memory device may be extended provided that it can be allowed to store less data. Currently it is difficult for a storage system to utilize this extended capability because storage system mechanisms for managing and working with a storage device whose capacity decreases with usage, by decreasing over-provisioning, are inadequate. Consequently what is desired are mechanisms for managing and working with such a storage device, including mechanisms to inform the surrounding system of its impending (or imminent) reduction in capacity so that the system may adjust its operation accordingly. Potentially, memory devices with other forms of non-volatile memory may benefit from the same or similar mechanisms as those described in this document.

The various embodiments described herein include systems, methods and/or devices used to enable triggering a process to reduce declared capacity of a storage device. Some embodiments include systems, methods and/or devices to detect a trigger condition in accordance with one or more metrics of a storage device and enable an amelioration process associated with the detected trigger condition, the amelioration process to reduce declared capacity of non-volatile memory of the storage device.

(A1) More specifically, some embodiments include a method of managing a storage system. In some embodiments, the method includes, at a storage device of the storage system: (1) generating one or more metrics of the storage device, the storage device including non-volatile memory, (2) detecting a trigger condition in accordance with the one or more metrics of the storage device, and (3) enabling an amelioration process associated with the detected trigger condition, the amelioration process to reduce declared capacity of the non-volatile memory of the storage device.

(A1-1) In some embodiments of the method of A1, the method further includes: (1) prior to detecting the trigger condition, detecting a first wear condition of the non-volatile memory of the storage device, wherein a total storage capacity of the non-volatile memory of the storage device includes declared capacity and over-provisioning, and (2) in response to detecting the first wear condition, performing a remedial action that reduces over-provisioning of the non-volatile memory of the storage device without reducing declared capacity of the non-volatile memory of the storage device.

(A1-2) In some embodiments of the method of A1-1, detecting the trigger condition includes detecting a second wear condition distinct from the first wear condition.

(A2) In some embodiments of the method of A1 or A1-1 or A1-2, enabling the amelioration process associated with the detected trigger condition includes notifying a host to which the storage device is operatively coupled of the trigger condition.

(A3) In some embodiments of the method of A1 or A1-1 or A1-2, enabling the amelioration process associated with the detected trigger condition includes: (1) receiving a query from a host to which the storage device is operatively coupled, and (2) in response to receiving the query, reporting the trigger condition.

(A4) In some embodiments of the method of A1 or A1-1 or A1-2, enabling the amelioration process associated with the detected trigger condition includes: (1) receiving a command from a host to which the storage device is operatively coupled, and (2) in response to receiving the command, sending a response to the command and a notification of the trigger condition.

(A5) In some embodiments of the method of A1 or A1-1 or A1-2, enabling the amelioration process associated with the detected trigger condition includes: (1) receiving a command from a host to which the storage device is operatively coupled, and (2) in response to receiving the command, sending a response to the command and a notification that prompts the host to obtain information with respect to the trigger condition.

(A6) In some embodiments of the method of any of A2 to A5, the host includes a client on behalf of which data is stored in the storage system.

(A7) In some embodiments of the method of any of A2 to A5, the host includes a storage system controller of the storage system.

(A8) In some embodiments of the method of any of A2 to A5, the host includes a cluster controller of the storage system.

(A9) In some embodiments of the method of any of A1 to A8, enabling the amelioration process associated with the detected trigger condition includes scheduling the amelioration process to be performed on the storage device.

(A10) In some embodiments of the method of any of A1 to A9, enabling the amelioration process associated with the detected trigger condition includes determining one or more parameters for the amelioration process.

(A11) In some embodiments of the method of A10, enabling the amelioration process associated with the detected trigger condition further includes reporting at least a subset of the one or more parameters for the amelioration process.

(A12) In some embodiments of the method of any of A1 to A11, generating one or more metrics of the storage device includes generating at least one metric, of the one or more metrics, for each memory portion of a plurality of memory portions of the storage device.

(A13) In some embodiments of the method of any of A1 to A12, the one or more metrics of the storage device include one or more status metrics corresponding to the storage device's ability to retain data.

(A14) In some embodiments of the method of any of A1 to A13, the one or more metrics of the storage device include one or more performance metrics corresponding to performance of the storage device.

(A15) In some embodiments of the method of any of A1 to A14, the one or more metrics of the storage device include one or more wear metrics corresponding to wear on the storage device.

(A16) In some embodiments of the method of any of A1 to A15, the one or more metrics of the storage device include one or more time metrics.

(A17) In some embodiments of the method of any of A1 to A16, the one or more metrics of the storage device include values of the one or more metrics from more than one time.

(A18) In some embodiments of the method of any of A1 to A17, the method further includes, after enabling the amelioration process, (1) re-evaluating the trigger condition in accordance with the one or more metrics of the storage device, and (2) in accordance with a determination that the trigger condition is no longer valid, aborting the amelioration process to reduce declared capacity of the non-volatile memory of the storage device.

(A19) In some embodiments of the method of any of A1 to A18, the amelioration process to reduce declared capacity of the non-volatile memory of the storage device includes a process to reduce utilization of the non-volatile memory of the storage device.

(A20) In some embodiments of the method of any of A1 to A19, the storage device comprises one or more flash memory devices.

(A21) In another aspect, a storage device includes (1) non-volatile memory (e.g., comprising one or more non-volatile storage devices, such as flash memory devices), (2) one or more processors, and (3) controller memory (e.g., non-volatile memory or volatile memory in or coupled to the controller) storing one or more programs, which when executed by the one or more processors cause the storage device to perform or control performance of any of the methods A1 to A20 described herein.

(A23) In yet another aspect, any of the methods A1 to A20 described above are performed by a storage device including means for performing any of the methods described herein.

(A25) In yet another aspect, a storage system includes (1) a storage medium (e.g., comprising one or more non-volatile storage devices, such as flash memory devices) (2) one or more processors, and (3) memory (e.g., non-volatile memory or volatile memory in the storage system) storing one or more programs, which when executed by the one or more processors cause the storage system to perform or control performance of any of the methods A1 to A20 described herein.

(A26) In yet another aspect, some embodiments include a non-transitory computer readable storage medium, storing one or more programs configured for execution by one or more processors of a storage device, the one or more programs including instructions for performing any of the methods described herein.

The various embodiments described herein include systems, methods and/or devices used to enable triggering, at a host, a process to reduce declared capacity of a storage device. Some embodiments include systems, methods and/or devices to detect a trigger condition in accordance with one or more metrics of a storage device and enable an amelioration process associated with the detected trigger condition, the amelioration process to reduce declared capacity of non-volatile memory of the storage device.

(B1) More specifically, some embodiments include a method of managing a storage system. In some embodiments, the method includes, at a host to which a storage device of the storage system is operatively coupled: (1) obtaining one or more metrics of the storage device, the storage device including non-volatile memory, (2) detecting a trigger condition in accordance with the one or more metrics of the storage device, and (3) enabling an amelioration process associated with the detected trigger condition, the amelioration process to reduce declared capacity of the non-volatile memory of the storage device.

(B1-1) In some embodiments of the method of B1, the method further includes: (1) prior to detecting the trigger condition, detecting a first wear condition of the non-volatile memory of the storage device, wherein a total storage capacity of the non-volatile memory of the storage device includes declared capacity and over-provisioning, and (2) in response to detecting the first wear condition, performing a remedial action that reduces over-provisioning of the non-volatile memory of the storage device without reducing declared capacity of the non-volatile memory of the storage device.

(B1-2) In some embodiments of the method of B1-1, detecting the trigger condition includes detecting a second wear condition distinct from the first wear condition.

(B2) In some embodiments of the method of B1 or B1-1 or B1-2, the host includes a client on behalf of which data is stored in the storage system.

(B3) In some embodiments of the method of B1 or B1-1 or B1-2, the host includes a storage system controller of the storage system.

(B4) In some embodiments of the method of B1 or B1-1 or B1-2, the host includes a cluster controller of the storage system.

(B5) In some embodiments of the method of any of B1 to B4, enabling the amelioration process associated with the detected trigger condition includes scheduling the amelioration process to be performed on the storage device.

(B6) In some embodiments of the method of any of B1 to B5, enabling the amelioration process associated with the detected trigger condition includes determining one or more parameters for the amelioration process.

(B7) In some embodiments of the method of B6, enabling the amelioration process associated with the detected trigger condition further includes conveying at least a subset of the one or more parameters for the amelioration process to the storage device.

(B8) In some embodiments of the method of any of B1 to B7, obtaining one or more metrics of the storage device includes obtaining at least one metric, of the one or more metrics, for each memory portion of a plurality of memory portions of the storage device.

(B9) In some embodiments of the method of any of B1 to B8, the one or more metrics of the storage device include one or more status metrics corresponding to the storage device's ability to retain data.

(B10) In some embodiments of the method of any of B1 to B9, the one or more metrics of the storage device include one or more performance metrics corresponding to performance of the storage device.

(B11) In some embodiments of the method of any of B1 to B10, the one or more metrics of the storage device include one or more wear metrics corresponding to wear on the storage device.

(B12) In some embodiments of the method of any of B1 to B11, the one or more metrics of the storage device include one or more time metrics.

(B13) In some embodiments of the method of any of B1 to B12, the one or more metrics of the storage device include values of the one or more metrics from more than one time.

(B14) In some embodiments of the method of any of B1 to B13, the method further includes, after enabling the amelioration process, (1) re-evaluating the trigger condition in accordance with the one or more metrics of the storage device, and (2) in accordance with a determination that the trigger condition is no longer valid, aborting the amelioration process to reduce declared capacity of the non-volatile memory of the storage device.

(B15) In some embodiments of the method of any of B1 to B14, the amelioration process to reduce declared capacity of the non-volatile memory of the storage device includes a process to reduce utilization of the non-volatile memory of the storage device.

(B16) In some embodiments of the method of any of B1 to B15, the storage device comprises one or more flash memory devices.

(B17) In another aspect, a storage system includes (1) one or more storage devices (e.g., comprising one or more non-volatile storage devices, such as flash memory devices), (2) a host to which the one or more storage devices are operatively coupled, (3) one or more processors, and (4) controller memory storing one or more programs, which when executed by the one or more processors cause the host to perform or control performance of any of the methods B1 to B16 described herein.

(B19) In yet another aspect, any of the methods B1 to B16 described above are performed by a host system, coupled to one or more storage devices, the host system including means for performing any of the methods described herein.

(B21) In yet another aspect, some embodiments include a non-transitory computer readable storage medium, storing one or more programs configured for execution by one or more processors of a storage system, the one or more programs including instructions for performing any of the methods described herein.

(B22) In yet another aspect, a host system includes (1) an interface for operatively coupling to a storage system, (2) one or more processors, and (3) controller memory storing one or more programs, which when executed by the one or more processors cause the host system to perform or control performance of any of the methods B1 to B16 described herein.

In yet another aspect, some embodiments include a non-transitory computer readable storage medium, storing one or more programs configured for execution by one or more processors of a host system, the one or more programs including instructions for performing any of the methods described herein.

The various embodiments described herein include systems, methods and/or devices used to enable triggering a process to reduce declared capacity of a storage device in a multi-storage-device storage system. Some embodiments include systems, methods and/or devices to detect a trigger condition in accordance with one or more metrics of one or more storage devices of a plurality of storage devices of a storage system and enable an amelioration process associated with the detected trigger condition, the amelioration process to reduce declared capacity of non-volatile memory of the respective storage device.

(C1) More specifically, some embodiments include a method of managing a storage system. In some embodiments, the method includes: (1) obtaining, for each storage device of a plurality of storage devices of the storage system, one or more metrics of the storage device, the storage device including non-volatile memory, (2) detecting a trigger condition for reducing declared capacity of the non-volatile memory of a respective storage device of the plurality of storage devices of the storage system, the trigger condition detected in accordance with the one or more metrics of one or more storage devices of the plurality of storage devices, and (3) enabling an amelioration process associated with the detected trigger condition, the amelioration process to reduce declared capacity of the non-volatile memory of the respective storage device.

(C1-1) In some embodiments of the method of C1, the method further includes: (1) prior to detecting the trigger condition, detecting a first wear condition of the non-volatile memory of the respective storage device, wherein a total storage capacity of the non-volatile memory of the respective storage device includes declared capacity and over-provisioning, and (2) in response to detecting the first wear condition, performing a remedial action that reduces over-provisioning of the non-volatile memory of the respective storage device without reducing declared capacity of the non-volatile memory of the respective storage device.

(C1-2) In some embodiments of the method of C1-1, detecting the trigger condition includes detecting a second wear condition distinct from the first wear condition.

(C2) In some embodiments of the method of C1 or C1-1 or C1-2, enabling the amelioration process associated with the detected trigger condition includes notifying a host to which the respective storage device is operatively coupled of the trigger condition.

(C3) In some embodiments of the method of C1 or C1-1 or C1-2, enabling the amelioration process associated with the detected trigger condition includes: (1) receiving a query from a host to which the respective storage device is operatively coupled, and (2) in response to receiving the query, reporting the trigger condition.

(C4) In some embodiments of the method of C1 or C1-1 or C1-2, enabling the amelioration process associated with the detected trigger condition includes: (1) receiving a command from a host to which the respective storage device is operatively coupled, and (2) in response to receiving the command, sending a response to the command and a notification of the trigger condition.

(C5) In some embodiments of the method of C1 or C1-1 or C1-2, enabling the amelioration process associated with the detected trigger condition includes: (1) receiving a command from a host to which the respective storage device is operatively coupled, and (2) in response to receiving the command, sending a response to the command and a notification that prompts the host to obtain information with respect to the trigger condition.

(C6) In some embodiments of the method of any of C2 to C5, the host includes a client on behalf of which data is stored in the storage system.

(C7) In some embodiments of the method of any of C2 to C5, the host includes a storage system controller of the storage system.

(C8) In some embodiments of the method of any of C2 to C5, the host includes a cluster controller of the storage system.

(C9) In some embodiments of the method of any of C1 to C8, enabling the amelioration process associated with the detected trigger condition includes scheduling the amelioration process to be performed on the respective storage device.

(C10) In some embodiments of the method of any of C1 to C9, enabling the amelioration process associated with the detected trigger condition includes determining one or more parameters for the amelioration process.

(C11) In some embodiments of the method of C10, enabling the amelioration process associated with the detected trigger condition further includes reporting at least a subset of the one or more parameters for the amelioration process.

(C12) In some embodiments of the method of any of C1 to C11, obtaining one or more metrics of the respective storage device includes obtaining at least one metric, of the one or more metrics, for each memory portion of a plurality of memory portions of the respective storage device.

(C13) In some embodiments of the method of any of C1 to C12, the one or more metrics of the respective storage device include one or more status metrics corresponding to the respective storage device's ability to retain data.

(C14) In some embodiments of the method of any of C1 to C13, the one or more metrics of the respective storage device include one or more performance metrics corresponding to performance of the respective storage device.

(C15) In some embodiments of the method of any of C1 to C14, the one or more metrics of the respective storage device include one or more wear metrics corresponding to wear on the respective storage device.

(C16) In some embodiments of the method of any of C1 to C15, the one or more metrics of the respective storage device include one or more time metrics.

(C17) In some embodiments of the method of any of C1 to C16, the one or more metrics of the respective storage device include values of the one or more metrics from more than one time.

(C18) In some embodiments of the method of any of C1 to C17, the method further includes, after enabling the amelioration process: (1) re-evaluating the trigger condition in accordance with the one or more metrics of the respective storage device, and (2) in accordance with a determination that the trigger condition is no longer valid, aborting the amelioration process to reduce declared capacity of the non-volatile memory of the respective storage device.

(C19) In some embodiments of the method of any of C1 to C18, the obtaining, the enabling, or both the obtaining and the enabling are performed by one or more subsystems of the storage system distinct from the plurality of storage devices.

(C20) In some embodiments of the method of any of C1 to C19, the respective storage device comprises one or more flash memory devices.

(C21) In another aspect, a storage system includes (1) non-volatile memory, (2) one or more processors, and (3) controller memory storing one or more programs, which when executed by the one or more processors cause the storage system to perform or control performance of any of the methods C1 to C20 described herein.

(C23) In yet another aspect, any of the methods C1 to C20 described above are performed by a storage system including means for performing any of the methods described herein.

(C25) In yet another aspect, some embodiments include a non-transitory computer readable storage medium, storing one or more programs configured for execution by one or more processors of a storage system, the one or more programs including instructions for performing any of the methods described herein.

(C26) In yet another aspect, a storage system includes (1) a plurality of storage devices, (2) one or more subsystems having one or more processors, and (3) memory storing one or more programs, which when executed by the one or more processors cause the one or more subsystems to perform or control performance of any of the methods C1 to C20 described herein.

In yet another aspect, a host system includes (1) an interface for operatively coupling to a storage system, (2) one or more processors, and (3) controller memory storing one or more programs, which when executed by the one or more processors cause the host system to perform or control performance of any of the methods C1 to C20 described herein.

In yet another aspect, some embodiments include a non-transitory computer readable storage medium, storing one or more programs configured for execution by one or more processors of a host system, the one or more programs including instructions for performing any of the methods described herein.

The various embodiments described herein include systems, methods and/or devices used to enable notification of a trigger condition to reduce declared capacity of a storage device. Some embodiments include systems, methods and/or devices to notify a host to which a storage device is operatively coupled of a trigger condition for reducing declared capacity of non-volatile memory of the storage device.

(D1) More specifically, some embodiments include a method of managing a storage system. In some embodiments, the method includes, at a storage device of the storage system, the storage device including non-volatile memory: (1) detecting a trigger condition for reducing declared capacity of the non-volatile memory of the storage device, and (2) notifying a host to which the storage device is operatively coupled of the trigger condition for reducing declared capacity of the non-volatile memory of the storage device, the trigger condition for enabling performance of an amelioration process to reduce declared capacity of the non-volatile memory of the storage device. In some embodiments, the amelioration process is performed, at least in part, by an apparatus other than the storage device (e.g., performed at least in part by the host, or by a storage system controller or by a cluster controller of a data storage system that includes at least one storage device distinct from the storage device).

(D1-1) In some embodiments of the method of D1, the method further includes: (1) prior to detecting the trigger condition, detecting a first wear condition of the non-volatile memory of the storage device, wherein a total storage capacity of the non-volatile memory of the storage device includes declared capacity and over-provisioning, and (2) in response to detecting the first wear condition, performing a remedial action that reduces over-provisioning of the non-volatile memory of the storage device without reducing declared capacity of the non-volatile memory of the storage device.

(D1-2) In some embodiments of the method of D1-1, detecting the trigger condition includes detecting a second wear condition distinct from the first wear condition.

(D2) In some embodiments of the method of D1 or D1-1 or D1-2, the host includes a client on behalf of which data is stored in the storage system.

(D3) In some embodiments of the method of D1 or D1-1 or D1-2, the host includes a storage system controller of the storage system.

(D4) In some embodiments of the method of D1 or D1-1 or D1-2, the host includes a cluster controller of the storage system.

(D5) In some embodiments of the method of any of D1 to D4, notifying the host of the trigger condition for reducing declared capacity of the non-volatile memory of the storage device includes notifying the host with an unsolicited communication.

(D6) In some embodiments of the method of any of D1 to D4, notifying the host of the trigger condition for reducing declared capacity of the non-volatile memory of the storage device includes: (1) receiving a query from the host, and (2) in response to receiving the query, reporting the trigger condition.

(D7) In some embodiments of the method of any of D1 to D4, notifying the host of the trigger condition for reducing declared capacity of the non-volatile memory of the storage device includes: (1) receiving a command from the host, and (2) in response to receiving the command, sending a response to the command and a notification of the trigger condition.

(D8) In some embodiments of the method of any of D1 to D4, notifying the host of the trigger condition for reducing declared capacity of the non-volatile memory of the storage device includes: (1) receiving a command from the host, and (2) in response to receiving the command, sending a response to the command and a notification that prompts the host to obtain information with respect to the trigger condition.

(D9) In some embodiments of the method of any of D1 to D8, notifying the host of the trigger condition for reducing declared capacity of the non-volatile memory of the storage device further includes notifying the host that the storage device is in read-only mode.

(D10) In some embodiments of the method of any of D1 to D9, the trigger condition is detected by the storage device in accordance with one or more metrics of the storage device.

(D11) In some embodiments of the method of D10, the method further includes, after notifying the host of the trigger condition for reducing declared capacity of the non-volatile memory of the storage device: (1) re-evaluating the trigger condition in accordance with the one or more metrics of the storage device, and (2) in accordance with a determination that the trigger condition is no longer valid, notifying the host of an absence of the trigger condition for reducing declared capacity of the non-volatile memory of the storage device.

(D12) In some embodiments of the method of any of D1 to D11, the amelioration process to reduce declared capacity of the non-volatile memory of the storage device includes a process to reduce utilization of the non-volatile memory of the storage device.

(D13) In some embodiments of the method of any of D1 to D12, the storage device comprises one or more flash memory devices.

(D14) In another aspect, a storage device includes (1) non-volatile memory (e.g., comprising one or more non-volatile storage devices, such as flash memory devices), (2) one or more processors, and (3) controller memory (e.g., non-volatile memory or volatile memory in or coupled to the controller) storing one or more programs, which when executed by the one or more processors cause the storage device to perform or control performance of any of the methods D1 to D13 described herein.

(D16) In yet another aspect, any of the methods D1 to D13 described above are performed by a storage device including means for performing any of the methods described herein.

(D18) In yet another aspect, a storage system includes (1) a storage medium (e.g., comprising one or more non-volatile storage devices, such as flash memory devices), (2) one or more processors, and (3) memory (e.g., non-volatile memory or volatile memory in the storage system) storing one or more programs, which when executed by the one or more processors cause the storage system to perform or control performance of any of the methods D1 to D13 described herein.

(D19) In yet another aspect, some embodiments include a non-transitory computer readable storage medium, storing one or more programs configured for execution by one or more processors of a storage device, the one or more programs including instructions for performing any of the methods described herein.

The various embodiments described herein include systems, methods and/or devices used to enable notification of a trigger condition to reduce declared capacity of a storage device in a multi-storage-device storage system. Some embodiments include systems, methods and/or devices to notify a host to which a respective storage device of a plurality of storage devices of a storage system is operatively coupled of a trigger condition for reducing declared capacity of non-volatile memory of the respective storage device.

(E1) More specifically, some embodiments include a method of managing a storage system. In some embodiments, the method includes: (1) obtaining, for each storage device of a plurality of storage devices of the storage system, one or more metrics of the storage device, the storage device including non-volatile memory, (2) detecting a trigger condition for reducing declared capacity of the non-volatile memory of a respective storage device of the plurality of storage devices of the storage system, the trigger condition detected in accordance with the one or more metrics of two or more of the storage devices of the plurality of storage devices in the storage system, and (3) notifying a host to which the respective storage device is operatively coupled of the trigger condition for reducing declared capacity of the non-volatile memory of the respective storage device, the trigger condition for enabling performance of an amelioration process to reduce declared capacity of the non-volatile memory of the respective storage device. In some embodiments, or in some circumstances, the notification of the trigger condition causes performance of the amelioration process to be enabled.

(E1-1) In some embodiments of the method of E1, the method further includes: (1) prior to detecting the trigger condition, detecting a first wear condition of the non-volatile memory of the respective storage device, wherein a total storage capacity of the non-volatile memory of the respective storage device includes declared capacity and over-provisioning; and (2) in response to detecting the first wear condition, performing a remedial action that reduces over-provisioning of the non-volatile memory of the respective storage device without reducing declared capacity of the non-volatile memory of the respective storage device.

(E1-2) In some embodiments of the method of E1-1, detecting the trigger condition includes detecting a second wear condition distinct from the first wear condition.

(E2) In some embodiments of the method of E1 or E1-1 or E1-2, the host includes a client on behalf of which data is stored in the storage system.

(E3) In some embodiments of the method of E1 or E1-1 or E1-2, the host includes a storage system controller of the storage system.

(E4) In some embodiments of the method of E1 or E1-1 or E1-2, the host includes a cluster controller of the storage system.

(E5) In some embodiments of the method of any of E1 to E4, notifying the host of the trigger condition for reducing declared capacity of the non-volatile memory of the respective storage device includes notifying the host with an unsolicited communication.

(E6) In some embodiments of the method of any of E1 to E4, notifying the host of the trigger condition for reducing declared capacity of the non-volatile memory of the respective storage device includes: (1) receiving a query from the host, and (2) in response to receiving the query, reporting the trigger condition.

(E7) In some embodiments of the method of any of E1 to E4, notifying the host of the trigger condition for reducing declared capacity of the non-volatile memory of the respective storage device includes: (1) receiving a command from the host, and (2) in response to receiving the command, sending a response to the command and a notification of the trigger condition.

(E8) In some embodiments of the method of any of E1 to E4, notifying the host of the trigger condition for reducing declared capacity of the non-volatile memory of the respective storage device includes: (1) receiving a command from the host, and (2) in response to receiving the command, sending a response to the command and a notification that prompts the host to obtain information with respect to the trigger condition.

(E9) In some embodiments of the method of any of E1 to E4, notifying the host of the trigger condition for reducing declared capacity of the non-volatile memory of the respective storage device includes notifying the host that the respective storage device is in read-only mode.

(E10) In some embodiments of the method of any of E1 to E9, the method further includes, after notifying the host of the trigger condition for reducing declared capacity of the non-volatile memory of the respective storage device: (1) re-evaluating the trigger condition in accordance with the one or more metrics of the two or more storage devices of the plurality of storage devices in the storage system, and (2) in accordance with a determination that the trigger condition is no longer valid, notifying the host of an absence of the trigger condition for reducing declared capacity of the non-volatile memory of the respective storage device.

(E11) In some embodiments of the method of any of E1 to E10, the obtaining, the notifying, or both the obtaining and the notifying are performed by one or more subsystems of the storage system distinct from the plurality of storage devices.

(E12) In some embodiments of the method of any of E1 to E11, the amelioration process to reduce declared capacity of the non-volatile memory of the respective storage device includes a process to reduce utilization of the non-volatile memory of the respective storage device.

(E13) In some embodiments of the method of any of E1 to E12, the respective storage device comprises one or more flash memory devices.

(E14) In another aspect, a storage system includes (1) non-volatile memory (e.g., comprising one or more non-volatile storage devices, such as flash memory devices), (2) one or more processors, and (3) controller memory (e.g., non-volatile memory or volatile memory in or coupled to a controller of the storage system) storing one or more programs, which when executed by the one or more processors cause the storage system to perform or control performance of any of the methods E1 to E13 described herein.

(E16) In yet another aspect, any of the methods E1 to E13 described above are performed by a storage system including means for performing any of the methods described herein.

(E18) In yet another aspect, some embodiments include a non-transitory computer readable storage medium, storing one or more programs configured for execution by one or more processors of a storage system, the one or more programs including instructions for performing any of the methods described herein.

(E19) In yet another aspect, a storage system includes (1) a plurality of storage devices, (2) one or more subsystems having one or more processors, and (3) memory (e.g., non-volatile memory or volatile memory in the storage system) storing one or more programs, which when executed by the one or more processors cause the one or more subsystems to perform or control performance of any of the methods E1 to E13 described herein.

In yet another aspect, a host system includes (1) an interface for operatively coupling to a storage system, (2) one or more processors, and (3) controller memory storing one or more programs, which when executed by the one or more processors cause the host system to perform or control performance of any of the methods E1 to E13 described herein.

In yet another aspect, some embodiments include a non-transitory computer readable storage medium, storing one or more programs configured for execution by one or more processors of a host system, the one or more programs including instructions for performing any of the methods described herein.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure pertinent aspects of the embodiments described herein.

Data storage systems, including those described below, use a variety of techniques to avoid data loss caused by a variety of failure mechanisms, including storage media failure, communication failures, and failures at the system and subsystem level. A common feature of these mechanisms is the use of data redundancy to protect data, to compensate for actual and potential data errors (e.g., media errors, lost data, transmission errors, inaccessible data, etc.). One class of redundancy mechanisms is known as error correction codes (ECCs). Numerous types of error correction codes are well known (e.g., BCH, LDPC, Reed-Solomon, etc.), as are numerous schemes for storing them with or in conjunction with the data that is being protected. Another class of redundancy mechanisms is erasure codes (e.g., pyramid, fountain, partial MDS, locally repairable, simple regenerating, etc.)

Another type or level of redundancy mechanism is typically called RAID (redundant array of independent disks), even when the storage media are not "disks" in the traditional sense. There are multiple forms of RAID, or RAID schemes, providing different levels of data protection (e.g., RAID-1, RAID-5, RAID-6, RAID-10, etc.). Typically, in systems that use RAID, "stripes" of data stored in multiple distinct storage locations are treated as a set, and stored with sufficient redundant data that any data in a stripe that would have been lost, in a partial or complete failure of any one of the storage locations, is recovered using the other data in the stripe, possibly including the redundant data.

A third type of redundancy mechanism is replication of data to multiple storage locations, typically in distinct failure domains. Systems implementing this type of redundancy mechanism typically store three or more replicas of each data set or data item. Typically either each replica is in a distinct failure domain from the other replicas, or at least one replica is in a distinct failure domain from the other replicas.

The embodiments described below work in conjunction with the data redundancy mechanisms described above (used alone or in combination). Some of the data storage systems described below have an architecture or configuration designed to implement a particular redundancy mechanism. Furthermore, some of the embodiments described below may utilize more than one of the redundancy mechanisms described above, either alone or in combination. Furthermore, some of the embodiments are able to store data encoded with different redundancy mechanisms simultaneously. Furthermore, even within a single mechanism, the selection of parameters (i.e., codeword size relative to data size) may vary dynamically. Hence, altering the redundancy mechanism directly affects the amount of data stored and in turn the utilization.

FIG. 1A is a block diagram illustrating data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120, which includes a storage controller 124 and a storage medium 130, and is used in conjunction with or includes a computer system 110. In some embodiments, storage medium 130 is a single flash memory device while in other embodiments storage medium 130 includes a plurality of flash memory devices. In some embodiments, storage medium 130 is NAND-type flash memory or NOR-type flash memory. In some embodiments, storage medium 130 includes one or more three-dimensional (3D) memory devices, as further defined herein. Further, in some embodiments storage controller 124 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, data storage system 100 can contain one or more storage device 120s.

Computer system 110 is coupled to storage controller 124 through data connections 101. However, in some embodiments computer system 110 includes storage controller 124, or a portion of storage controller 124, as a component and/or a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch screen display, a mouse, a track-pad, a digital camera and/or any number of supplemental devices to add functionality. In some embodiments, computer system 110 does not have a display and other user interface components.

Storage medium 130 is coupled to storage controller 124 through connections 103. Connections 103 are sometimes called data connections, but typically convey commands in addition to data, and optionally convey metadata, error correction information and/or other information in addition to data values to be stored in storage medium 130 and data values read from storage medium 130. In some embodiments, however, storage controller 124 and storage medium 130 are included in the same device (i.e., an integral device) as components thereof. Furthermore, in some embodiments, storage controller 124 and storage medium 130 are embedded in a host device (e.g., computer system 110), such as a mobile device, tablet, other computer or computer controlled device, and the methods described herein are performed, at least in part, by the embedded memory controller. Storage medium 130 may include any number (i.e., one or more) of memory devices including, without limitation, non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop, and tablet computers. In some embodiments, storage medium 130 includes one or more three-dimensional (3D) memory devices, as further defined herein.

Storage medium 130 is divided into a number of addressable and individually selectable blocks, such as selectable portion 131. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

As noted above, while data storage densities of non-volatile semiconductor memory devices are generally increasing, a drawback of increasing storage density is that the stored data is more prone to being stored and/or read erroneously. In some embodiments, error control coding can be utilized to limit the number of uncorrectable errors that are introduced by electrical fluctuations, defects in the storage medium, operating conditions, device history, write-read circuitry, etc., or a combination of these and various other factors.

In some embodiments, storage controller 124 includes a management module 121-1, a host interface 129, a storage medium I/O interface 128, and additional module(s) 125. Storage controller 124 may include various additional features that have not been illustrated for the sake of brevity and so as not to obscure pertinent features of the example embodiments disclosed herein, and a different arrangement of features may be possible. Host interface 129 provides an interface to computer system 110 through data connections 101. Similarly, storage medium I/O 128 provides an interface to storage medium 130 though connections 103. In some embodiments, storage medium I/O 128 includes read and write circuitry, including circuitry capable of providing reading signals to storage medium 130 (e.g., reading threshold voltages for NAND-type flash memory).

In some embodiments, management module 121-1 includes one or more processing units (CPUs, also sometimes called processors) 122-1 configured to execute instructions in one or more programs (e.g., in management module 121-1). In some embodiments, the one or more CPUs 122-1 are shared by one or more components within, and in some cases, beyond the function of storage controller 124. Management module 121-1 is coupled to host interface 129, additional module(s) 125 and storage medium I/O 128 in order to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

Additional module(s) 125 are coupled to storage medium I/O 128, host interface 129, and management module 121-1. As an example, additional module(s) 125 may include an error control module to limit the number of uncorrectable errors inadvertently introduced into data during writes to memory or reads from memory. In some embodiments, additional module(s) 125 are executed in software by the one or more CPUs 122-1 of management module 121-1, and, in other embodiments, additional module(s) 125 are implemented in whole or in part using special purpose circuitry (e.g., to perform encoding and decoding functions). In some embodiments, additional module(s) 125 are implemented in whole or in part by software executed on computer system 110.

In some embodiments, an error control module, included in additional module(s) 125, includes an encoder and a decoder. In some embodiments, the encoder encodes data by applying an error control code to produce a codeword, which is subsequently stored in storage medium 130. When the encoded data (e.g., one or more codewords) is read from storage medium 130, the decoder applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

In some embodiments, during a write operation, host interface 129 receives data to be stored in storage medium 130 from computer system 110. The data received by host interface 129 is made available to an encoder (e.g., in additional module(s) 125), which encodes the data to produce one or more codewords. The one or more codewords are made available to storage medium I/O 128, which transfers the one or more codewords to storage medium 130 in a manner dependent on the type of storage medium being utilized.

In some embodiments, a read operation is initiated when computer system (host) 110 sends one or more host read commands (e.g., via data connections 101, or alternatively a separate control line or bus) to storage controller 124 requesting data from storage medium 130. Storage controller 124 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to a decoder (e.g., in additional module(s) 125). If the decoding is successful, the decoded data is provided to host interface 129, where the decoded data is made available to computer system 110. In some embodiments, if the decoding is not successful, storage controller 124 may resort to a number of remedial actions or provide an indication of an irresolvable error condition.

As explained above, a storage medium (e.g., storage medium 130) is divided into a number of addressable and individually selectable blocks and each block is optionally (but typically) further divided into a plurality of pages and/or word lines and/or sectors. While erasure of a storage medium is performed on a block basis, in many embodiments, reading and programming of the storage medium is performed on a smaller subunit of a block (e.g., on a page basis, word line basis, or sector basis). In some embodiments, the smaller subunit of a block consists of multiple memory cells (e.g., single-level cells or multi-level cells). In some embodiments, programming is performed on an entire page. In some embodiments, a multi-level cell (MLC) NAND flash typically has four possible states per cell, yielding two bits of information per cell. Further, in some embodiments, a MLC NAND has two page types: (1) a lower page (sometimes called fast page), and (2) an upper page (sometimes called slow page). In some embodiments, a triple-level cell (TLC) NAND flash has eight possible states per cell, yielding three bits of information per cell. Although the description herein uses TLC, MLC, and SLC as examples, those skilled in the art will appreciate that the embodiments described herein may be extended to memory cells that have more than eight possible states per cell, yielding more than three bits of information per cell.

The encoding format of the storage media (i.e., TLC, MLC, or SLC and/or a chose data redundancy mechanism) is a choice made when data is actually written to the storage media. Often in this specification there is described an event, condition, or process that is said to set the encoding format, alter the encoding format of the storage media, etc. It should be recognized that the actual process may involve multiple steps, e.g., erasure of the previous contents of the storage media followed by the data being written using the new encoding format and that these operations may be separated in time from the initiating event, condition or procedure.

As an example, if data is written to a storage medium in pages, but the storage medium is erased in blocks, pages in the storage medium may contain invalid (e.g., stale) data, but those pages cannot be overwritten until the whole block containing those pages is erased. In order to write to the pages with invalid data, the pages (if any) with valid data in that block are read and re-written to a new block and the old block is erased (or put on a queue for erasing). This process is called garbage collection. After garbage collection, the new block contains the pages with valid data and may have free pages that are available for new data to be written, and the old block can be erased so as to be available for new data to be written. Since flash memory can only be programmed and erased a limited number of times, the efficiency of the algorithm used to pick the next block(s) to re-write and erase has a significant impact on the lifetime and reliability of flash-based storage systems.

Figure 1B:
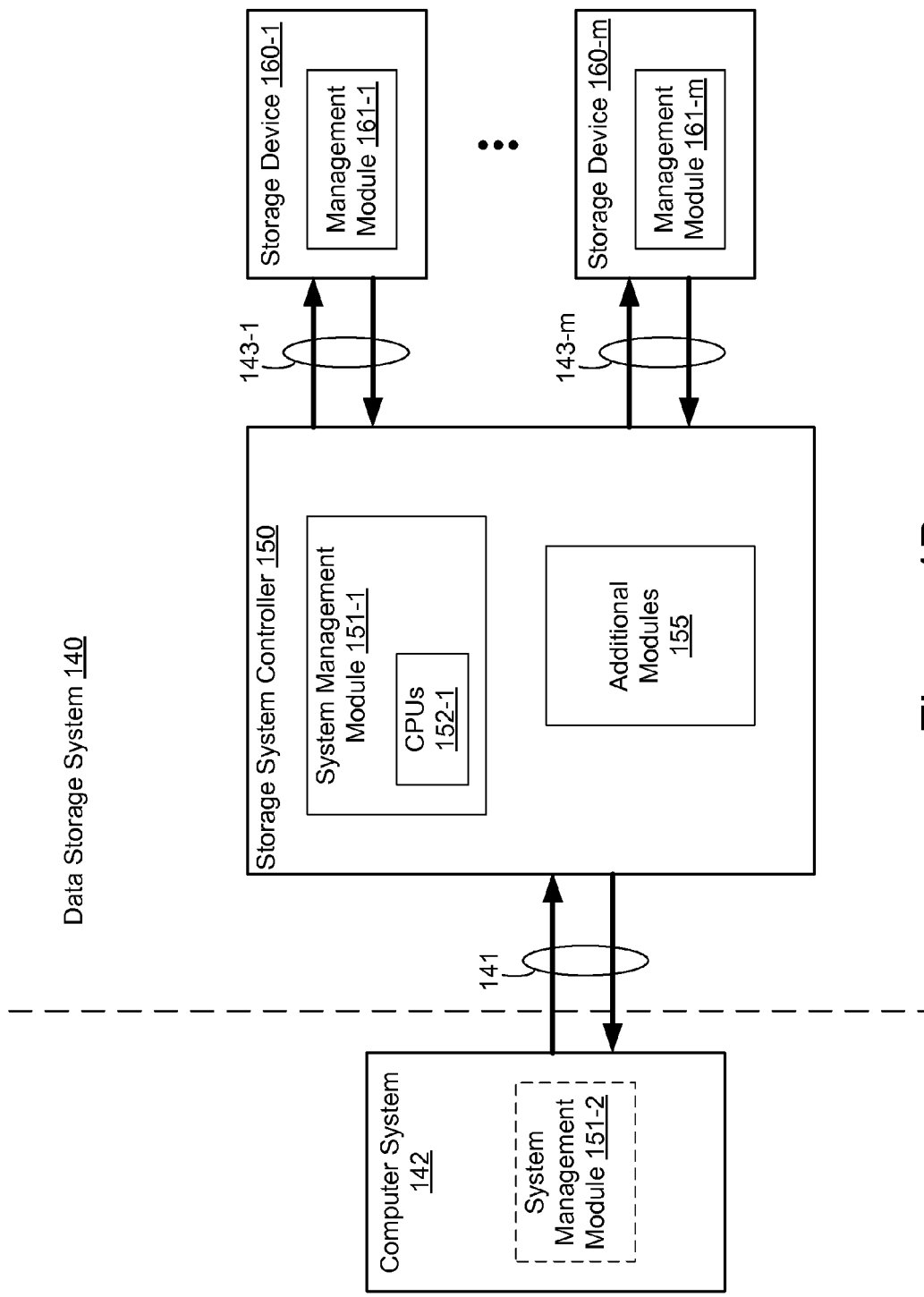
FIG. 1B is a block diagram illustrating an implementation of a data storage system, in accordance with some embodiments.

FIG. 1B is a block diagram illustrating data storage system 140, in accordance with some embodiments. While some example features are illustrated, various other features have not been illustrated for the sake of brevity and so as not to obscure pertinent aspects of the example embodiments disclosed herein. To that end, as a non-limiting example, data storage system 140 (sometimes called a scale-up storage system, a single node storage system, etc.) includes a plurality of storage devices 160 (e.g., storage devices 160-1 to 160-*m*) and a storage system controller 150, and is used in conjunction with a computer system 142. In some embodiments, storage devices 160 include management modules 161 (e.g., storage device 160-1 includes management module 161-1 and storage device 160-*m* includes management module 161-*m*). Some of the features described above with respect to storage device 120 (FIG. 1A) and management module 121-1 (FIG. 1A) are applicable to storage devices 160 and management modules 161, respectively, and for sake of brevity and simplicity, the details are not repeated here.

Computer system 142 is coupled to storage system controller 150 through connections 141. However, in some embodiments computer system 142 includes a part of or the entire storage system controller 150 as a component and/or a subsystem. For example, in some embodiments, some or all of the functionality of storage system controller 150 is implemented by software executed on computer system 142. Computer system 142 may be any suitable computer device, such as a computer, a laptop computer, a tablet device, a netbook, an internet kiosk, a personal digital assistant, a mobile phone, a smart phone, a gaming device, a computer server, or any other computing device. In some embodiments, computer system 142 is a server system, such as a server system in a data center. Computer system 142 is sometimes called a host, host system, client, or client system. In some embodiments, computer system 142 includes one or more processors, one or more types of memory, a display and/or other user interface components such as a keyboard, a touch screen display, a mouse, a track-pad, a digital camera and/or any number of supplemental devices to add functionality. In some embodiments, computer system 142 does not have a display and other user interface components.

In some embodiments, storage system controller 150 includes a system management module 151-1, and additional module(s) 155. Storage system controller 150 may include various additional features that have not been illustrated for the sake of brevity and so as not to obscure pertinent features of the example embodiments disclosed herein, and a different arrangement of features may be possible. For example, in some embodiments, storage system controller 150 additionally includes an interface for each of the storage devices 160 coupled to storage system controller 150. Storage devices 160 are coupled to storage system controller 150 through connections 143 (e.g., storage device 160-1 is coupled to storage system controller 150 through connections 143-1 and storage device 160-*m* is coupled to storage system controller 150 through connections 143-*m*). In some embodiments, connections 143-1 through 143-*m* are implemented as a communication media over which commands and data are communicated using a protocol such as SCSI, SATA, Infiniband, Ethernet, Token Ring, or the like.

In some embodiments, system management module 151-1 includes one or more processing units (CPUs, also sometimes called processors) 152-1 configured to execute instructions in one or more programs (e.g., in system management module 151-1). In some embodiments, the one or more CPUs 152-1 are shared by one or more components within, and in some cases, beyond the function of storage system controller 150. System management module 151-1 is coupled to additional module(s) 155 in order to coordinate the operation of these components. In some embodiments, one or more modules of system management module 151-1 are implemented in system management module 151-2 of computer system 142 (sometimes called a host, host system, client, or client system). In some embodiments, one or more processors (sometimes called CPUs or processing units) of computer system 142 (not shown) are configured to execute instructions in one or more programs (e.g., in system management module 151-2). System management module 151-2 is coupled to storage system controller 150 in order to manage the operation of storage system controller 150.

Additional module(s) 155 are coupled to system management module 151-1. In some embodiments, additional module(s) 155 are executed in software by the one or more CPUs 152-1 of system management module 151-1, and, in other embodiments, additional module(s) 155 are implemented in whole or in part using special purpose circuitry. In some embodiments, additional module(s) 155 are implemented in whole or in part by software executed on computer system 142.

During a write operation, storage system controller 150 receives data to be stored in storage devices 160 from computer system 142 (sometimes called a host, host system, client, or client system). In some embodiments, storage system controller 150 maps a virtual logical address from computer system 142 to an address, which determines or identifies the one or more of storage devices 160 to which to write the data.

A read operation is initiated when computer system 142 sends one or more host read commands to storage system controller 150 requesting data from storage devices 160. In some embodiments, storage system controller 150 maps a virtual logical address from computer system 142 to an address, which determines or identifies the one or more of storage devices 160 from which to read the requested data.

Figure 1C:
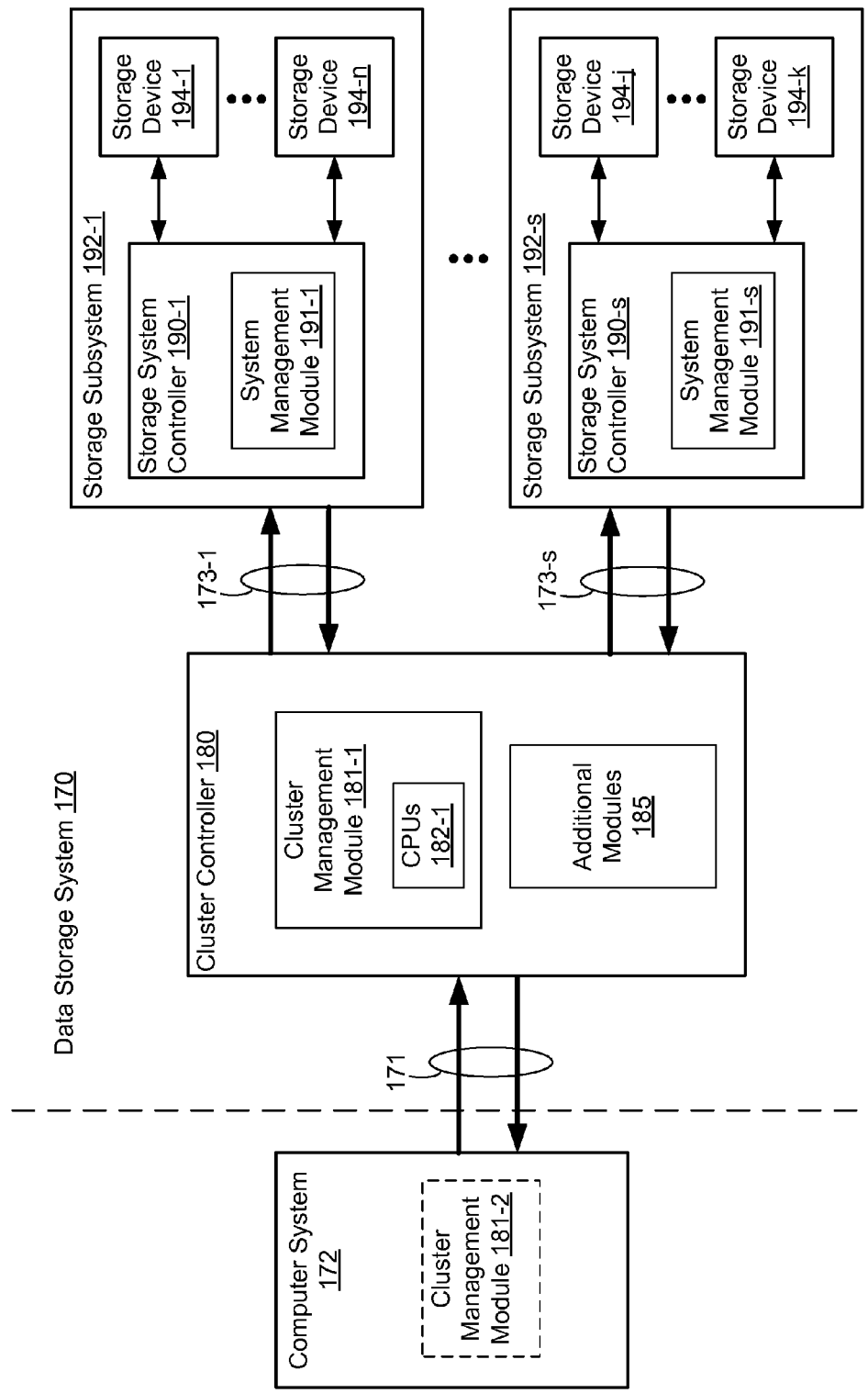
FIG. 1C is a block diagram illustrating an implementation of a data storage system, in accordance with some embodiments.

FIG. 1C is a block diagram illustrating an implementation of data storage system 170, in accordance with some embodiments. While some example features are illustrated, various other features have not been illustrated for the sake of brevity and so as not to obscure pertinent aspects of the example embodiments disclosed herein. To that end, as a non-limiting example, data storage system 170 (sometimes called a scale-out storage system, a multiple node storage system or a storage cluster system) includes a plurality of storage subsystems 192 (e.g., storage subsystems 192-1 to 192-s) and a cluster controller 180, and is used in conjunction with a computer system 172. In some embodiments, storage subsystems 192 include storage system controllers 190 and storage devices 194 (e.g., storage subsystem 192-1 includes storage system controller 190-1 and storage devices 194-1 through 194-n). Some of the features described above with respect to data storage system 140 (FIG. 1B) are applicable to storage subsystems 192, and for sake of brevity, the details are not repeated here. In some embodiments there may be a plurality of cluster controllers 180 that may communicate with each other to coordinate their activities.

Computer system 172 is coupled to cluster controller 180 through connections 171. However, in some embodiments computer system 172 includes cluster controller 180 as a component and/or a subsystem. For example, in some embodiments, some or all of the functionality of cluster controller 180 is implemented by software executed on computer system 172. Computer system 172 may be any suitable computer device, such as a computer, a laptop computer, a tablet device, a netbook, an internet kiosk, a personal digital assistant, a mobile phone, a smart phone, a gaming device, a computer server, or any other computing device. In some embodiments, computer system 172 is a server system, such as a server system in a data center. Computer system 172 is sometimes called a host, host system, client, or client system. In some embodiments, computer system 172 includes one or more processors, one or more types of memory, a display and/or other user interface components such as a keyboard, a touch screen display, a mouse, a track-pad, a digital camera and/or any number of supplemental devices to add functionality. In some embodiments, computer system 172 does not have a display and other user interface components.

In some embodiments, cluster controller 180 includes a cluster management module 181-1, and additional module(s) 185. Cluster controller 180 may include various additional features that have not been illustrated for the sake of brevity and so as not to obscure pertinent features of the example embodiments disclosed herein, and a different arrangement of features may be possible. For example, in some embodiments, cluster controller 180 additionally includes an interface for each of the storage subsystems 192 coupled to cluster controller 180. Storage subsystems 192 are coupled to cluster controller 180 through connections 173 (e.g., storage subsystem 192-1 is coupled to cluster controller 180 through connections 173-1 and storage subsystem 192-s is coupled to cluster controller 180 through connections 173-s). In some embodiments, connections 173 may be implemented as a shared communication network, e.g., Token Ring, Ethernet, Infiniband, etc.

In some embodiments, cluster management module 181-1 includes one or more processing units (CPUs, also sometimes called processors) 182-1 configured to execute instructions in one or more programs (e.g., in cluster management module 181-1). In some embodiments, the one or more CPUs 182-1 are shared by one or more components within, and in some cases, beyond the function of cluster controller 180. Cluster management module 181-1 is coupled to additional module(s) 185 in order to coordinate the operation of these components. In some embodiments, one or more modules of cluster management module 181-1 are implemented in cluster management module 181-2 of computer system 172 (sometimes called a host, host system, client, or client system). In some embodiments, one or more processors (sometimes called CPUs or processing units) of computer system 172 (not shown) are configured to execute instructions in one or more programs (e.g., in cluster management module 181-2). Cluster management module 181-2 is coupled to cluster controller 180 in order to manage the operation of cluster controller 180.

Additional module(s) 185 are coupled to cluster management module 181-1. In some embodiments, additional module(s) 185 are executed in software by the one or more CPUs 182-1 of cluster management module 181-1, and, in other embodiments, additional module(s) 185 are implemented in whole or in part using special purpose circuitry. In some embodiments, additional module(s) 185 are implemented in whole or in part by software executed on computer system 172.

In some embodiments, during a write operation, cluster controller 180 receives data to be stored in storage subsystems 192 from computer system 172 (sometimes called a host, host system, client, or client system). In some embodiments, cluster controller 180 maps a virtual logical address from computer system 172 to an address format understandable by storage subsystems 192 and to identify a storage subsystem of storage subsystems 192 to which to write the data. In some embodiments, cluster controller 180 may convert the data to be stored into a plurality of sets of data, each set of data is stored on one storage subsystem of storage subsystems 192. In one embodiment, the conversion process may be as simple as a partitioning of the data to be stored.

In another embodiment, the conversion process may redundantly encode the data to be stored so as to provide enhanced data integrity and access in the face of failures of one or more storage subsystems of storage subsystems 192 or communication thereto.

In some embodiments, a read operation is initiated when computer system 172 sends one or more host read commands to cluster controller 180 requesting data from storage subsystems 192. In some embodiments, cluster controller 180 maps a virtual logical address from computer system 172 to an address format understandable by storage subsystems 192, to determine or identify the storage subsystem of storage subsystems 192 from which to read the requested data. In some embodiments, more than one storage subsystem of storage subsystems 192 may have data read in order to satisfy the read operation, e.g. for data reconstruction.

As used herein, the term "host" or "host system" may be construed to mean (1) a computer system (e.g., computer system 110, FIG. 1A, computer system 142, FIG. 1B, or computer system 172, FIG. 1C) on behalf of which data is stored in a storage system (e.g., data storage system 100, FIG. 1A, data storage system 140, FIG. 1B, or data storage system 170, FIG. 1C), (2) a storage system controller (e.g., storage system controller 150, FIG. 1B) of a storage system (e.g., data storage system 140, FIG. 1B), (3) a cluster controller (e.g., cluster controller 180, FIG. 1C) of a storage system (e.g., data storage system 170, FIG. 1C), and/or (4) any computing entity (e.g., a computer, a process running on a computer, a mobile phone, an internet kiosk, a tablet computer, a laptop computer, a desktop computer, a server computer, etc.) that is operatively coupled either directly or indirectly to a storage system, depending on the context. For example, in some circumstances, with respect to data storage system 140 (FIG. 1B), the term "host" may refer to computer system 142 or storage system controller 150, depending on the context. As another example, in some circumstances, with respect to data storage system 170 (FIG. 1C), the term "host" may refer to computer system 172 or cluster controller 180, depending on the context. Further, in some contexts, the host is or includes a client or client system, on behalf of which data is stored in a storage system.

Figures 1, 2A:
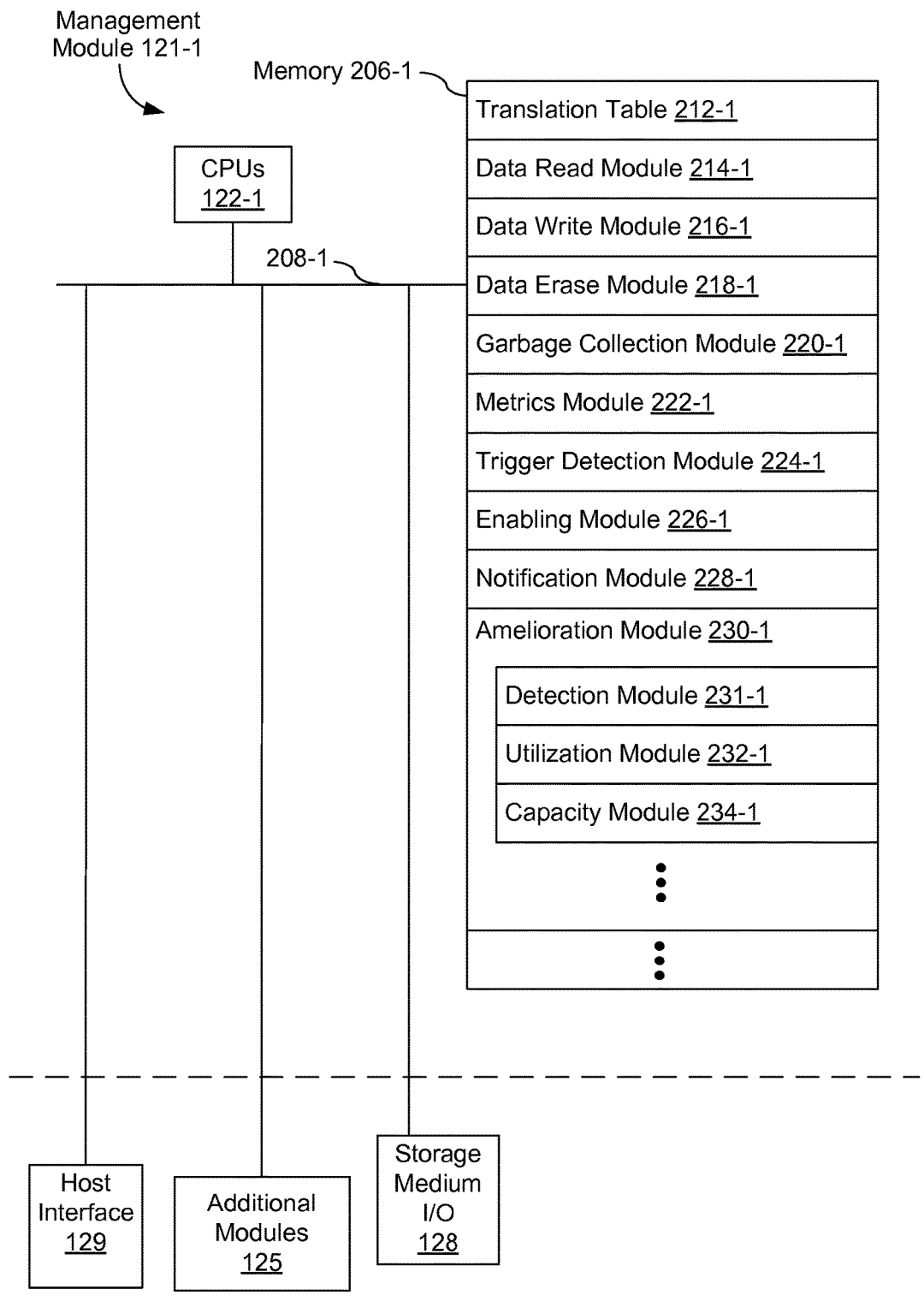
FIG. 2A-1 is a block diagram illustrating an implementation of a management module, in accordance with some embodiments.
Figure 4:
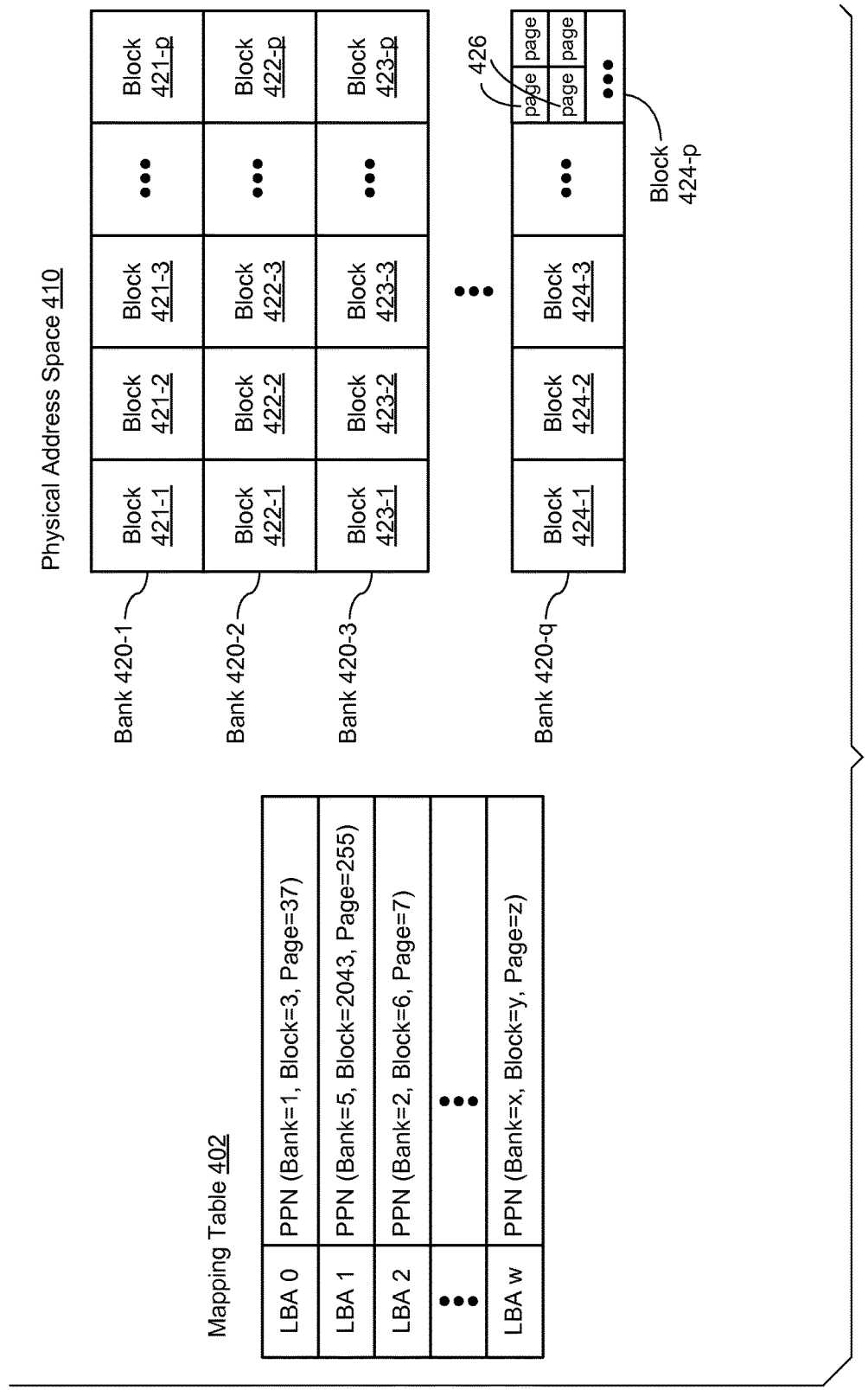
FIG. 4 is a block diagram of a mapping table and physical address space, in accordance with some embodiments.

FIG. 2A-1 is a block diagram illustrating a management module 121-1, in accordance with some embodiments, as shown in FIG. 1A. Management module 121-1 typically includes one or more processing units (sometimes called CPUs or processors) 122-1 for executing modules, programs and/or instructions stored in memory 206-1 and thereby performing processing operations, memory 206-1 (sometimes called controller memory), and one or more communication buses 208-1 for interconnecting these components. The one or more communication buses 208-1 optionally include circuitry (sometimes called a chipset) that interconnects and controls communications between system components. Management module 121-1 is coupled to host interface 129, additional module(s) 125, and storage medium I/O 128 by the one or more communication buses 208-1. Memory 206-1 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206-1 optionally includes one or more storage devices remotely located from the CPU(s) 122-1. Memory 206-1, or alternatively the non-volatile memory device(s) within memory 206-1, comprises a non-transitory computer readable storage medium. In some embodiments, memory 206-1, or the non-transitory computer readable storage medium of memory 206-1 stores the following programs, modules, and data structures, or a subset or superset thereof:

- translation table 212-1 that is used for mapping logical addresses to physical addresses (e.g., in some embodiments, translation table 212-1 includes mapping table 402, FIG. 4);
- data read module 214-1 that is used for reading data from one or more codewords, pages or blocks in a storage medium (e.g., storage medium 130, FIG. 1A);
- data write module 216-1 that is used for writing data to one or more codewords, pages or blocks in a storage medium (e.g., storage medium 130, FIG. 1A);
- data erase module 218-1 that is used for erasing data from one or more blocks in a storage medium (e.g., storage medium 130, FIG. 1A);
- garbage collection module 220-1 that is used for garbage collection for one or more blocks in a storage medium (e.g., storage medium 130, FIG. 1A);
- metrics module 222-1 that is used for generating and/or obtaining one or more metrics of a storage device (e.g., storage device 120, FIG. 1A);
- trigger detection module 224-1 that is used for detecting a trigger condition (e.g., in accordance with one or more metrics of a storage device);
- enabling module 226-1 that is used for enabling an amelioration process associated with a trigger condition (e.g., detected by trigger detection module 224-1);
- notification module 228-1 that is used for notifying a host to which a storage device is operatively coupled of a trigger condition (e.g., detected by trigger detection module 224-1) and/or of an absence of the trigger condition;
- amelioration module 230-1 that is used for performing an amelioration process to reduce declared capacity of non-volatile memory of a storage device (e.g., storage device 120, FIG. 1A), optionally including:
  - detection module 231-1 that is used for detecting an amelioration trigger for reducing declared capacity of the non-volatile memory of the storage device;
  - utilization module 232-1 that is used for reducing utilization of the non-volatile memory of the storage device; and
  - capacity module 234-1 that is used for reducing declared capacity of the non-volatile memory of the storage device.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206-1 may store a subset of the modules and data structures identified above. Furthermore, memory 206-1 may store additional modules and data structures not described above. In some embodiments, the programs, modules, and data structures stored in memory 206-1, or the non-transitory computer readable storage medium of memory 206-1, provide instructions for implementing some of the methods described below. In some embodiments, some or all of these modules may be implemented with specialized hardware circuits that subsume part or all of the module functionality.

Although FIG. 2A-1 shows management module 121-1 in accordance with some embodiments, FIG. 2A-1 is intended more as a functional description of the various features which may be present in management module 121-1 than as a structural schematic of the embodiments described herein. In practice, and as recognized by those of ordinary skill in the art, the programs, modules, and data structures shown separately could be combined and some programs, modules, and data structures could be separated.

Figures 2, 2A:
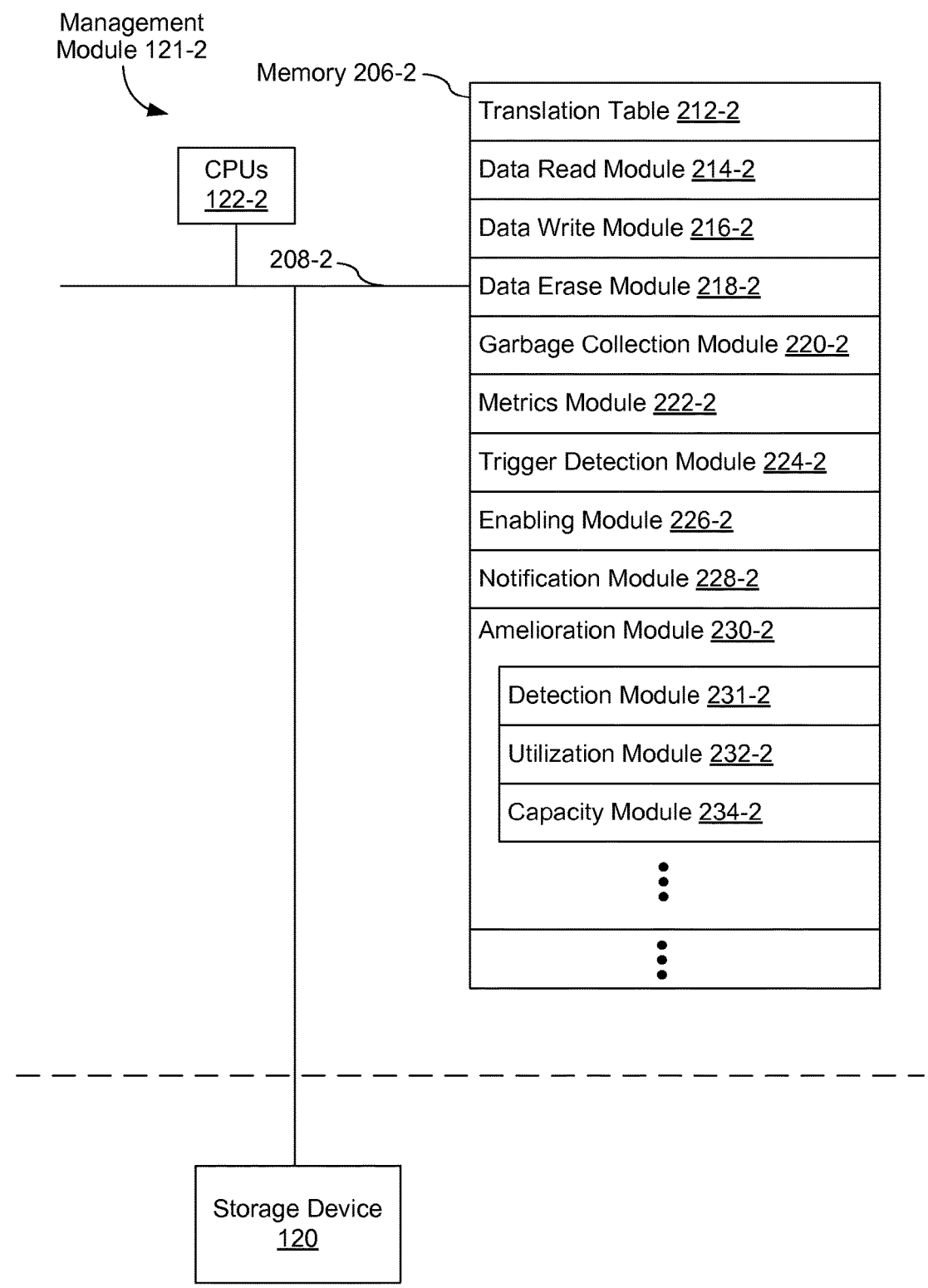

FIG. 2A-2 is a block diagram illustrating a management module 121-2 of computer system 110 (FIG. 1A), in accordance with some embodiments. Management module 121-2 typically includes one or more processing units (sometimes called CPUs or processors) 122-2 for executing modules, programs and/or instructions stored in memory 206-2 and thereby performing processing operations, memory 206-2, and one or more communication buses 208-2 for interconnecting these components. The one or more communication buses 208-2 optionally include circuitry (sometimes called a chipset) that interconnects and controls communications between system components. Management module 121-2 is coupled to storage device 120 by the one or more communication buses 208-2. Memory 206-2 (sometimes called host memory) includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206-2 optionally includes one or more storage devices remotely located from the CPU(s) 122-2. Memory 206-2, or alternatively the non-volatile memory device(s) within memory 206-2, comprises a non-transitory computer readable storage medium. In some embodiments, memory 206-2, or the non-transitory computer readable storage medium of memory 206-2 stores the following programs, modules, and data structures, or a subset or superset thereof:

- translation table 212-2 that is used for mapping logical addresses to physical addresses (e.g., in some embodiments, translation table 212-2 includes mapping table 402, FIG. 4);
- data read module 214-2 that is used for reading data from one or more codewords, pages or blocks in a storage medium (e.g., storage medium 130, FIG. 1A);
- data write module 216-2 that is used for writing data to one or more codewords, pages or blocks in a storage medium (e.g., storage medium 130, FIG. 1A);
- data erase module 218-2 that is used for erasing data from one or more blocks in a storage medium (e.g., storage medium 130, FIG. 1A);
- garbage collection module 220-2 that is used for garbage collection for one or more blocks in a storage medium (e.g., storage medium 130, FIG. 1A);
- metrics module 222-2 that is used for generating and/or obtaining one or more metrics of a storage device (e.g., storage device 120, FIG. 1A);
- trigger detection module 224-2 that is used for detecting a trigger condition (e.g., in accordance with one or more metrics of a storage device);
- enabling module 226-2 that is used for enabling an amelioration process associated with a trigger condition (e.g., detected by trigger detection module 224-2);
- notification module 228-2 that is used for notifying an application, module or process, of the host (i.e., computer system 110, FIG. 1A), of a trigger condition (e.g., detected by trigger detection module 224-2) and/or of an absence of the trigger condition;
- amelioration module 230-2 that is used for performing an amelioration process to reduce declared capacity of non-volatile memory of a storage device (e.g., storage device 120, FIG. 1A), optionally including:
  - detection module 231-2 that is used for detecting an amelioration trigger for reducing declared capacity of the non-volatile memory of the storage device;
  - utilization module 232-2 that is used for reducing utilization of the non-volatile memory of the storage device; and
  - capacity module 234-2 that is used for reducing declared capacity of the non-volatile memory of the storage device.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206-2 may store a subset of the modules and data structures identified above. Furthermore, memory 206-2 may store additional modules and data structures not described above. In some embodiments, the programs, modules, and data structures stored in memory 206-2, or the non-transitory computer readable storage medium of memory 206-2, provide instructions for implementing some of the methods described below. In some embodiments, some or all of these modules may be implemented with specialized hardware circuits that subsume part or all of the module functionality.

Although FIG. 2A-2 shows management module 121-2 in accordance with some embodiments, FIG. 2A-2 is intended more as a functional description of the various features which may be present in management module 121-2 than as a structural schematic of the embodiments described herein. In practice, and as recognized by those of ordinary skill in the art, the programs, modules, and data structures shown separately could be combined and some programs, modules, and data structures could be separated.

Figures 1, 2B:
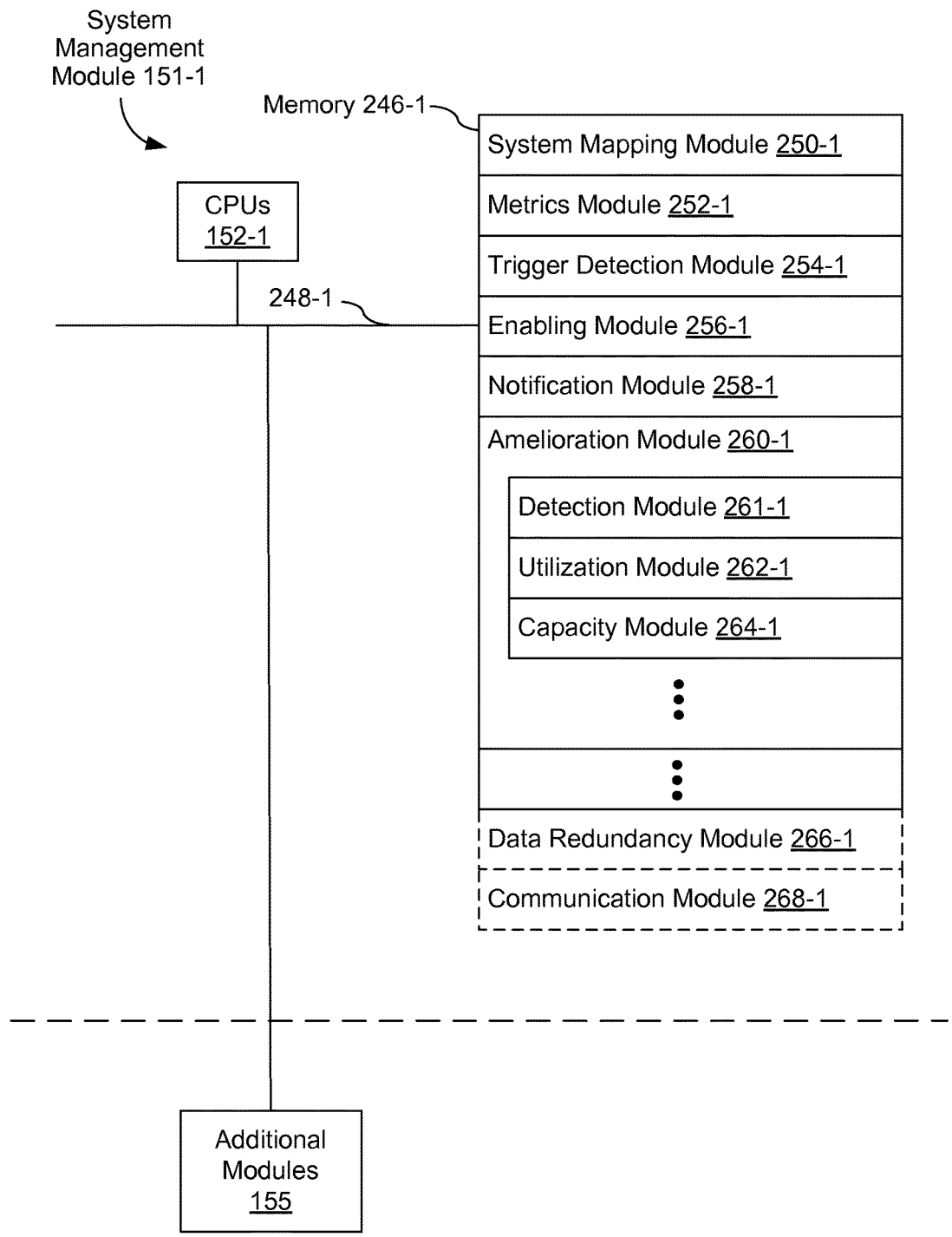
Figures 2, 2B:
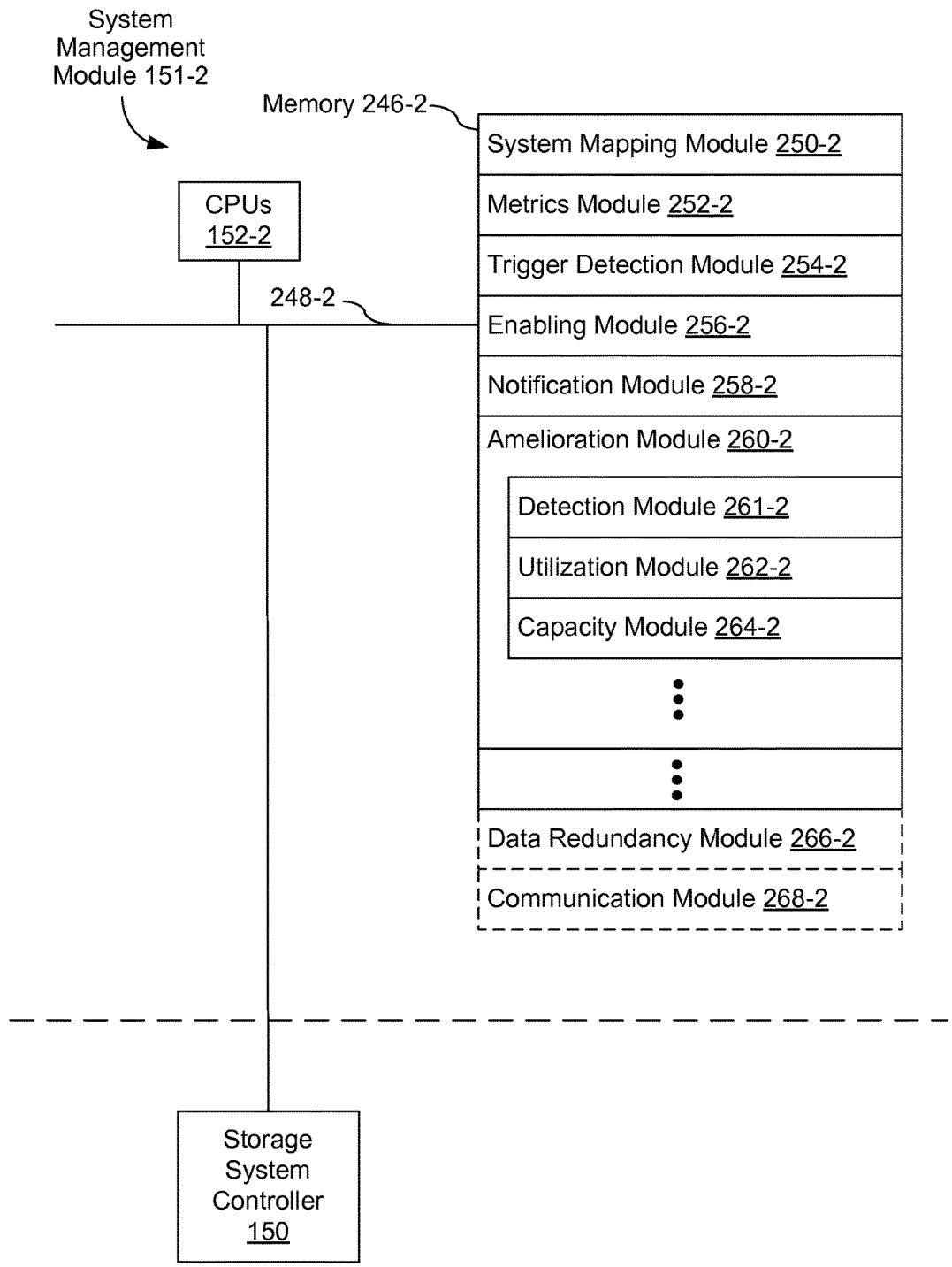

FIG. 2B-1 is a block diagram illustrating a system management module 151-1, in accordance with some embodiments, e.g., embodiments in which the system management module is in a storage system controller, as shown in FIG. 1B. System management module 151-1 typically includes one or more processing units (sometimes called CPUs or processors) 152-1 for executing modules, programs and/or instructions stored in memory 246-1 and thereby performing processing operations, memory 246-1 (sometimes called storage system controller memory or controller memory), and one or more communication buses 248-1 for interconnecting these components. The one or more communication buses 248-1 optionally include circuitry (sometimes called a chipset) that interconnects and controls communications between system components. System management module 151-1 is coupled to additional module(s) 155 by the one or more communication buses 248-1. Memory 246-1 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 246-1 optionally includes one or more storage devices remotely located from the CPU(s) 152-1. Memory 246-1, or alternatively the non-volatile memory device(s) within memory 246-1, comprises a non-transitory computer readable storage medium. In some embodiments, memory 246-1, or the non-transitory computer readable storage medium of memory 246-1 stores the following programs, modules, and data structures, or a subset or superset thereof:

system mapping module 250-1 that is used for mapping virtual logical addresses (e.g., used by computer system 142, FIG. 1B) to intermediate addresses (e.g., which are mapped by storage devices 160 to physical addresses, FIG. 1B);

metrics module 252-1 that is used for generating and/or obtaining one or more metrics of a storage device (e.g., any of storage devices 160-1 to **160-*m***, FIG. 1B);

trigger detection module 254-1 that is used for detecting a trigger condition (e.g., in accordance with one or more metrics of a storage device);

enabling module 256-1 that is used for enabling an amelioration process associated with a trigger condition (e.g., detected by trigger detection module 254-1);

notification module 258-1 that is used for notifying a host to which a storage device is operatively coupled of a trigger condition (e.g., detected by trigger detection module 254-1) and/or of an absence of the trigger condition;

amelioration module 260-1 that is used for performing an amelioration process to reduce declared capacity of non-volatile memory of a storage device (e.g., storage device 160, FIG. 1B), optionally including:

detection module 261-1 that is used for detecting an amelioration trigger for reducing declared capacity of the non-volatile memory of the storage device;

utilization module 262-1 that is used for reducing utilization of the non-volatile memory of the storage device; and capacity module 264-1 that is used for reducing declared capacity of the non-volatile memory of the storage device; and optionally, data redundancy module 266-1 that is used for redundantly encoding data (e.g., to implement a particular RAID (redundant array of independent disks) level); and optionally, communication module 268-1 that is used for facilitating communications with other devices, for example via a storage area network (SAN).

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 246-1 may store a subset of the modules and data structures identified above. Furthermore, memory 246-1 may store additional modules and data structures not described above. In some embodiments, the programs, modules, and data structures stored in memory 246-1, or the non-transitory computer readable storage medium of memory 246-1, provide instructions for implementing some of the methods described below. In some embodiments, some or all of these modules may be implemented with specialized hardware circuits that subsume part or all of the module functionality.

Although FIG. 2B-1 shows system management module 151-1 in accordance with some embodiments, FIG. 2B-1 is intended more as a functional description of the various features which may be present in system management module 151-1 than as a structural schematic of the embodiments described herein. In practice, and as recognized by those of ordinary skill in the art, the programs, modules, and data structures shown separately could be combined and some programs, modules, and data structures could be separated.

FIG. 2B-2 is a block diagram illustrating a system management module 151-2, in accordance with some embodiments, e.g., embodiments in which the system management module is located in the host, as shown in FIG. 1B; in some such embodiments the storage system is called a host-managed storage system. System management module 151-2 typically includes one or more processing units (sometimes called CPUs or processors) 152-2 for executing modules, programs and/or instructions stored in memory 246-2 and thereby performing processing operations, memory 246-2 (sometimes called host memory), and one or more communication buses 248-2 for interconnecting these components. The one or more communication buses 248-2 optionally include circuitry (sometimes called a chipset) that interconnects and controls communications between system components. System management module 151-2 is coupled to storage system controller 150 by the one or more communication buses 248-2. Memory 246-2 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 246-2 optionally includes one or more storage devices remotely located from the CPU(s) 152-2. Memory 246-2, or alternatively the non-volatile memory device(s) within memory 246-2, comprises a non-transitory computer readable storage medium. In some embodiments, memory 246-2, or the non-transitory computer readable storage medium of memory 246-2 stores the following programs, modules, and data structures, or a subset or superset thereof:

system mapping module 250-2 that is used for mapping virtual logical addresses (e.g., used by computer system 142, FIG. 1B) to intermediate addresses (e.g., which are mapped by storage devices 160 to physical addresses, FIG. 1B);

metrics module 252-2 that is used for generating and/or obtaining one or more metrics of a storage device (e.g., any of storage devices 160-1 to **160-*m***, FIG. 1B);

trigger detection module 254-2 that is used for detecting a trigger condition (e.g., in accordance with one or more metrics of a storage device);

enabling module 256-2 that is used for enabling an amelioration process associated with a trigger condition (e.g., detected by trigger detection module 254-2);

notification module 258-2 that is used for notifying a host to which a storage device is operatively coupled of a trigger condition (e.g., detected by trigger detection module 254-2) and/or of an absence of the trigger condition;

amelioration module 260-2 that is used for performing an amelioration process to reduce declared capacity of non-volatile memory of a storage device (e.g., storage device 160, FIG. 1B), optionally including:

detection module 261-2 that is used for detecting an amelioration trigger for reducing declared capacity of the non-volatile memory of the storage device;

utilization module 262-2 that is used for reducing utilization of the non-volatile memory of the storage device; and capacity module 264-2 that is used for reducing declared capacity of the non-volatile memory of the storage device;

optionally, data redundancy module 266-2 that is used for redundantly encoding data (e.g., to implement a particular RAID (redundant array of independent disks) level); and optionally, communication module 268-2 that is used for facilitating communications with other devices, for example, via a storage area network (SAN).

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 246-2 may store a subset of the modules and data structures identified above. Furthermore, memory 246-2 may store additional modules and data structures not described above. In some embodiments, the programs, modules, and data structures stored in memory 246-2, or the non-transitory computer readable storage medium of memory 246-2, provide instructions for implementing some of the methods described below. In some embodiments, some or all of these modules may be implemented with specialized hardware circuits that subsume part or all of the module functionality.

Although FIG. 2B-2 shows system management module 151-2 in accordance with some embodiments, FIG. 2B-2 is intended more as a functional description of the various features which may be present in system management module 151-2 than as a structural schematic of the embodiments described herein. In practice, and as recognized by those of ordinary skill in the art, the programs, modules, and data structures shown separately could be combined and some programs, modules, and data structures could be separated.

Figures 1, 2C:
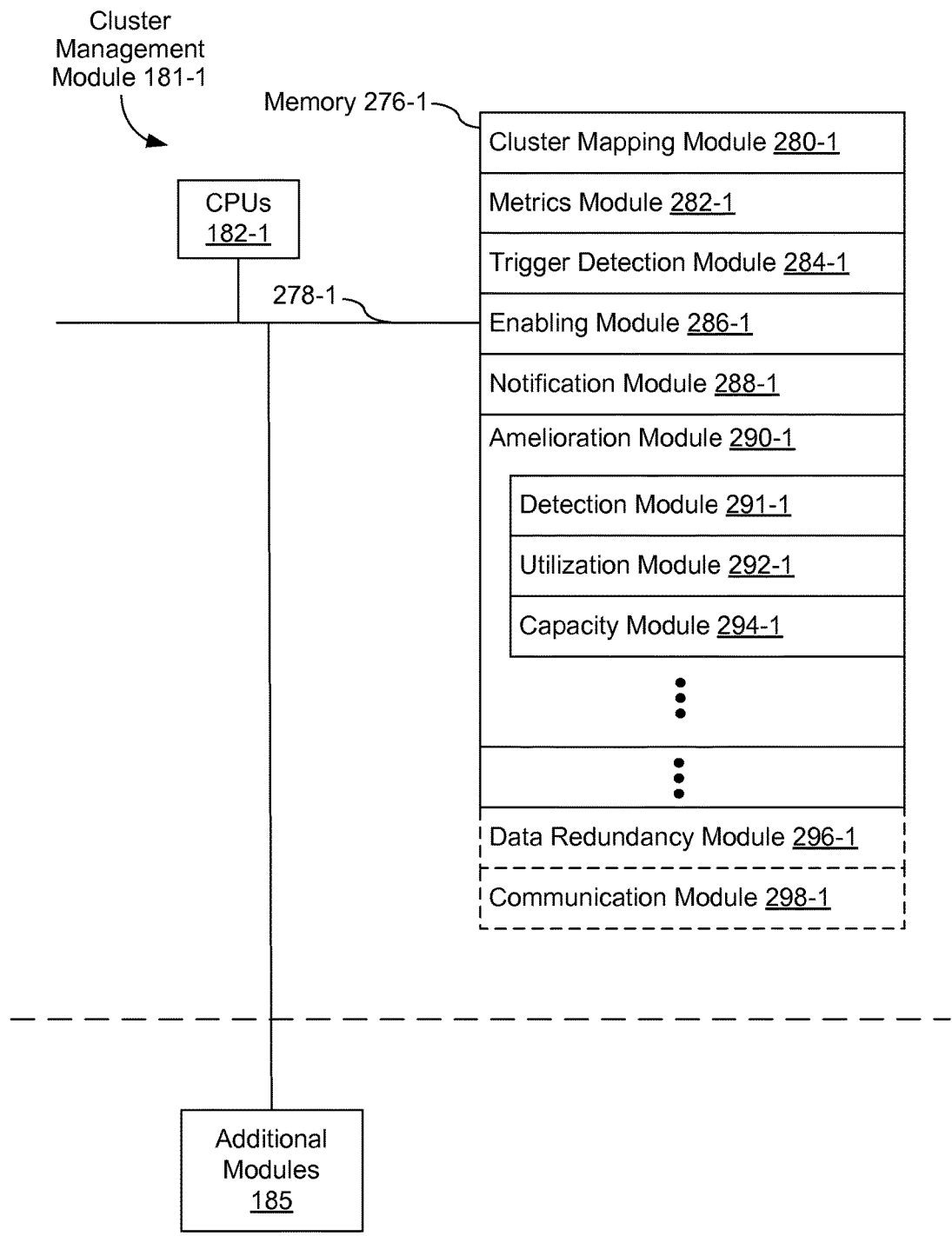
Figures 2, 2C:
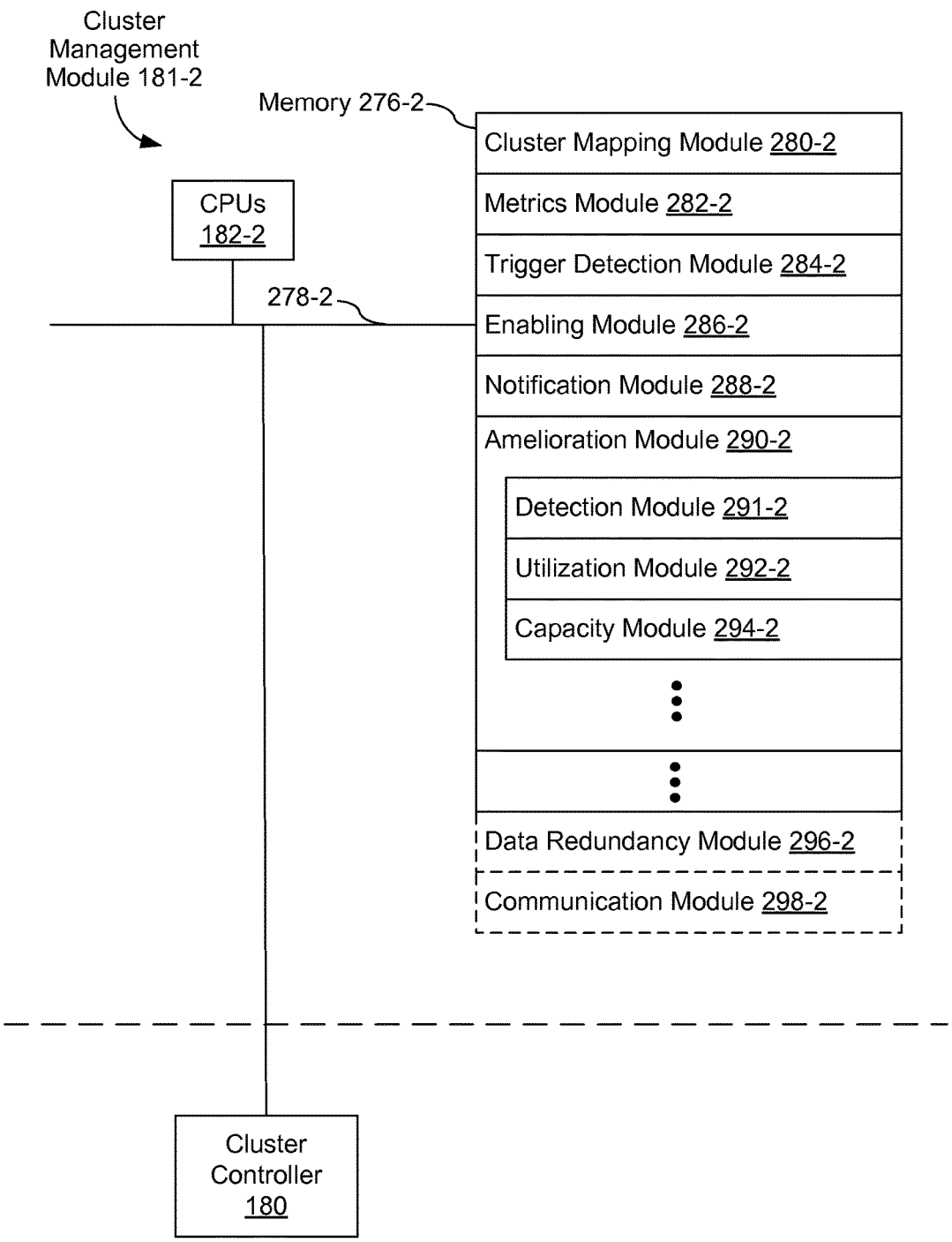

FIG. 2C-1 is a block diagram illustrating a cluster management module 181-1, in accordance with some embodiments, as shown in FIG. 1C. Cluster management module 181-1 typically includes one or more processing units (sometimes called CPUs or processors) 182-1 for executing modules, programs and/or instructions stored in memory 276-1 and thereby performing processing operations, memory 276-1, and one or more communication buses 278-1 for interconnecting these components. The one or more communication buses 278-1 optionally include circuitry (sometimes called a chipset) that interconnects and controls communications between system components. Cluster management module 181-1 is coupled to additional module(s) 185 by the one or more communication buses 278-1. Memory 276-1 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 276-1 optionally includes one or more storage devices remotely located from the CPU(s) 182-1. Memory 276-1, or alternatively the non-volatile memory device(s) within memory 276-1, comprises a non-transitory computer readable storage medium. In some embodiments, memory 276-1, or the non-transitory computer readable storage medium of memory 276-1 stores the following programs, modules, and data structures, or a subset or superset thereof:

cluster mapping module 280-1 that is used for mapping virtual logical addresses (e.g., used by computer system 172, FIG. 1C) to intermediate addresses (e.g., which are mapped by storage subsystems 192 to physical addresses, FIG. 1C);

metrics module 282-1 that is used for generating and/or obtaining one or more metrics of a storage device (e.g., any of the storage devices 194-1 to 194-n or 194-j to 194-k, FIG. 1C);

trigger detection module 284-1 that is used for detecting a trigger condition (e.g., in accordance with one or more metrics of a storage device);

enabling module 286-1 that is used for enabling an amelioration process associated with a trigger condition (e.g., detected by trigger detection module 284-1);

notification module 288-1 that is used for notifying a host to which a storage device is operatively coupled of a trigger condition (e.g., detected by trigger detection module 284-1) and/or of an absence of the trigger condition;

amelioration module 290-1 that is used for performing an amelioration process to reduce declared capacity of non-volatile memory of a storage device (e.g., storage device 194, FIG. 1C), optionally including:

detection module 291-1 that is used for detecting an amelioration trigger for reducing declared capacity of the non-volatile memory of the storage device;

utilization module 292-1 that is used for reducing utilization of the non-volatile memory of the storage device; and capacity module 294-1 that is used for reducing declared capacity of the non-volatile memory of the storage device;

optionally, data redundancy module 296-1 that is used for redundantly encoding data; and optionally, communication module 298-1 that is used for facilitating communications with other devices, for example, via a storage area network (SAN).

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 276-1 may store a subset of the modules and data structures identified above. Furthermore, memory 276-1 may store additional modules and data structures not described above. In some embodiments, the programs, modules, and data structures stored in memory 276-1, or the non-transitory computer readable storage medium of memory 276-1, provide instructions for implementing some of the methods described below. In some embodiments, some or all of these modules may be implemented with specialized hardware circuits that subsume part or all of the module functionality.

Although FIG. 2C-1 shows cluster management module 181-1 in accordance with some embodiments, FIG. 2C-1 is intended more as a functional description of the various features which may be present in cluster management module 181-1 than as a structural schematic of the embodiments described herein. In practice, and as recognized by those of ordinary skill in the art, the programs, modules, and data structures shown separately could be combined and some programs, modules, and data structures could be separated.

FIG. 2C-2 is a block diagram illustrating a cluster management module 181-2, in accordance with some embodiments, e.g., embodiments in which the cluster management module is located, at least in part, in the host, as shown in FIG. 1C; in some such embodiments the storage system uses host-based cluster management. Cluster management module 181-2 typically includes one or more processing units (sometimes called CPUs or processors) 182-2 for executing modules, programs and/or instructions stored in memory 276-2 and thereby performing processing operations, memory 276-2 (sometimes called host memory), and one or more communication buses 278-2 for interconnecting these components. The one or more communication buses 278-2 optionally include circuitry (sometimes called a chipset) that interconnects and controls communications between system components. Cluster management module 181-2 is coupled to cluster controller 180 by the one or more communication buses 278-2. Memory 276-2 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 276-2 optionally includes one or more storage devices remotely located from the CPU(s) 182-2. Memory 276-2, or alternatively the non-volatile memory device(s) within memory 276-2, comprises a non-transitory computer readable storage medium. In some embodiments, memory 276-2, or the non-transitory computer readable storage medium of memory 276-2 stores the following programs, modules, and data structures, or a subset or superset thereof:

- cluster mapping module 280-2 that is used for mapping virtual logical addresses (e.g., used by computer system 172, FIG. 1C) to intermediate addresses (e.g., which are mapped by storage subsystems 192 to physical addresses, FIG. 1C);
- metrics module 282-2 that is used for generating and/or obtaining one or more metrics of a storage device (e.g., any of the storage devices 194-1 to 194-n or 194-j to 194-k, FIG. 1C);
- trigger detection module 284-2 that is used for detecting a trigger condition (e.g., in accordance with one or more metrics of a storage device);
- enabling module 286-2 that is used for enabling an amelioration process associated with a trigger condition (e.g., detected by trigger detection module 284-2);
- notification module 288-2 that is used for notifying a host to which a storage device is operatively coupled of a trigger condition (e.g., detected by trigger detection module 284-2) and/or of an absence of the trigger condition;
- amelioration module 290-2 that is used for performing an amelioration process to reduce declared capacity of non-volatile memory of a storage device (e.g., storage device 194, FIG. 1C), optionally including:
  - detection module 291-2 that is used for detecting an amelioration trigger for reducing declared capacity of the non-volatile memory of the storage device;
  - utilization module 292-2 that is used for reducing utilization of the non-volatile memory of the storage device; and
  - capacity module 294-2 that is used for reducing declared capacity of the non-volatile memory of the storage device;
- optionally, data redundancy module 296-2 that is used for redundantly encoding data; and
- optionally, communication module 298-2 that is used for facilitating communications with other devices, for example, via a storage area network (SAN).

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 276-2 may store a subset of the modules and data structures identified above. Furthermore, memory 276-2 may store additional modules and data structures not described above. In some embodiments, the programs, modules, and data structures stored in memory 276-2, or the non-transitory computer readable storage medium of memory 276-2, provide instructions for implementing some of the methods described below. In some embodiments, some or all of these modules may be implemented with specialized hardware circuits that subsume part or all of the module functionality.

Although FIG. 2C-2 shows cluster management module 181-2 in accordance with some embodiments, FIG. 2C-2 is intended more as a functional description of the various features which may be present in cluster management module 181-2 than as a structural schematic of the embodiments described herein. In practice, and as recognized by those of ordinary skill in the art, the programs, modules, and data structures shown separately could be combined and some programs, modules, and data structures could be separated.

Figure 2D:
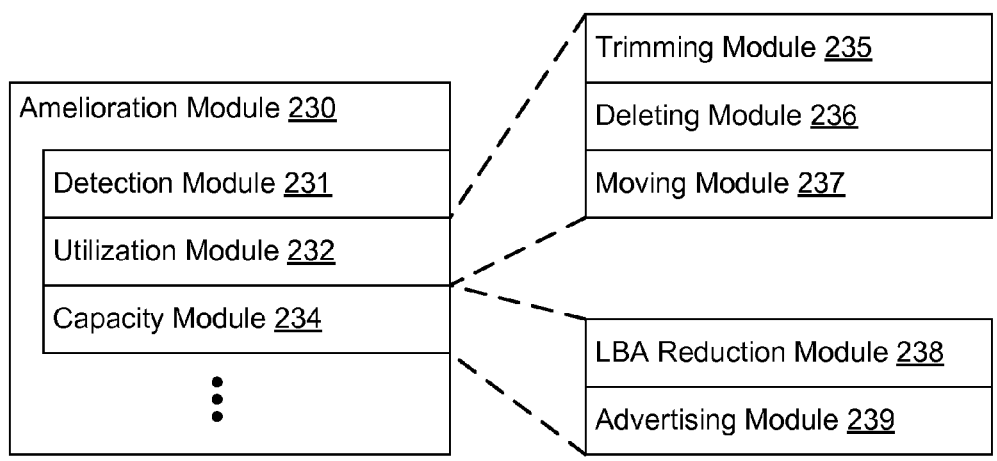
FIG. 2D is a block diagram illustrating an implementation of an amelioration module included in FIGS. 2A-1 and 2A-2, in accordance with some embodiments.

FIG. 2D is a block diagram illustrating amelioration module 230 included in management module 121-1 of FIG. 2A-1 and/or management module 121-2 of FIG. 2A-2, in accordance with some embodiments. As described above with respect to FIGS. 2A-1 and 2A-2, in some embodiments, amelioration module 230 includes utilization module 232 and capacity module 234. In some embodiments, utilization module 232 includes the following programs and/or modules, or a subset or superset thereof:

- trimming module 235 that is used for trimming from a storage device at least a portion of previously-written data that is no longer used by a host (e.g., not live data 332, FIG. 3);
- deleting module 236 that is used for deleting from a storage device discardable data that is used by a host; and
- moving module 237 that is used for moving a portion of data that is used by a host from a storage device to another storage device.

In some embodiments, capacity module 234 includes the following programs and/or modules, or a subset or superset thereof:

- LBA reduction module 238 (sometimes called a logical address reduction module) that is used for reducing a range of logical addresses, reducing a count of logical addresses, and/or making specific logical addresses unavailable to a host; and
- advertising module 239 that is used for advertising a reduced declared capacity of non-volatile memory of a storage device or storage subsystem.

In some embodiments, the amelioration process includes a utilization reduction process (e.g., performed by utilization module 232) and a declared capacity reduction process (e.g., performed by capacity module 234). In some embodiments, the amelioration process has a target reduced declared capacity to be achieved by the amelioration process, and utilizes the target reduced declared capacity to determine a target amount of utilization reduction to be achieved by the amelioration process. In some circumstances, such as when the amelioration process has a target reduced declared capacity to be achieved by the amelioration process, and the amount of a storage device utilized is less than the target reduced declared capacity, the target amount of utilization reduction is zero. In such circumstances, performance of the utilization reduction process, or one or more portions of the utilization reduction process, is unneeded and therefore skipped or forgone. Furthermore, in some embodiments, the amelioration process (e.g., periodically, semi-continuously, irregularly, initially and/or finally) recomputes or re-evaluates a number of parameters, such as the target reduced declared capacity and/or the target amount of utilization reduction, as those parameters may change in value due to the amelioration process and/or normal storage operations (e.g., read, write, erase and trim or unmap operations). In some circumstances, in accordance with the recomputed or re-evaluated parameters, the utilization reduction is re-prioritized, re-scheduled, or aborted. Although FIG. 2D uses the example of amelioration module 230 included in FIGS. 2A-1 and 2A-2, the description of FIG. 2D similarly applies to other amelioration modules (e.g., amelioration module 260-1 of FIG. 2B-1, amelioration module 260-2 of FIG. 2B-2, amelioration module 290-1 of FIG. 2C-1, and/or amelioration module 290-2 of FIG. 2C-2), and for sake of brevity, the details are not repeated here.

The trim operation indicates that specific portions of the LBA space (320, FIG. 3) are converted to unallocated LBA space (340), thereby reducing utilization. The trim operation typically includes invalidating one or more entries of a mapping table (e.g., mapping table 402, FIG. 4) used to translate logical addresses in a logical address space to physical addresses in a physical address space of a storage device. As a result of the trim operation, any data that was previously stored using the specific portion of the LBA space is no longer available to the host (e.g., is discarded). The physical pages used to previously store this data may be reused for other purposes. The reuse may be done coincident in time with the trim operation or at a future time (e.g., during garbage collection). As discussed elsewhere, the reused physical pages may be used with a different encoding format or different redundancy mechanism than the encoding format or different redundancy mechanism used by those same physical pages before the reuse. The trim operation is sometimes also referred to as an unmap operation. The trim operation, as used herein, is not necessarily identical to the trim operation of the SATA protocol. The unmap operation, as used herein, is not necessarily identical to the unmap operation of the SCSI protocol.

Figure 3:
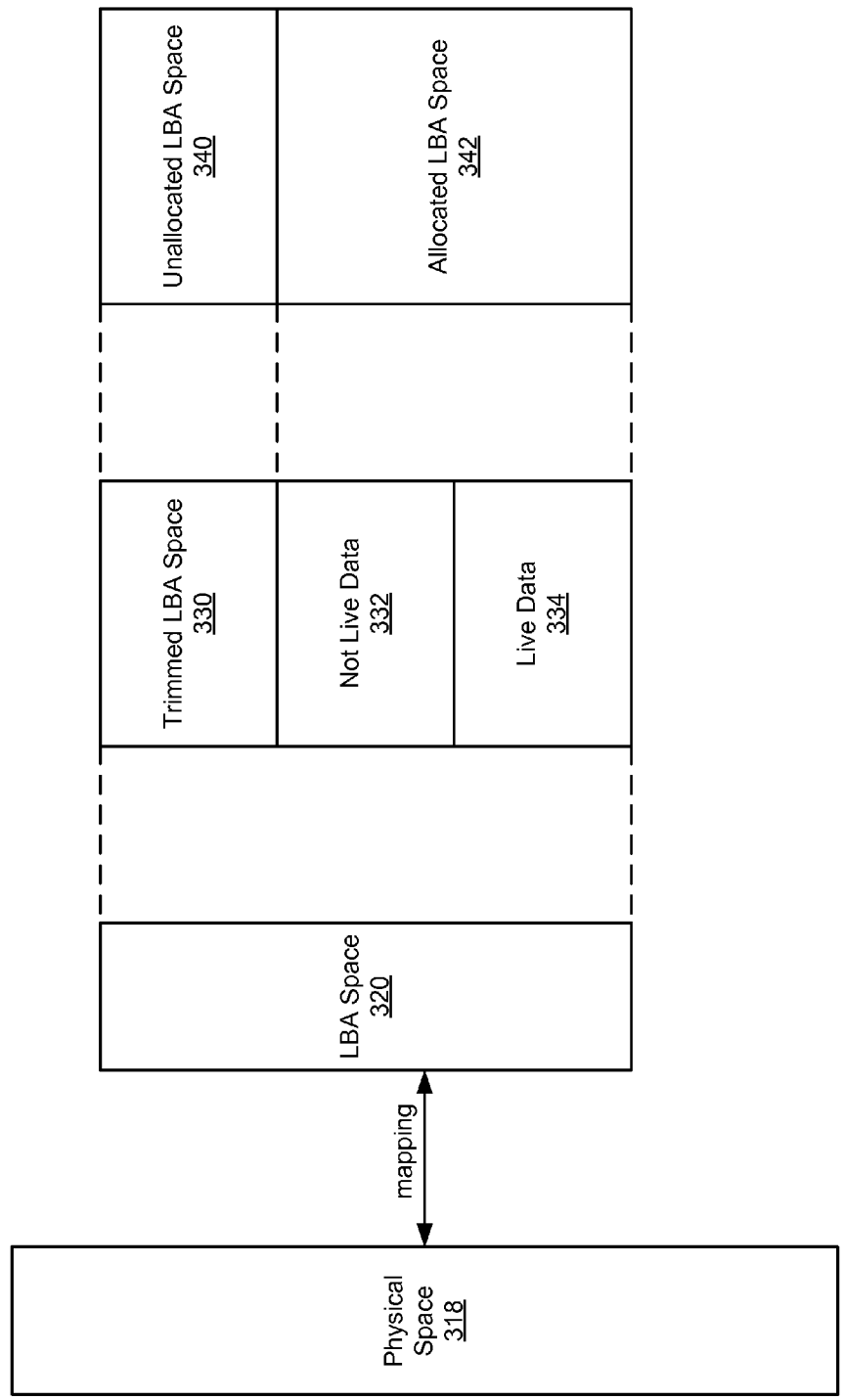
FIG. 3 is a block diagram of a logical address space, and more specifically a logical block address (LBA) space, in accordance with some embodiments.

FIG. 3 is a block diagram of a logical block address (LBA) space 320 (sometimes called logical address (LA) space), in accordance with some embodiments. In some embodiments, a logical address is the address at which an item (e.g., a file or other data) resides from the perspective of a host (e.g., computer system 110, FIG. 1A, computer system 142, FIG. 1B, and/or computer system 172, FIG. 1C). In some embodiments, a logical address (e.g., in LBA space 320) differs from a physical address (e.g., in physical space 318) due to the operation of a mapping function or address translator (e.g., a function or module that includes translation table 212-1, FIG. 2A-1, or mapping table 402, FIG. 4). In some embodiments, a logical block address (LBA) is mapped to a physical flash address (e.g., a physical page number (PPN), including a bank, block, and page), as described further with respect to FIG. 4.

In some embodiments, a logical address space includes allocated logical address space (e.g., allocated LBA space 342) and unallocated logical address space (e.g., unallocated LBA space 340). In some embodiments, unallocated logical address space is logical address space at which no data is stored. In some embodiments, unallocated logical address space includes logical address space that has never been written to and/or has been discarded (previously written data may be discarded through a trim or unmap operation, and is sometimes called trimmed logical address space). For example, in FIG. 3, unallocated LBA space 340 includes trimmed LBA space 330. In some embodiments, allocated logical address space is logical address space that was previously-written by a host, the previously-written data including data that is no longer used by a host (e.g., not live data 332) and data that is still in use by the host (e.g., live data 334). In some embodiments, not live data is data in a portion of the logical address space that is marked as free, available or unused in the metadata of a file system. Optionally, a file system may choose to convert not live address space into unallocated address space through a trim or unmap operation.

In FIG. 3, allocated LBA space 342 represents an amount of allocated space, and unallocated LBA space 340 represents an amount of unallocated space. However, neither allocated LBA space 342 nor unallocated LBA space 340 is necessarily a single contiguous region of LBA space 320. Similarly, live data 334 and not live data 332 in FIG. 3 represent amounts (e.g., counts of LBAs) of live data and not live data, respectively. However, neither live data 334 nor not live data 332 is necessarily a single contiguous region of LBA space 320 or allocated LBA space 342, nor do the positions of live data 334 and not live data 332 illustrated in FIG. 3 have any correlation to the logical or physical address values of the live data and not live data. Typically, live data 334 and/or not live data 332 will be present in multiple regions of LBA space 320, and are thus non-contiguous. Optionally, however, a remapping or coalescing process, which can also be called defragmentation, can be performed to consolidate some or all live data 334 into a contiguous region of LBA space 320.

Allocated logical address space (342) is space that is utilized. The utilization reduction modules and processes discussed herein are modules, applications and processes whose purpose is to reduce the size of the allocated logical address space, and thus reduce utilization of non-volatile memory in a storage device or data storage system. Typically, reducing the size of the allocated logical address space requires reducing the amount of live data 334 and/or not live data 332 stored by a storage device, or storage system, thereby converting a portion of the allocated logical address space into unallocated logical address space. In some embodiments, portions of not live data 332 are trimmed, and thereby converted into unallocated logical address space through the use of trim or unmap operations.

In some embodiments, a logical address may be outside of LBA Space (320) and is therefore unavailable. A previously available logical address can be made unavailable by reducing the size of the LBA space (320) such that that address is no longer within LBA space (320) and hence becomes unavailable (e.g. it is an undefined operation or erroneous operation to request a normal storage operation to a logical address that is outside of LBA space (320)). As noted above, LBA Space (320) can be reduced by a command to the storage device, or a host can limit its usage of logical addresses to a reduced range of logical addresses therefore effectively reducing LBA space (320).

In some embodiments, the total number of allocated logical addresses (342) is limited. In such embodiments, specific logical addresses are considered to be unavailable if usage of them would cause the system to exceed the limited total number. For example, if the total number of allocated logical addresses is limited to five and the currently allocated addresses are 1, 3, 19, 45 and 273838 then any specific logical address other than these five (e.g., 6, 15, 137, etc.) would be considered unavailable.

FIG. 4 is a block diagram of a mapping table 402 and physical address space 410, in accordance with some embodiments. In some embodiments, mapping table 402 is used to translate a logical block address (LBA) from the perspective of a host (e.g., computer system 110, FIG. 1A) to a physical address in a physical address space (e.g., physical address space 410) of non-volatile memory in a storage device (e.g., storage device 120, FIG. 1A). In some embodiments, an LBA is the address of the smallest unit of stored data that is addressable by a host (e.g., 512 B or 4096 B). In some embodiments, LBAs are a sequence of integers organized in numerical order in the logical address space. In some embodiments, LBAs are integers chosen from a logical address space but need not be contiguous. For example, in implementations that utilize a sparse logical address space, the amount of addressable space is governed by a limit on the number of logical addresses that can be allocated, but those logical addresses are distributed over a larger address space than the maximum number of logical addresses that can be allocated (e.g., to a host or a set of hosts or clients).

In some embodiments, mapping table 402 is stored in memory associated with the storage device (e.g., in memory 206-1, as part of translation table 212-1, FIG. 2A-1). In some embodiments, a physical address is a physical page number (PPN), including a bank number, a block number, and a page number. In the example shown in FIG. 4, LBA 0 is mapped to bank 1 (e.g., Bank 420-1), block 3 (e.g., Block 421-3), page 37 (pages not shown in FIG. 4) of physical address space 410. FIG. 4 shows that physical address space 410 includes a plurality of non-volatile memory blocks 421, 422 423, 424. As described above, and as shown in the representation of block 424-p, each non-volatile memory block in the physical address space of a storage device typically includes a plurality of pages 426, where each page is typically an instance of the smallest individually accessible (e.g., readable or writable) portion of a block. Although FIG. 4 illustrates one example of a logical address to physical address mapping, in other embodiments, different mappings may be used. For example, in some embodiments, each of the logical address entries corresponds to multiple (e.g., eight) logical addresses (e.g., 8 LBAs per logical address entry). In some embodiments mapping table 402 need not contain contiguous LBA addresses and may be organized in any manner to facilitate lookup operations, e.g., hash table, binary tree, content addressable memory, and others.

As discussed below with reference to FIG. 5A, a single-level flash memory cell (SLC) stores one bit ("0" or "1"). Thus, the storage density of a SLC memory device is one bit of information per memory cell. A multi-level flash memory cell (MLC), however, can store two or more bits of information per cell by using different ranges within the total voltage range of the memory cell to represent a multi-bit bit-tuple. In turn, the storage density of a MLC memory device is multiple-bits per cell (e.g., two bits per memory cell).

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, typically means the threshold voltage of the memory cell, which is the minimum voltage that needs to be applied to the gate of the memory cell's transistor in order for the transistor to conduct current. Similarly, reading threshold voltages (sometimes also called reading signals, reading voltages, and/or read thresholds) applied to a flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1," and otherwise the raw data value is a "0."

Figure 5A:
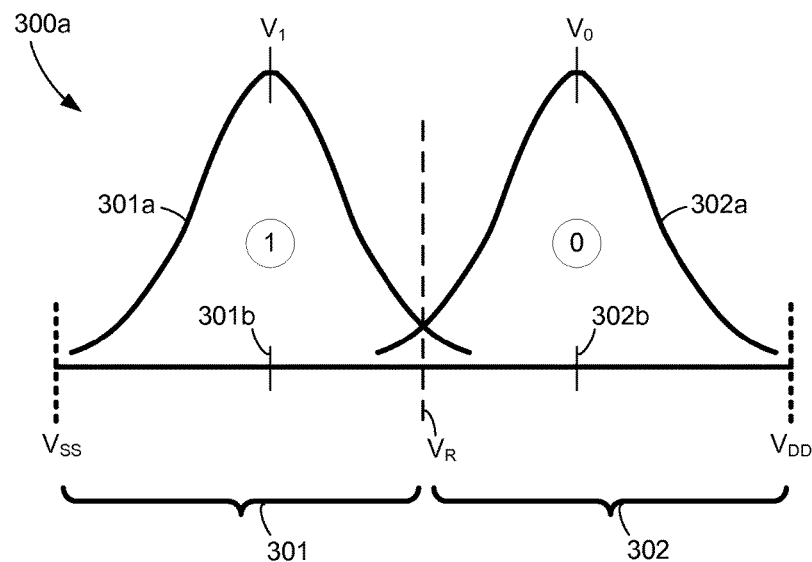
FIG. 5A is a prophetic diagram of voltage distributions that may be found in a single-level flash memory cell (SLC) over time, in accordance with some embodiments.

FIG. 5A is a simplified, prophetic diagram of voltage distributions 300a found in a single-level flash memory cell (SLC) over time, in accordance with some embodiments. The voltage distributions 300a shown in FIG. 5A have been simplified for illustrative purposes. In this example, the SLC's voltage range extends approximately from a voltage, $V_{SS}$, at a source terminal of an NMOS transistor to a voltage, $V_{DD}$, at a drain terminal of the NMOS transistor. As such, voltage distributions 300a extend between $V_{SS}$ and $V_{DD}$.

Sequential voltage ranges 301 and 302 between source voltage $V_{SS}$ and drain voltage $V_{DD}$ are used to represent corresponding bit values "1" and "0," respectively. Each voltage range 301, 302 has a respective center voltage $V_1$ 301b, $V_0$ 302b. As described below, in many circumstances the memory cell current sensed in response to an applied reading threshold voltages is indicative of a memory cell voltage different from the respective center voltage $V_1$ 301b or $V_0$ 302b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 301, 302 also has a respective voltage distribution 301a, 302a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 301b and $V_0$ 302b). Optionally, in some implementations, the reading threshold voltage is located between voltage ranges 301 and 302. In some implementations, reading threshold voltage $V_R$ is applied in the region proximate to where the voltage distributions 301a and 302a overlap, which is not necessarily proximate to the halfway region between adjacent center voltages $V_1$ 301b and $V_0$ 302b.

In order to increase storage density in flash memory, flash memory has developed from single-level (SLC) cell flash memory to multi-level cell (MLC) flash memory so that two or more bits can be stored by each memory cell. As discussed below with reference to FIG. 5B, a MLC flash memory device is used to store multiple bits by using voltage ranges within the total voltage range of the memory cell to represent different bit-tuples. A MLC flash memory device is typically more error-prone than a SLC flash memory device created using the same manufacturing process because the effective voltage difference between the voltages used to store different data values is smaller for a MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 5B, the impact of such errors can be reduced by gray-coding the data, such that adjacent voltage ranges represent single-bit changes between bit-tuples.

Figure 5B:
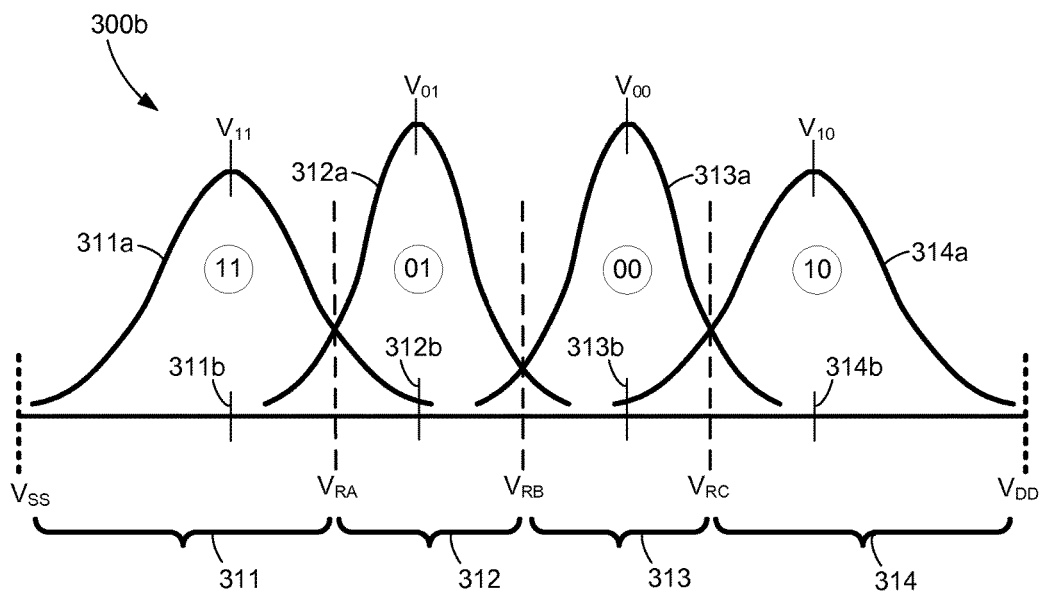
FIG. 5B is a prophetic diagram of voltage distributions that may be found in a multi-level flash memory cell (MLC) over time, in accordance with some embodiments.

FIG. 5B is a simplified, prophetic diagram of voltage distributions 300b found in a multi-level flash memory cell (MLC) over time, in accordance with some embodiments. The voltage distributions 300b shown in FIG. 5B have been simplified for illustrative purposes. The cell voltage of a MLC approximately extends from a voltage, $V_{SS}$, at the source terminal of a NMOS transistor to a voltage, $V_{DD}$, at the drain terminal. As such, voltage distributions 300b extend between $V_{SS}$ and $V_{DD}$.

Sequential voltage ranges 311, 312, 313, 314 between the source voltage $V_{SS}$ and drain voltages $V_{DD}$ are used to represent corresponding bit-tuples "11," "01," "00," "10," respectively. Each voltage range 311, 312, 313, 314 has a respective center voltage 311b, 312b, 313b, 314b. Each voltage range 311, 312, 313, 314 also has a respective voltage distribution 311a, 312a, 313a, 314a that may occur as a result of any number of a combination of factors, such as electrical fluctuations, defects in the storage medium, operating conditions, device history (e.g., number of program-erase (P/E) cycles), and/or imperfect performance or design of write-read circuitry.

Ideally, during a write operation, the charge on the floating gate of the MLC would be set such that the resultant cell voltage is at the center of one of the ranges 311, 312, 313, 314 in order to write the corresponding bit-tuple to the MLC. Specifically, the resultant cell voltage would be set to one of $V_{11}$ 311b, $V_{01}$ 312b, $V_{00}$ 313b and $V_{10}$ 314b in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 311, 312, 313, 314. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 311b, $V_{01}$ 312b, $V_{00}$ 313b or $V_{10}$ 314b corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 5B, the corresponding bit-tuples for adjacent ranges 301 and 302 are respectively "11" and "01," the corresponding bit-tuples for adjacent ranges 302 and 303 are respectively "01" and "00," and the corresponding bit-tuples for adjacent ranges 303 and 304 are respectively "00" and "10." Using gray-coding, if the cell voltage drifts close to a read comparison voltage level, the error is typically limited to a single bit within the 2-bit bit-tuple.

Although the description of FIG. 5B uses an example in which q=2 (i.e., 2 bits per cell in a MLC flash memory), those skilled in the art will appreciate that the embodiments described herein may be extended to memory cells that have more than four possible states per cell, yielding more than two bits of information per cell. For example, in some embodiments, a triple-level memory cell (TLC) has eight possible states per cell, yielding three bits of information per cell. As another example, in some embodiments, a quad-level memory cell (QLC) has 16 possible states per cell, yielding four bits of information per cell. As another example, in some embodiments, a cell might store only 6 states, yielding approximately 2.5 bits of information per cell, meaning that two cells together would provide 36 possible states, more than sufficient to store 5 bits of information per pair of cells.

Figure 6:
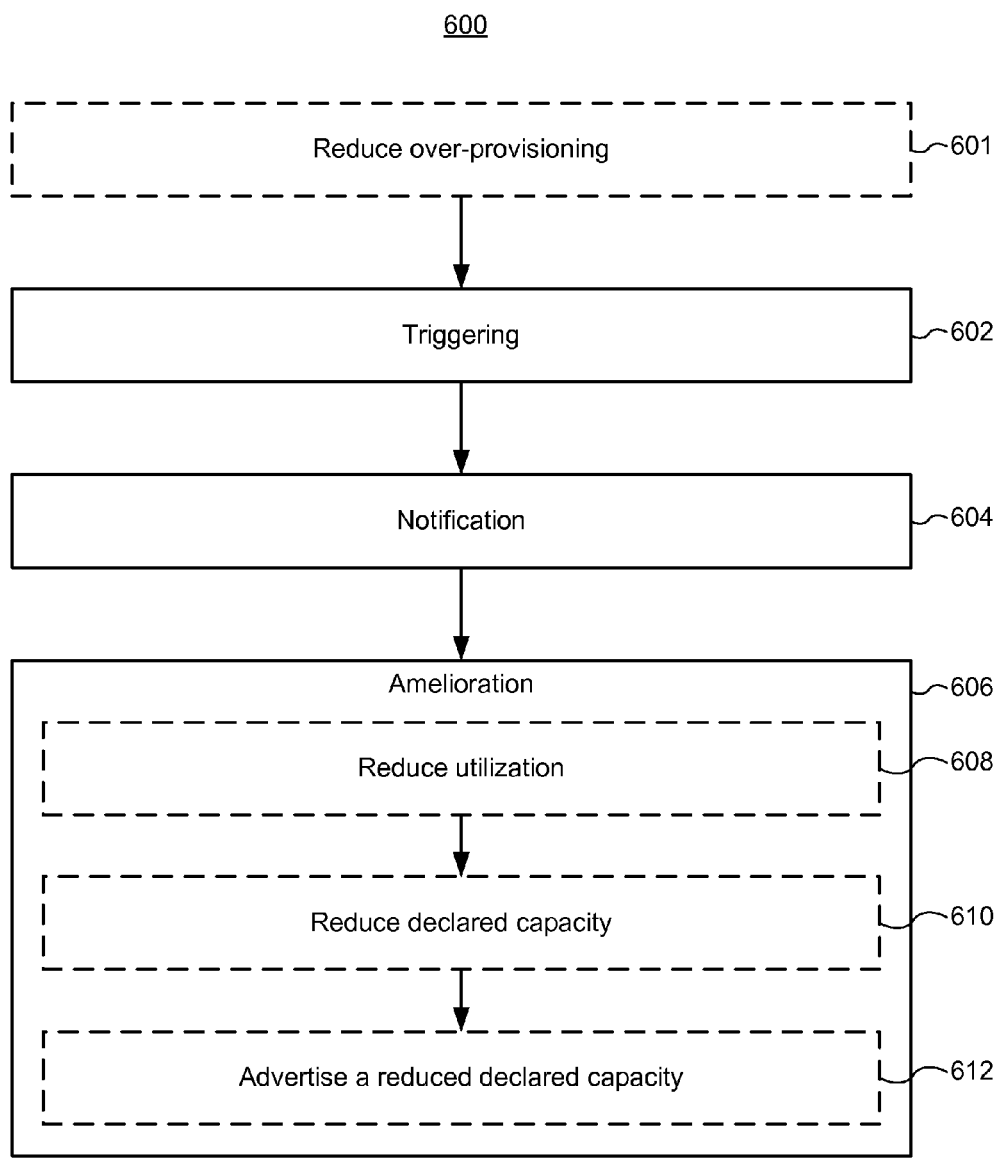
FIG. 6 illustrates a flowchart representation of a method of managing a storage system, in accordance with some embodiments.
Figure 7A:
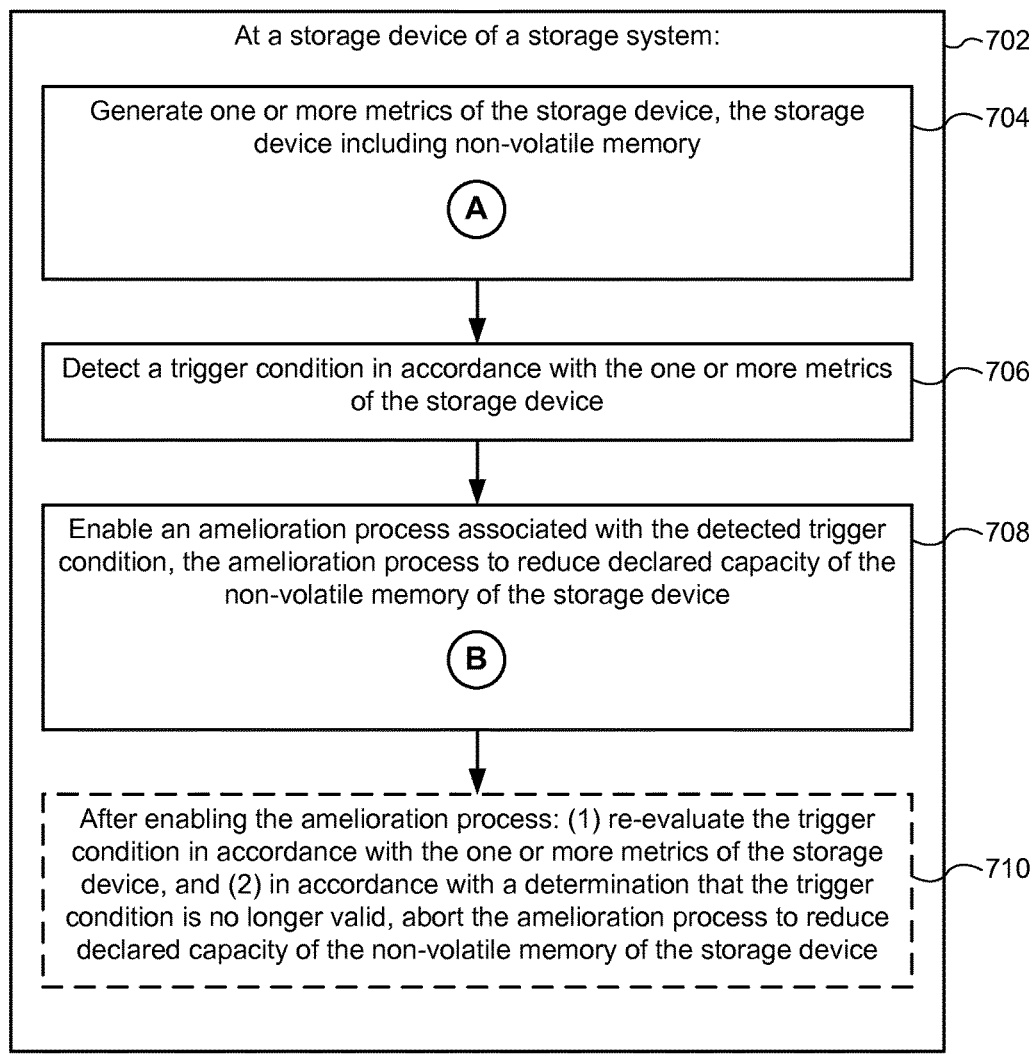
FIGS. 7A-7D illustrate a flowchart representation of a method of managing a storage system, in accordance with some embodiments.
Figure 7B:
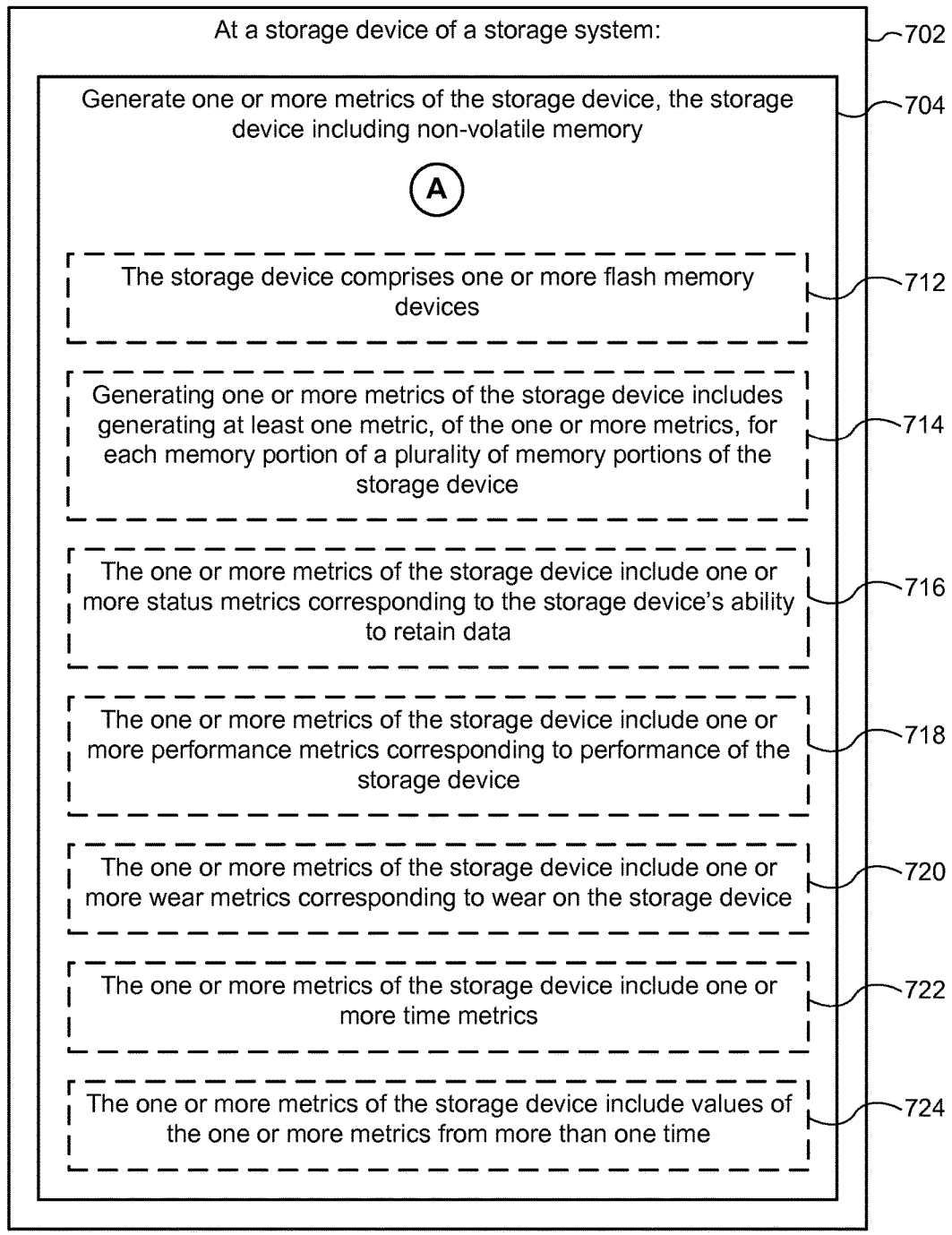
Figure 7C:
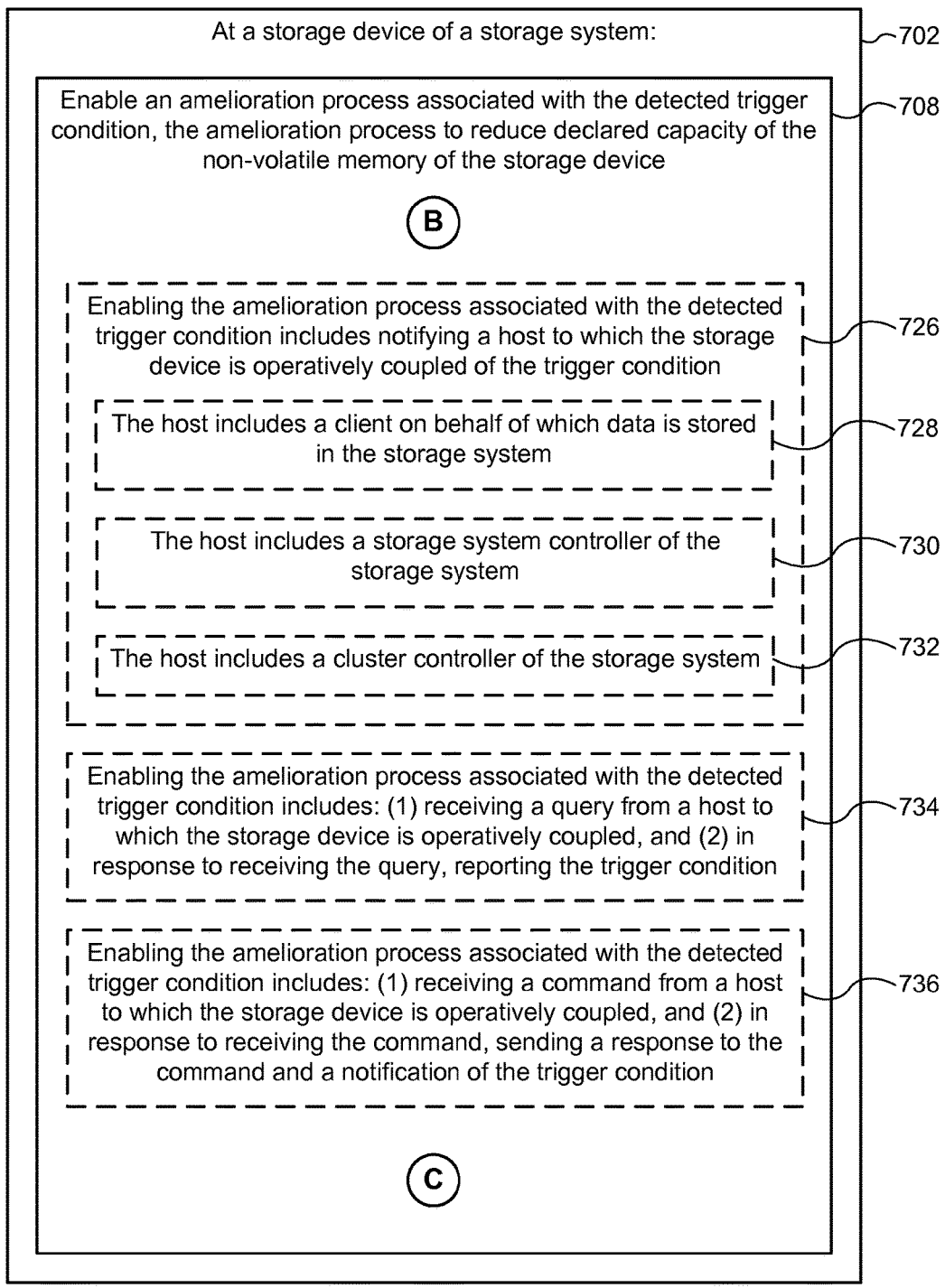
Figure 7D:
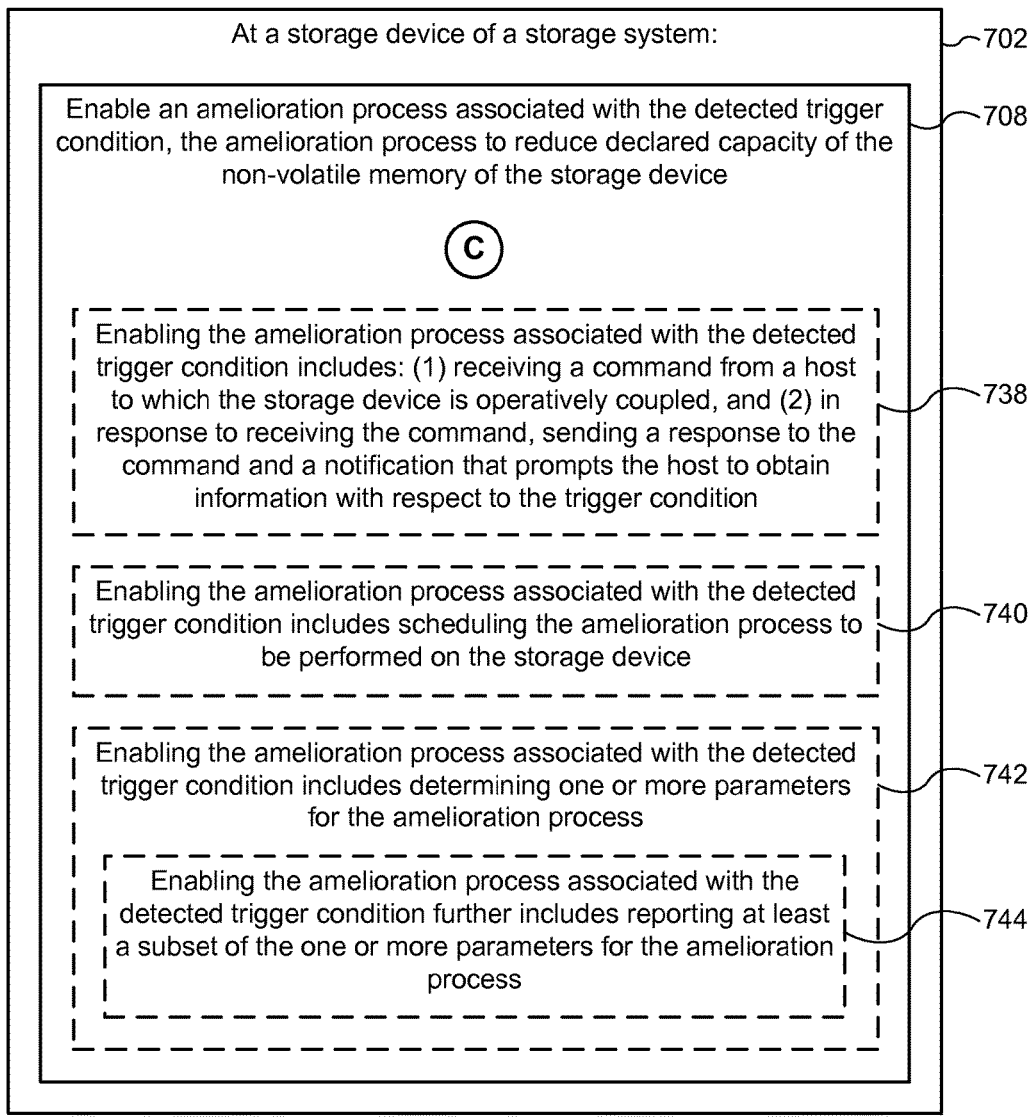
Figure 8A:
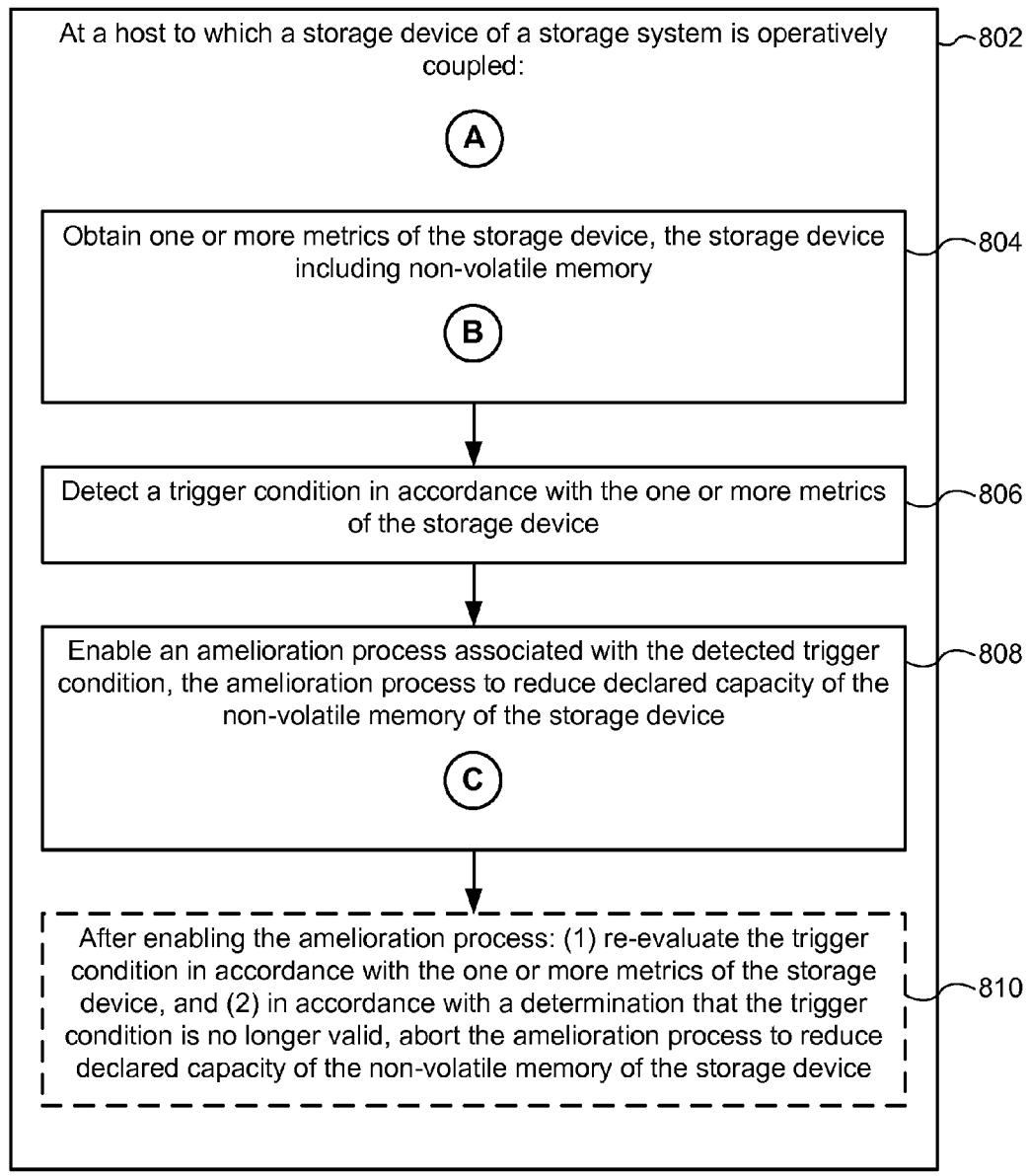
FIGS. 8A-8D illustrate a flowchart representation of a method of managing a storage system, in accordance with some embodiments.
Figure 8B:
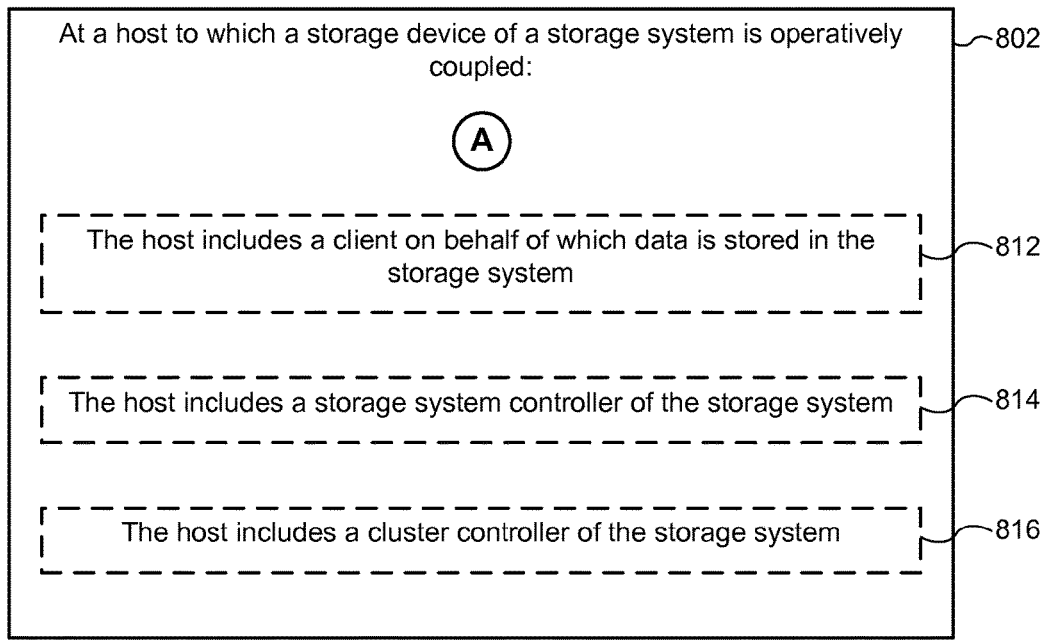
Figure 8C:
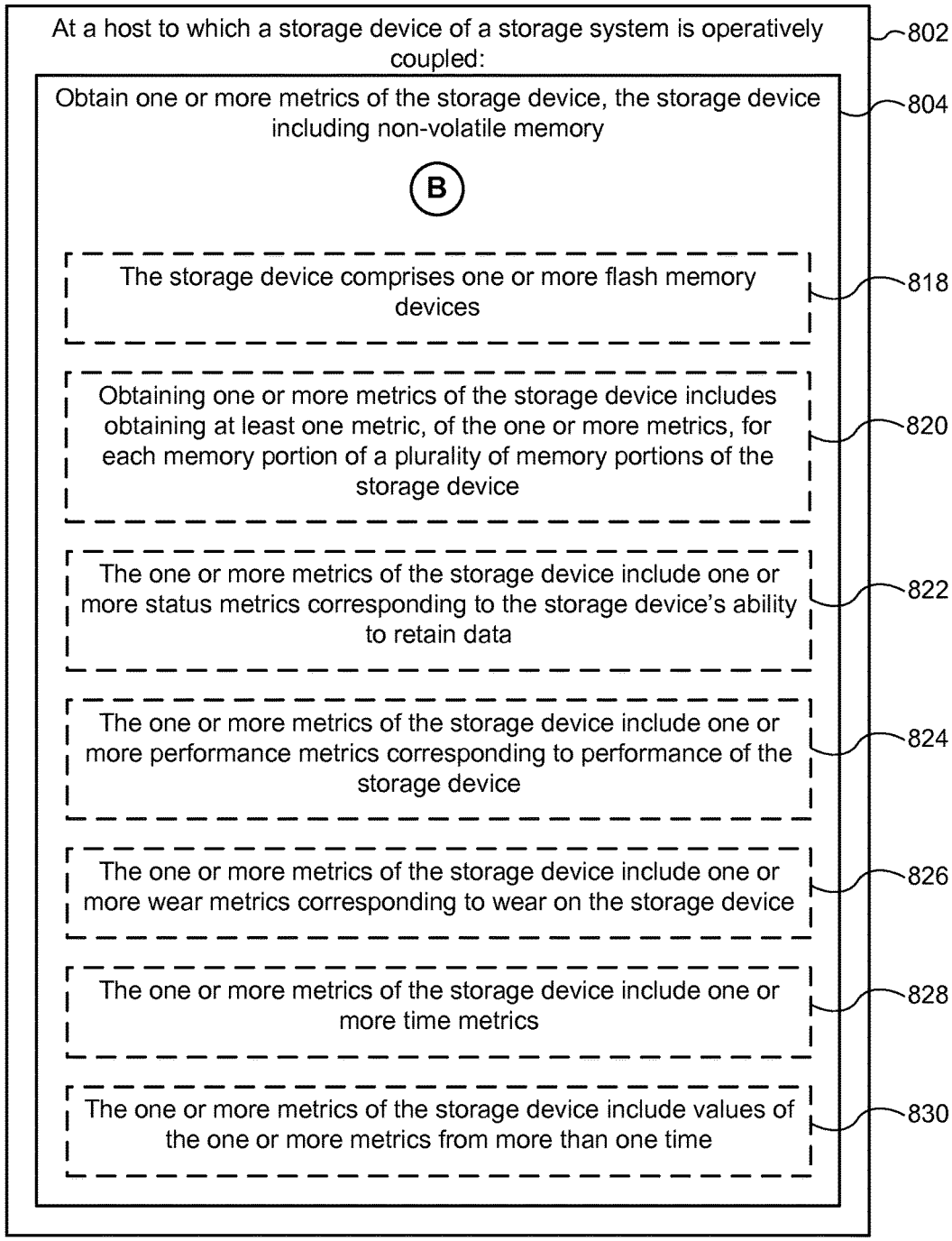
Figure 8D:
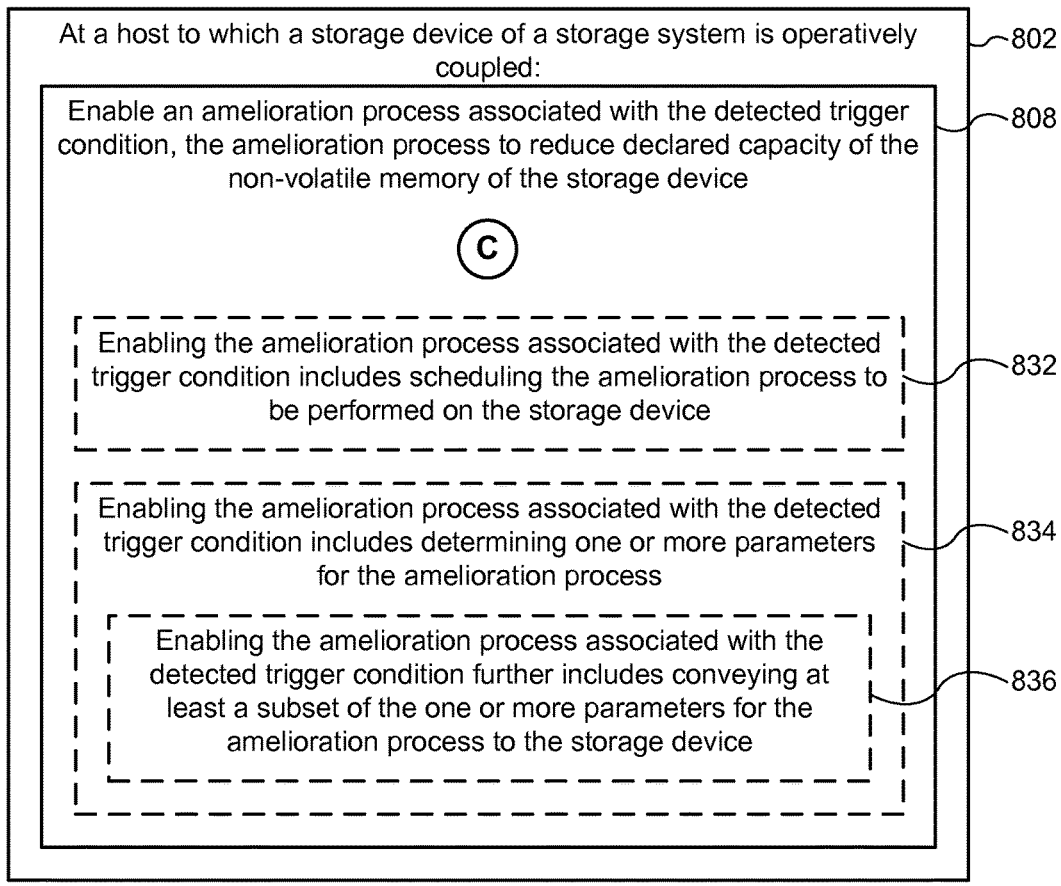
Figure 9A:
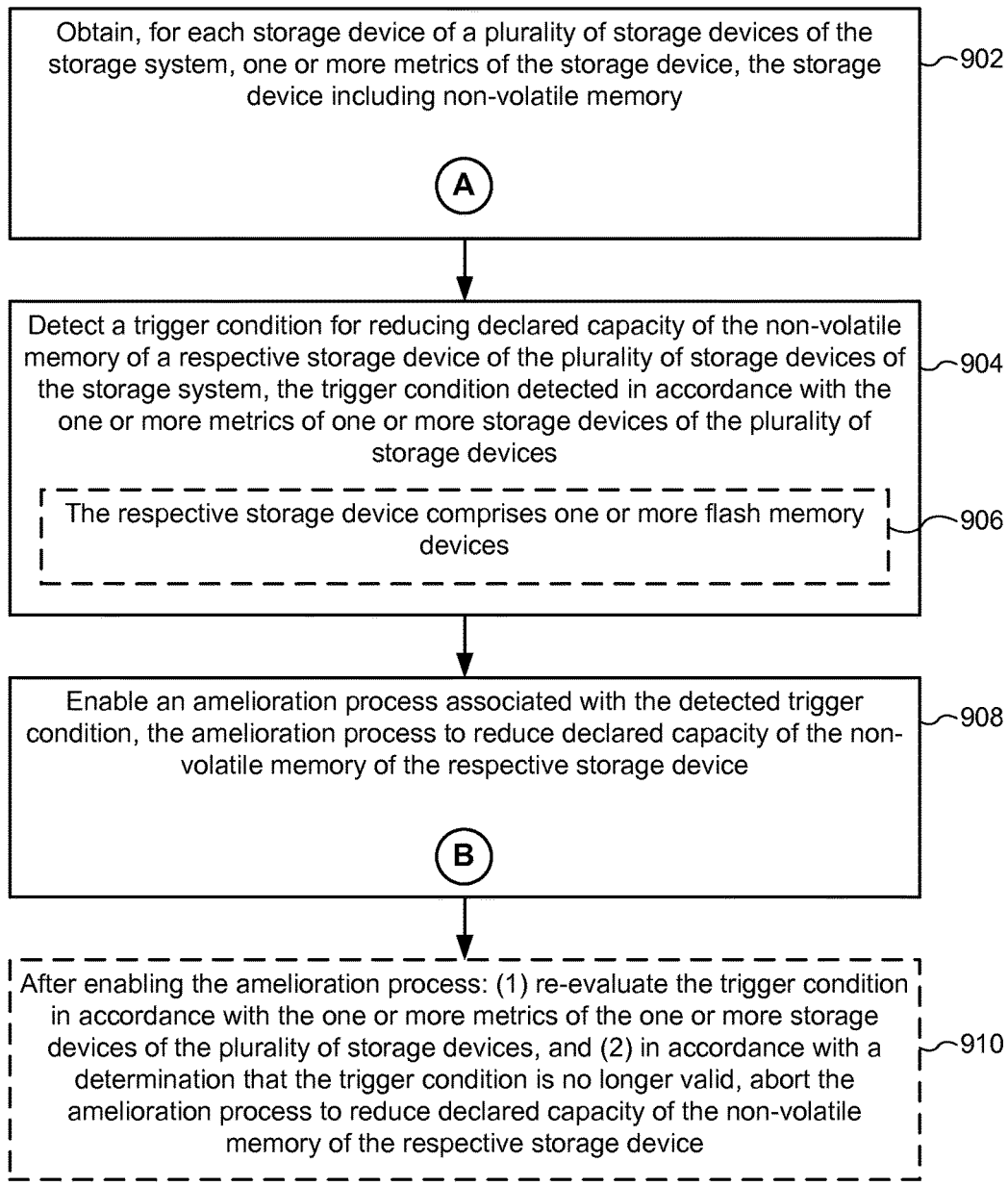
FIGS. 9A-9D illustrate a flowchart representation of a method of managing a storage system, in accordance with some embodiments.
Figure 9B:
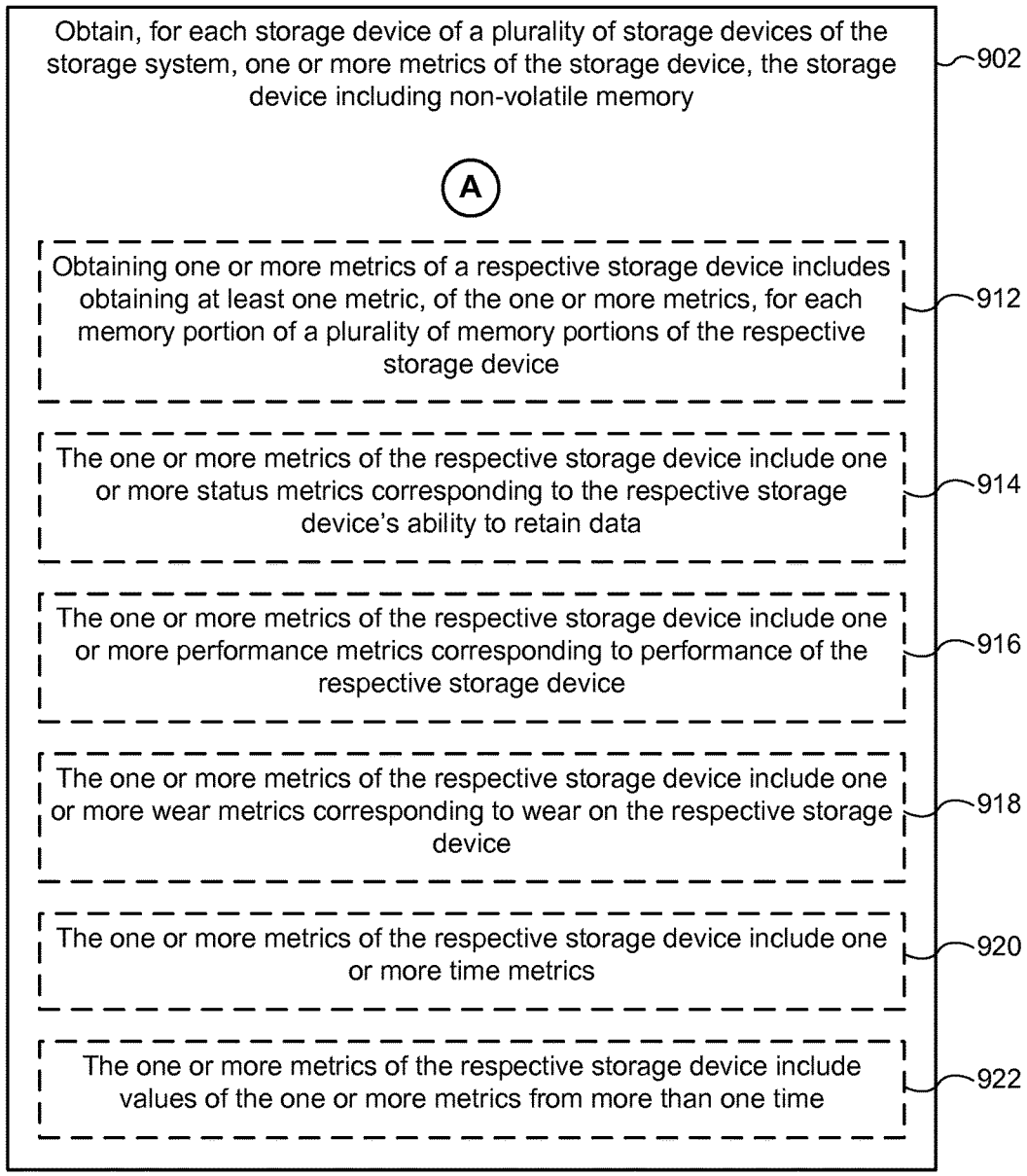
Figure 9C:
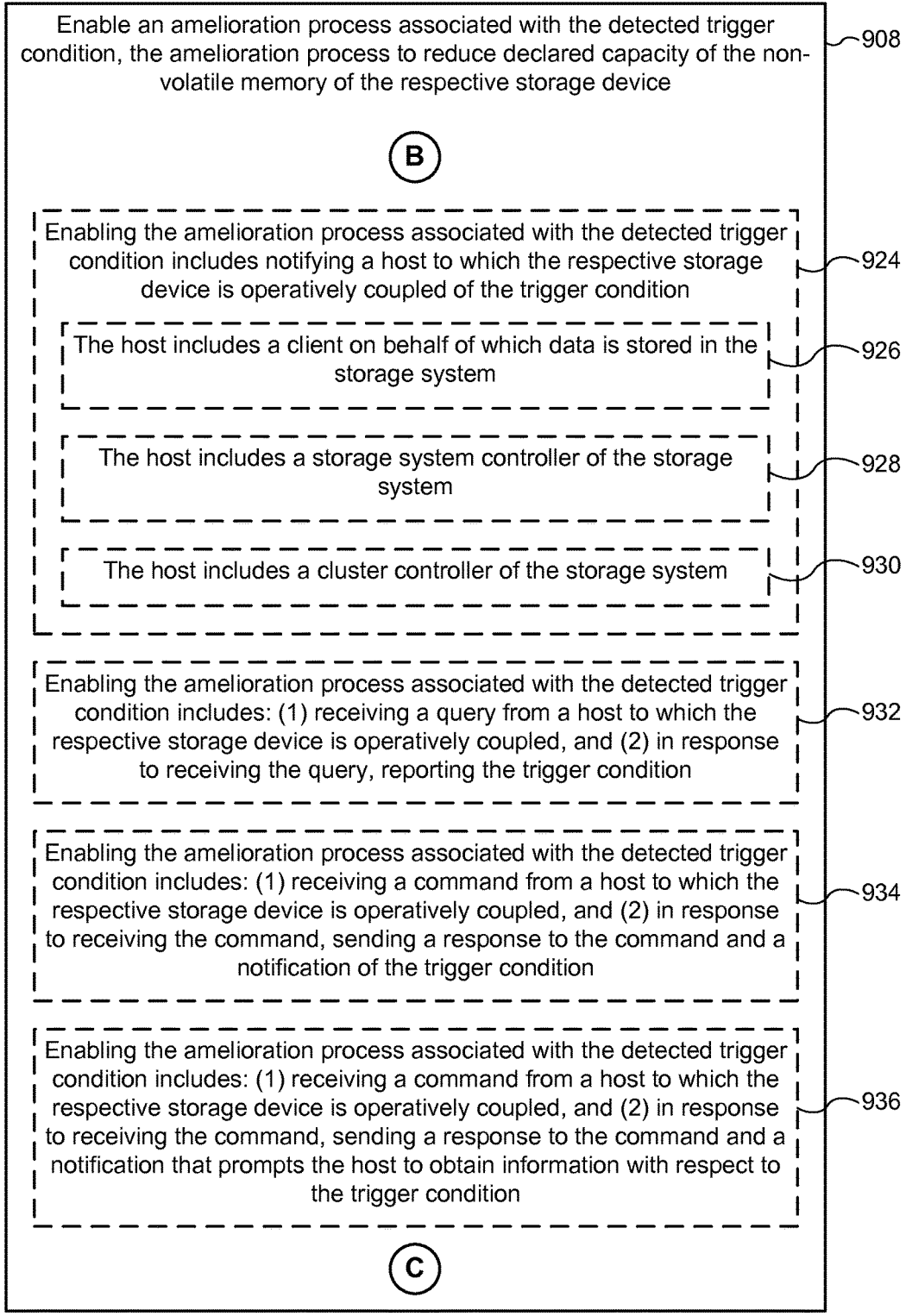
Figure 9D:
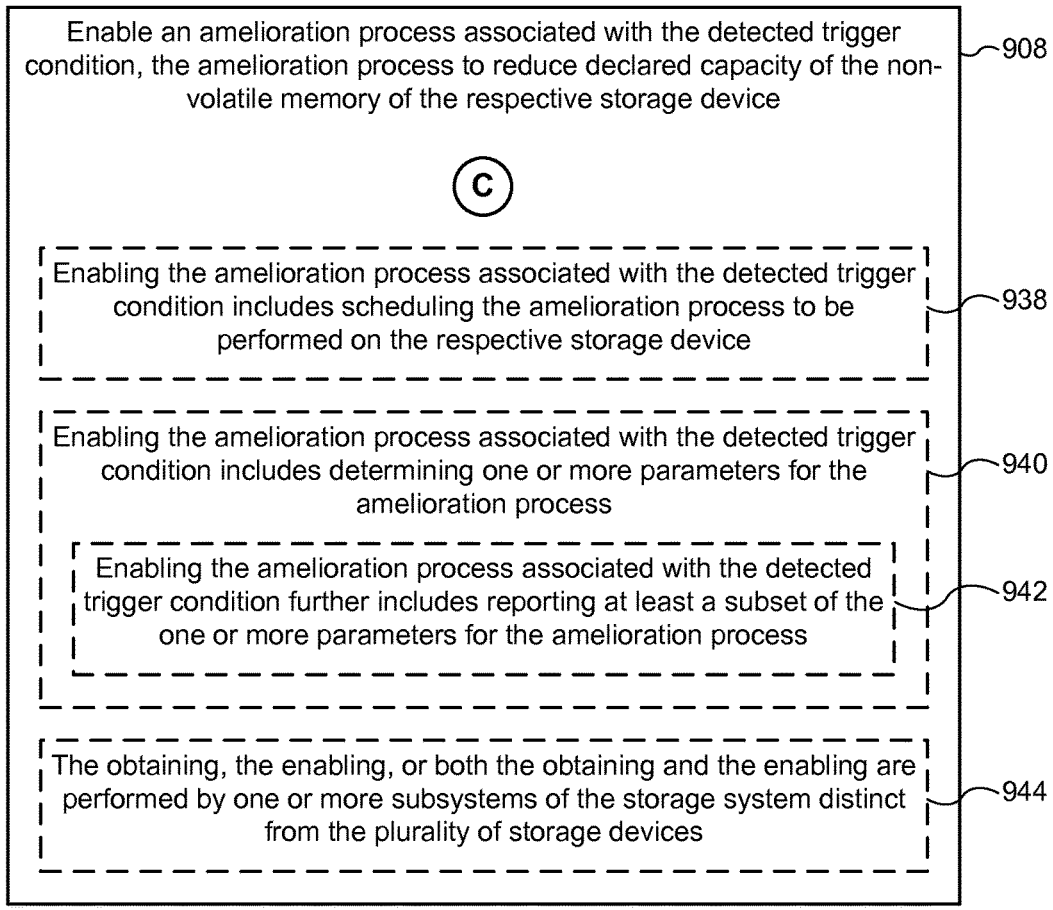

FIG. 6 illustrates a flowchart representation of a method 600 of managing a storage system, in accordance with some embodiments. At least in some embodiments, method 600 is performed by a storage device (e.g., storage device 120, FIG. 1A) or one or more components of the storage device (e.g., storage controller 124 and/or storage medium 130, FIG. 1A), wherein the storage device is operatively coupled with a host system (e.g., computer system 110, FIG. 1A). In some embodiments, method 600 is governed by instructions that are stored in a non-transitory computer readable storage medium and that are executed by one or more processors of a device, such as the one or more processing units (CPUs) 122-1 of management module 121-1, shown in FIGS. 1A and 2A-1. In some embodiments, method 600 is performed by a storage system (e.g., data storage system 100, FIG. 1A, data storage system 140, FIG. 1B, and/or data storage system 170, FIG. 1C) or one or more components of the storage system (e.g., computer system 110 and/or storage device 120, FIG. 1A, storage system controller 150, FIG. 1B, and/or cluster controller 180, FIG. 1C). In some embodiments, some of the operations of method 600 are performed at a host (e.g., computer system 110, FIG. 1A, computer system 142, FIG. 1B, and/or computer system 172, FIG. 1C) and information is transmitted to a storage device (e.g., storage device 120, FIG. 1A) and/or one or more subsystems of a storage system (e.g., storage system controller 150, FIG. 1B, and/or cluster controller 180, FIG. 1C). In some embodiments, method 600 is governed, at least in part, by instructions that are stored in a non-transitory computer readable storage medium and that are executed by one or more processors of a subsystem of a storage system, such as the one or more processing units (CPUs) 152-1 of system management module 151-1, shown in FIGS. 1B and 2B-1 or the one or more processing units (CPUs) 182-1 of cluster management module 181-1, shown in FIGS. 1C and 2C-1. In some embodiments, method 600 is governed, at least in part, by instructions that are stored in a non-transitory computer readable storage medium and that are executed by one or more processors of a host (processors of host not shown in FIGS. 1A, 1B, and 1C). For ease of explanation, the following describes method 600 as performed by a storage device (e.g., storage device 120, FIG. 1A). However, those skilled in the art will appreciate that in other embodiments, one or more of the operations described in method 600 are performed by a host (e.g., computer system 110, FIG. 1A, computer system 142, FIG. 1B, and/or computer system 172, FIG. 1C) and/or one or more subsystems of a storage system distinct from the storage device (e.g., storage system controller 150, FIG. 1B, and/or cluster controller 180, FIG. 1C).

A storage device (e.g., storage device 120, FIG. 1A), triggers (602) a condition for reducing declared capacity of non-volatile memory of the storage device in accordance with one or more metrics of the storage device (e.g., including one or more status metrics corresponding to the storage device's ability to retain data, one or more performance metrics corresponding to performance of the storage device, one or more wear metrics corresponding to wear on the storage device, and/or one or more time metrics). Metrics of the storage device include metrics (e.g., wear metrics such as P/E cycle counts, write operation counts and the like) of the non-volatile storage media (e.g., storage medium 130, FIG. 1A) of the storage device, but are not necessarily limited to such metrics. For example, some metrics (e.g., some performance metrics, such as latency metrics, metrics that measure how long it takes or how many operations are required to complete a write or erase operation, etc.) of the storage device reflect both storage media performance as well as controller and/or other storage device component performance.

In some embodiments, the metrics of the storage device used to determine the trigger condition include a write amplification metric of the storage device. Another metric of the storage device that is used, in some embodiments, to determine the trigger condition is an over-provisioning metric (e.g., quantity or percentage of total storage capacity that is in excess of the declared capacity of the storage device, and/or quantity or percentage of total storage capacity that is in excess of the declared capacity of the storage device after a projected conversion of a number of memory blocks (or other portions of the storage device) from a current encoding format (e.g., TLC, MLC and/or data redundancy mechanism) to a lower storage density encoding format (e.g., MLC, SLC and/or data redundancy mechanism). For example, in some embodiments, a trigger condition is determined if a projected over-provisioning metric, corresponding to a number of blocks (or other portions) of the storage device removed from service (e.g., that have been or will be removed from service) due to wear or due to failure of those blocks (or other portions) to meet a pre-defined quality of service metric, falls below a predefined threshold (e.g., a non-zero threshold such as 2 percent or 5 percent or the like), or falls below a threshold determined in accordance with a measured or projected write amplification of the storage device.

Write amplification is a phenomenon where the actual amount of physical data written to a storage medium (e.g., storage medium 130 in storage device 120) is a multiple of the logical amount of data written by a host (e.g., computer system 110, sometimes called a host) to the storage medium. As discussed above, when a block of storage medium must be erased before it can be re-written, the garbage collection process to perform these operations results in re-writing data one or more times. This multiplying effect increases the number of writes required over the life of a storage medium, which shortens the time it can reliably operate. The formula to calculate the write amplification of a storage system is given by equation:

$$\frac{\text{amount of data written to a storage medium}}{\text{amount of data written by a host}}$$

One of the goals of any flash memory based data storage system architecture is to reduce write amplification as much as possible so that available endurance is used to meet storage medium reliability and warranty specifications. Higher system endurance also results in lower cost as the storage system may need less over-provisioning. By reducing write amplification, the endurance of the storage medium is increased and the overall cost of the storage system is decreased. Generally, garbage collection is performed on erase blocks with the fewest number of valid pages for best performance and best write amplification.

In some embodiments, the trigger condition is detected in accordance with a non-linear and/or linear combination of the one or more metrics. For example, in some embodiments, the trigger condition is detected by comparing a wear metric such as P/E cycle counts to a previously determined value, e.g., a threshold value. In some embodiments, the trigger condition can also be asserted by other means, e.g., by a human operator or scheduled by a human operator. For example, it may be desirable to initiate the amelioration process because of the expected availability or unavailability of resources. For example, it may be desirable to initiate the amelioration process because performance characteristics of the storage device (including reliability) are altered.

In some embodiments, the trigger condition is detected in accordance with historical knowledge of the one or more metrics. For example, historical knowledge can be a running average of one or more metrics. In another example, historical knowledge can be used to determine (e.g., compute) one or more projected values of one or more metrics at a particular time in the future (e.g., an hour, day, week, or month in the future), and the trigger condition can be detected in accordance with the one or more projected values. The latter methodology can be particularly useful for avoiding events that result in loss of data (e.g., due to wear out), or more generally for avoiding events that significantly impact on the quality of service provided by a storage system, and for enabling a storage system to undertake ameliorative measures prior to there being an urgent need to do so. For example, in some embodiments, the trigger condition is detected by comparing a historical wear metric such as P/E cycle counts to a previously determined value to anticipate wear out of a portion of the storage media. Similarly, in some embodiments, the trigger condition is detected by comparing a historical metric, such as the bit error rate (BER), or the rate of change of the metric, BER (of the storage media, or a portion of the storage media), or a projected value (e.g., a projected BER rate at a particular time in the future, as determined based on a current or historical BER and a rate of change of the BER), against a previously determined value to anticipate performance degradation due to increased computation requirements of error correction.

In a storage system with a plurality of storage devices the trigger condition may be dependent on metrics obtained from a plurality of the storage devices. The amelioration process may operate on more than one storage device at a time, either sequentially or in parallel. For example, a storage system may have a fixed maximum rate of capacity reduction independent of how many storage devices are currently being operated on in parallel by the amelioration process (e.g., maximum rate of data movement between the storage devices while reducing utilization). The trigger condition should include considering, separately and in combination, the metrics of the plurality of storage devices when determining the targeted capacity reduction and, due to the fixed maximum rate, the scheduling of the amelioration process.

The storage device notifies (604) a host (e.g., computer system 110, FIG. 1A, computer system 142, FIG. 1B, computer system 172, FIG. 1C, storage system controller 150, FIG. 1B, and/or cluster controller 180, FIG. 1C) to which the storage device is operatively coupled of the trigger condition for reducing declared capacity of the non-volatile memory of the storage device. In some embodiments, upon receipt of the notification of the trigger condition the host sends an amelioration trigger to initiate the amelioration process (606).

The storage device or a host detects the amelioration trigger and, in accordance with the detected amelioration trigger, performs an amelioration process (606) to reduce declared capacity of the non-volatile memory of the storage device. In some embodiments, the amelioration process includes a process to reduce utilization (608), a process to reduce declared capacity (610), and/or a process to advertise (612) a reduced declared capacity. As described above with respect to FIG. 2D, in some embodiments, the amelioration process (606) includes a utilization reduction process (608) (e.g., performed by utilization module 232, FIGS. 2A-1 and 2A-2, utilization module 262, FIGS. 2B-1 and 2B-2, or utilization module 292, FIGS. 2C-1 and 2C-2) and/or a declared capacity reduction process (610) (e.g., performed by capacity module 234, FIGS. 2A-1 and 2A-2, capacity module 264, FIGS. 2B-1 and 2B-2, or capacity module 294, FIGS. 2C-1 and 2C-2). In some circumstances, such as when the amount of the storage device utilized by the host is less than the reduced declared capacity, performance of the process to reduce utilization (608), or one or more portions of the process to reduce utilization, is skipped or forgone. Although FIG. 6 shows operations 608, 610, and 612 as sequential processes of the amelioration process (606), in some embodiments, these processes may be overlapped, non-sequential, and/or performed in a different order.

In some embodiments, prior to the operations described above in FIG. 6 (e.g., operations 602, 604, and/or 606), method 600 includes reducing (601) over-provisioning of the non-volatile memory of the storage device. As described above, over-provisioning refers to a quantity or percentage of total storage capacity that is in excess of the declared capacity of the storage device. In some embodiments, over-provisioning refers to the difference between the physical capacity of the storage device (e.g., the physical capacity less capacity set aside for management data structures and metadata) for storing user data (e.g., data stored in the storage system on behalf of a host or host system), and the logical capacity presented as available for a host or user. For example, in some embodiments, if a non-volatile memory of a storage device has 12 GB of total storage capacity (e.g., total storage capacity for storing user data) and 10 GB of declared capacity, then the non-volatile memory of the storage device has 2 GB of over-provisioning. Unlike declared capacity, which is the storage capacity available to a host, the extra capacity of over-provisioning is not visible to the host as available storage. Instead, over-provisioning is used to increase endurance of a storage device (e.g., by distributing the total number of writes and erases across a larger population of blocks and/or pages over time), improve performance (e.g., by providing additional buffer space for managing P/E cycles and improving the probability that a write operation will have immediate access to a pre-erased block), and reduce write amplification.

In some embodiments, reducing (601) over-provisioning includes: (1) detecting a first wear condition of non-volatile memory of a storage device of a storage system, wherein a total storage capacity of the non-volatile memory of the storage device includes declared capacity and over-provisioning, and (2) in response to detecting the first wear condition, performing a remedial action that reduces over-provisioning of the non-volatile memory of the storage device without reducing declared capacity of the non-volatile memory of the storage device. In some embodiments, performing a remedial action that reduces over-provisioning includes marking one or more blocks of the non-volatile memory as unusable. In some embodiments, performing a remedial action that reduces over-provisioning includes converting one or more MLC blocks to SLC, or more generally, changing the physical encoding format of one or more blocks of the non-volatile memory. In some embodiments, reducing over-provisioning is performed by an over-provisioning module of management module 121, system management module 151, or cluster management module 181 (e.g., in memory 206 of FIGS. 2A-1 and 2A-2, in memory 246 of FIGS. 2B-1 and 2B-2, or in memory 276 of FIGS. 2C-1 and 2C-2, respectively, but not explicitly shown). Furthermore, in some circumstances or in some embodiments, over-provisioning reducing operation 601 is performed multiple times prior to the first time operation 602 is performed. For example, over-provisioning reducing operation 601 may be repeated each of multiple times that a predefined wear condition is detected, until over-provisioning falls to or below a predefined minimum level.

In some embodiments, the first wear condition is detected in accordance with one or more metrics of the storage device (e.g., including one or more status metrics corresponding to the storage device's ability to retain data, one or more performance metrics corresponding to performance of the storage device, one or more wear metrics corresponding to wear on the storage device, and/or one or more time metrics), as described above with respect to operation 602. In some embodiments, the first wear condition is detected in accordance with a determination that the one or more metrics of the storage device satisfy a first criterion and over-provisioning of the non-volatile memory of the storage device is greater than a predefined threshold (e.g., 2 percent of the declared capacity, at least 100 blocks, or 40 blocks+n % of declared capacity, etc.).

In some embodiments, detecting the trigger condition (as described above with respect to operation 602) comprises detecting a second wear condition distinct from the first wear condition. For example, in some embodiments, the trigger condition (or the second wear condition) is detected in accordance with a determination that the one or more metrics of the storage device satisfy a second criterion (e.g., the first criterion used for the first wear condition or another criterion) and over-provisioning of the non-volatile memory of the storage device is less than or equal to (e.g., not greater than) a predefined threshold (e.g., 2 percent of the declared capacity, at least 100 blocks, or 40 blocks+n % of declared capacity, etc.).

FIGS. 7A-7D illustrate a flowchart representation of a method 700 of managing a storage system, in accordance with some embodiments. At least in some embodiments, method 700 is performed by a storage device (e.g., storage device 120, FIG. 1A, storage device 160, FIG. 1B, or storage device 194, FIG. 1C) or one or more components of the storage device (e.g., storage controller 124, FIG. 1A), wherein the storage device is operatively coupled with a host system (e.g., computer system 110, FIG. 1A, computer system 142, FIG. 1B, computer system 172, FIG. 1C, storage system controller 150, FIG. 1B, or cluster controller 180, FIG. 1C). In some embodiments, method 700 is governed by instructions that are stored in a non-transitory computer readable storage medium and that are executed by one or more processors of a device, such as the one or more processing units (CPUs) 122-1 of management module 121-1, shown in FIGS. 1A and 2A-1. In some embodiments, method 700 is performed by a storage system (e.g., data storage system 100, FIG. 1A, data storage system 140, FIG. 1B, and/or data storage system 170, FIG. 1C) or one or more components of the storage system (e.g., storage device 120, FIG. 1A, storage device 160, FIG. 1B, or storage device 194, FIG. 1C). In some embodiments, some of the operations of method 700 are performed at a storage device (e.g., storage device 120, FIG. 1A, storage device 160, FIG. 1B, or storage device 194, FIG. 1C) and information is transmitted to a host (e.g., computer system 110, FIG. 1A, computer system 142, FIG. 1B, computer system 172, FIG. 1C, storage system controller 150, FIG. 1B, or cluster controller 180, FIG. 1C). For ease of explanation, the following describes method 700 as performed by a storage device (e.g., storage device 120, FIG. 1A) of a storage system (e.g., data storage system 100, FIG. 1A). However, those skilled in the art will appreciate that in other embodiments, one or more of the operations described in method 700 are performed by a storage device of another storage system (e.g., storage device 160 of data storage system 140, FIG. 1B, or storage device 194 of data storage system 170, FIG. 1C).

At a storage device of a storage system (702), the storage device (e.g., storage device 120, FIG. 1A) generates (704) one or more metrics of the storage device, the storage device including non-volatile memory. In some embodiments, a metrics module (e.g., metrics module 222-1, FIG. 2A-1) is used to generate one or more metrics of the storage device, the storage device including non-volatile memory, as described above with respect to FIG. 2A-1.

In some embodiments, the storage device comprises (712) one or more flash memory devices. In some embodiments, the storage device comprises a storage medium (e.g., storage medium 130, FIG. 1A), and the storage medium comprises one or more non-volatile storage devices, such as flash memory devices. In some embodiments, the storage medium (e.g., storage medium 130, FIG. 1A) is a single flash memory device, while in other embodiments the storage medium includes a plurality of flash memory devices. For example, in some embodiments, the storage medium includes dozens or hundreds of flash memory devices, organized in parallel memory channels, such as 16, 32 or 64 flash memory devices per memory channel, and 8, 16 or 32 parallel memory channels. In some embodiments, the non-volatile storage medium (e.g., storage medium 130, FIG. 1A) includes NAND-type flash memory or NOR-type flash memory. In other embodiments, the storage medium comprises one or more other types of non-volatile storage devices.

In some embodiments, generating (714) one or more metrics of the storage device includes generating at least one metric, of the one or more metrics, for each memory portion of a plurality of memory portions of the storage device. In some embodiments, at least one metric is generated for each block of a plurality of blocks of the storage device. In some embodiments, at least one metric is generated for each page of a plurality of pages of the storage device. In some embodiments, at least one metric is generated for each region of a plurality of regions of the storage device. In some embodiments, some metrics are generated on a block basis, some metrics are generated on a page basis, some metrics are generated on a region basis, and/or some metrics are generated on a storage device basis.

In some embodiments, the one or more metrics of the storage device include (716) one or more status metrics corresponding to the storage device's ability (e.g., ability of the storage device's storage medium or storage media) to retain data. In some embodiments, storage controller 124 (FIG. 1A) or a component thereof (e.g., metrics module 222-1, FIG. 2A-1) generates and/or maintains one or more status metrics for each memory portion of a plurality of memory portions (e.g., in storage medium 130, FIG. 1A) of the storage device. In some embodiments, the one or more status metrics indicate a respective memory portion's ability to retain data. In some embodiments, the one or more status metrics associated with a respective memory portion, of a plurality of memory portions of the storage device, are stored in a characterization vector corresponding to the respective memory portion. In some embodiments, the one or more status metrics stored in the characterization vector for the respective memory portion include a subset or superset of: (a) a bytes written field indicating a number of bytes of data written to pages in the respective memory portion, (b) a program-erase (P/E) cycle field indicating a current count of the number of P/E cycles performed on the respective memory portion, (c) a bit error rate (BER) field indicating a number of errors detected in a codeword read from pages of the respective memory portion, and (d) other usage information indicating the health, performance, and/or endurance of the respective memory portion, as it relates to the respective memory portion's ability to retain data. In some embodiments, the one or more status metrics indicate the storage device's ability, as a whole, to retain data. For example, as the storage device ages, the one or more status metrics reflect the storage device's diminished ability to retain data (e.g., data read from the storage device typically have more errors as the storage device ages).

In some embodiments, the one or more metrics of the storage device include (718) one or more performance metrics corresponding to performance of the storage device. In some embodiments, storage controller 124 (FIG. 1A) or a component thereof (e.g., metrics module 222-1, FIG. 2A-1) generates and/or maintains one or more performance metrics for each memory portion of a plurality of memory portions (e.g., in storage medium 130, FIG. 1A) of the storage device. In some embodiments, the one or more performance metrics correspond to performance of a respective memory portion of the plurality of memory portions. In some embodiments, the one or more performance metrics associated with a respective memory portion, of a plurality of memory portions of the storage device, are stored in a characterization vector corresponding to the respective memory portion. In some embodiments, the one or more performance metrics stored in the characterization vector for the respective memory portion include a subset or superset of: (a) a measure of latency, and (b) transaction time. In some embodiments, the one or more performance metrics correspond to performance of the storage device as a whole. For example, in some embodiments, the one or more performance metrics include a measure of latency for the storage device and/or transaction time for the storage device.

In some embodiments, the one or more metrics of the storage device include (720) one or more wear metrics corresponding to wear on the storage device. In some embodiments, storage controller 124 (FIG. 1A) or a component thereof (e.g., metrics module 222-1, FIG. 2A-1) generates and/or maintains one or more wear metrics for each memory portion of a plurality of memory portions (e.g., in storage medium 130, FIG. 1A) of the storage device. In some embodiments, the one or more wear metrics correspond to wear on a respective memory portion of the plurality of memory portions. In some embodiments, the one or more wear metrics associated with a respective memory portion, of a plurality of memory portions of the storage device, are stored in a characterization vector corresponding to the respective memory portion. In some embodiments, the one or more wear metrics stored in the characterization vector for the respective memory portion include a subset or superset of: (a) a count of cumulative writes to the respective memory portion, (b) a count of cumulative reads from the respective memory portion, (c) a count of P/E cycles performed on the respective memory portion, and (d) a BER for the respective memory portion. In some embodiments, the one or more wear metrics correspond to wear on the storage device as a whole. For example, in some embodiments, the one or more wear metrics include a count of cumulative writes to the storage device (e.g., to the storage device's storage medium or storage media), a count of cumulative reads from the storage device (e.g., from the storage device's storage medium or storage media), a count of P/E cycles performed on the storage device and/or a BER for the storage device.

In some embodiments, the one or more metrics of the storage device include (722) one or more time metrics. In some embodiments, storage controller 124 (FIG. 1A) or a component thereof (e.g., metrics module 222-1, FIG. 2A-1) generates and/or maintains one or more time metrics. In some embodiments, the one or more time metrics include a wall-clock time.

In some embodiments, the one or more metrics of the storage device include (724) values of the one or more metrics from more than one time. For example, in some embodiments, the one or more metrics of the storage device include a count of cumulative writes to the storage device (e.g., to the storage device's storage medium or storage media) at a first time and a count of cumulative writes to the storage device (e.g., to the storage device's storage medium or storage media) at a second time. In some embodiments, values of the one or more metrics from more than one time include historical knowledge of the one or more metrics. For example, in some embodiments, the one or more metrics from more than one time include a running average of the one or more metrics. In another example, historical knowledge can be used to determine (e.g., compute) one or more projected values of one or more metrics at a particular time in the future (e.g., an hour, day, week, or month in the future). In some embodiments, historical knowledge of the one or more metrics of the storage device is used to detect a trigger condition, as described below with respect to operation 706.

At a storage device of a storage system (702), the storage device (e.g., storage device 120, FIG. 1A) detects (706) a trigger condition in accordance with the one or more metrics of the storage device. In some embodiments, the trigger condition is detected in accordance with a non-linear and/or linear combination of the one or more metrics. In some embodiments, the trigger condition is detected in accordance with historical knowledge of the one or more metrics, as described above with respect to operation 602 of FIG. 6. In some embodiments, a trigger detection module (e.g., trigger detection module 224-1, FIG. 2A-1) is used to detect a trigger condition in accordance with the one or more metrics of the storage device, as described above with respect to FIG. 2A-1. Furthermore, in some embodiments, prior to detecting the trigger condition (706), the storage device detects a wear condition and reduces over-provisioning of the non-volatile memory of the storage device, without reducing declared capacity of the non-volatile memory of the storage device, as described above with respect to operation 601 of FIG. 6.

At a storage device of a storage system (702), the storage device (e.g., storage device 120, FIG. 1A) enables (708) an amelioration process associated with the detected trigger condition, the amelioration process to reduce declared capacity of the non-volatile memory of the storage device. In some embodiments, the amelioration process includes a process to reduce utilization by a host, a process to reduce declared capacity of the non-volatile memory of the storage device, and/or a process to advertise a reduced declared capacity. In some embodiments, the amelioration process includes altering an encoding format (e.g., from TLC to SLC and/or changing the redundancy mechanism) of at least a portion of the non-volatile memory of the storage device. In some embodiments, altering the encoding format of at least a portion of the non-volatile memory of the storage device includes setting the encoding format of an entirety of the non-volatile memory of the storage device to a low-density physical encoding format, for example SLC. For example, prior to the amelioration process the storage device includes some blocks (e.g., 98%) encoded as TLC and other blocks (e.g., 2%) encoded as SLC, and after the amelioration process all blocks are encoded using the lower-density physical encoding format, SLC. The latter example may correspond to a storage device that initially stores all client data using TLC and all storage device metadata using SLC. The amelioration process converts all of the client data from TLC to SLC without changing the encoding format of the storage device metadata (SLC). In some embodiments, an enabling module (e.g., enabling module 226-1, FIG. 2A-1) is used to enable an amelioration process associated with the detected trigger condition, the amelioration process to reduce declared capacity of the non-volatile memory of the storage device, as described above with respect to FIG. 2A-1.

In some embodiments, the amelioration process to reduce declared capacity of the non-volatile memory of the storage device includes a process to reduce utilization of the non-volatile memory of the storage device, for example as described above with respect to operation 608 of FIG. 6.

In some embodiments, enabling the amelioration process associated with the detected trigger condition includes (726) notifying a host (e.g., computer system 110, FIG. 1A, computer system 142, FIG. 1B, computer system 172, FIG. 1C, storage system controller 150, FIG. 1B, and/or cluster controller 180, FIG. 1C) to which the storage device is operatively coupled of the trigger condition. In some embodiments, notifying the host of the trigger condition includes notifying the host with an unsolicited communication. For example, in some embodiments, the unsolicited communication includes an interrupt communication. As another example, in some embodiments, the unsolicited communication includes a remote direct memory access (RDMA). As yet another example, in some embodiments, the unsolicited communication includes a TCP connection request or a TCP data transmission. In some embodiments, the unsolicited communication includes any other form of unsolicited communication.

In some embodiments, the host includes (728) a client on behalf of which data is stored in the storage system (e.g., data storage system 100, FIG. 1A; data storage system 140, FIG. 1B; data storage system 170, FIG. 1C). In some embodiments, the client is or includes an entity on behalf of which data is stored in the storage system. For example, in some embodiments, the host is (1) computer system 110 (FIG. 1A) or a client process, module or application executed by computer system 110, (2) computer system 142 (FIG. 1B) or a client process, module or application executed by computer system 142, and/or (3) computer system 172 (FIG. 1C) or a client process, module or application executed by computer system 172.

In some embodiments, the host includes (730) a storage system controller of the storage system (e.g., data storage system 140, FIG. 1B). In some embodiments, the storage system controller controls and/or coordinates operations among one or more storage devices. For example, in some embodiments, the host is storage system controller 150 (FIG. 1B). In some of these embodiments, the data storage system (e.g., data storage system 140, FIG. 1B) is called a scale-up system.

In some embodiments, the host includes (732) a cluster controller of the storage system (e.g., data storage system 170, FIG. 1C). In some embodiments, the cluster controller controls and/or coordinates operations among one or more data storage subsystems, as shown for example in FIG. 1C, where each of the data storage subsystems may be implemented as a data storage system having one or more storage devices (e.g., data storage system 140, FIG. 1B). For example, in some embodiments, the host is cluster controller 180 (FIG. 1C). In some of these embodiments, the data storage system (e.g., data storage system 170, FIG. 1C) is called a scale-out system or sometimes known as a clustered storage system.

In some embodiments, enabling the amelioration process associated with the detected trigger condition includes (734): (1) receiving a query from a host (e.g., computer system 110, FIG. 1A, computer system 142, FIG. 1B, computer system 172, FIG. 1C, storage system controller 150, FIG. 1B, and/or cluster controller 180, FIG. 1C) to which the storage device is operatively coupled, and (2) in response to receiving the query, reporting the trigger condition. For example, in some embodiments, the host polls for the trigger condition and the storage device receives the query from the host and in response to receiving the query, reports the trigger condition.

In some embodiments, enabling the amelioration process associated with the detected trigger condition includes (736): (1) receiving a command from a host (e.g., computer system 110, FIG. 1A, computer system 142, FIG. 1B, computer system 172, FIG. 1C, storage system controller 150, FIG. 1B, and/or cluster controller 180, FIG. 1C) to which the storage device is operatively coupled, and (2) in response to receiving the command, sending a response to the command and a notification of the trigger condition. In some embodiments, the command includes an I/O (input/output) request. In some embodiments, the I/O request includes a read request from the storage device and/or a write request to the storage device. In some embodiments, the command includes a request for temperature of the storage device. In some embodiments, the command includes a request for some other status of the storage device. In some embodiments, the notification of the trigger condition is piggy-backed on a response to the command from the host. For example, in some embodiments, the host issues a read request for data from the storage device, and the storage device (1) receives the read request from the host, and (2) in response to receiving the read request, the storage device sends data corresponding to the read request and a notification of the trigger condition.

In some embodiments, enabling the amelioration process associated with the detected trigger condition includes (738): (1) receiving a command from a host (e.g., computer system 110, FIG. 1A, computer system 142, FIG. 1B, computer system 172, FIG. 1C, storage system controller 150, FIG. 1B, and/or cluster controller 180, FIG. 1C) to which the storage device is operatively coupled, and (2) in response to receiving the command, sending a response to the command and a notification that prompts the host to obtain information with respect to the trigger condition. In some embodiments, the command includes an I/O (input/output) request. In some embodiments, the I/O request includes a read request from the storage device and/or a write request to the storage device. In some embodiments, the command includes a request for temperature of the storage device. In some embodiments, the command includes a request for some other status of the storage device. In some embodiments, the notification that prompts the host to obtain information with respect to the trigger condition is piggy-backed on a response to the command from the host. For example, in some embodiments, the host issues a read request for data from the storage device, and the storage device (1) receives the read request from the host, and (2) in response to receiving the read request, the storage device sends data corresponding to the read request and a notification (e.g., by setting a notification bit) that prompts the host to obtain information with respect to the trigger condition. In some embodiments, the mechanism used for returning such a notification when responding to a command from the host is a SCSI deferred error or deferred error response code.

Although a few examples of notification are described here, those skilled in the art will appreciate that the embodiments described herein may be extended to other notification methods (e.g., read-only mode notification, as described below with respect to operation 1028 of FIG. 10C).

In some embodiments, enabling the amelioration process associated with the detected trigger condition includes (740) scheduling the amelioration process to be performed on the storage device. For example, in some embodiments, the trigger condition feeds back to the storage device and the storage device enables the amelioration process by scheduling the amelioration process to be performed on the storage device. In some embodiments, however, the amelioration process is performed, at least in part, by an apparatus other than the storage device (e.g., performed at least in part by the host, or by a storage system controller or by a cluster controller of a data storage system that includes at least one storage device distinct from the storage device).

In some embodiments, enabling the amelioration process associated with the detected trigger condition includes (742) determining one or more parameters for the amelioration process. In some embodiments, the one or more parameters for the amelioration process include a level of urgency for the amelioration process, a target reduced declared capacity of the non-volatile memory of the storage device, and/or a target amount of reduction in utilization of the non-volatile memory of the storage device, or any combination or subset thereof. For example, in some embodiments or in some circumstances, the one or more parameters for the amelioration process include a parameter indicating that the urgency level is high (e.g., the amelioration process needs to begin within the next hour) and a parameter indicating that at least 1 GB of storage capacity needs to be reduced in the storage device.

In some embodiments, enabling the amelioration process associated with the detected trigger condition further includes (744) reporting at least a subset of the one or more parameters for the amelioration process. For example, in some embodiments, enabling the amelioration process associated with the detected trigger condition further includes reporting a target reduction in storage capacity of the non-volatile memory in the storage device.

In some embodiments, after enabling the amelioration process (710): the storage device (1) re-evaluates the trigger condition in accordance with the one or more metrics of the storage device, and (2) in accordance with a determination that the trigger condition is no longer valid, aborts the amelioration process to reduce declared capacity of the non-volatile memory of the storage device. For example, in some circumstances, the one or more metrics of the storage device may change such that the trigger condition is no longer valid (e.g., the amelioration process is no longer needed). For example, during the operation of the amelioration process, normal storage operations will continue to be performed (e.g., read, write, delete, trim, etc.). Normal storage operations include operations like trim that explicitly reduce the storage device utilization, possibly enough to merit aborting the amelioration process. Other storage activity such as garbage collection may also reduce utilization, possibly enough to merit aborting the amelioration process. In some embodiments, the trigger condition is (e.g., periodically, semi-continuously, irregularly, initially, finally, etc.) re-evaluated in accordance with the one or more metrics of the storage device, as the one or more metrics may change in value due to the amelioration process and/or normal storage operations (e.g., read, write, erase and trim or unmap operations). In some embodiments, a trigger detection module (e.g., trigger detection module 224-1, FIG. 2A-1) and/or an enabling module (e.g., enabling module 226-1, FIG. 2A-1) are used to, after enabling the amelioration process, (1) re-evaluate the trigger condition in accordance with the one or more metrics of the storage device, and (2) in accordance with a determination that the trigger condition is no longer valid, abort the amelioration process to reduce declared capacity of the non-volatile memory of the storage device, as described above with respect to FIG. 2A-1.

In some embodiments, any operations of method 700 described above are performed by a storage device, the storage device including (1) non-volatile memory (e.g., comprising one or more non-volatile storage devices, such as flash memory devices), (2) one or more processors, and (3) controller memory (e.g., non-volatile memory or volatile memory in or coupled to the controller) storing one or more programs, which when executed by the one or more processors cause the storage device to perform or control performance of any of the methods described herein.

In some embodiments, any operations of method 700 described above are performed by a storage device including means for performing any of the methods described herein.

In some embodiments, any operations of method 700 described above are performed by a storage system comprising (1) a storage medium (e.g., comprising one or more non-volatile storage devices, such as flash memory devices) (2) one or more processors, and (3) memory (e.g., non-volatile memory or volatile memory in the storage system) storing one or more programs, which when executed by the one or more processors cause the storage system to perform or control performance of any of the methods described herein.

FIGS. 8A-8D illustrate a flowchart representation of a method 800 of managing a storage system, in accordance with some embodiments. In some embodiments, method 800 is performed by a host (e.g., computer system 110, FIG. 1A, computer system 142, FIG. 1B, computer system 172, FIG. 1C, storage system controller 150, FIG. 1B, or cluster controller 180, FIG. 1C) or one or more components of the host (e.g., management module 121-2, FIG. 1A, system management module 151, FIG. 1B, or cluster management module 181, FIG. 1C). In some embodiments, method 800 is governed by instructions that are stored in a non-transitory computer readable storage medium and that are executed by one or more processors of a host, such as the one or more processing units (CPUs) 152-1 of system management module 151-1, shown in FIGS. 1B and 2B-1, or the one or more processing units (CPUs) 182-1 of cluster management module 181-1, shown in FIGS. 1C and 2C-1. In some embodiments, method 800 is performed by a storage system (e.g., data storage system 100, FIG. 1A, data storage system 140, FIG. 1B, or data storage system 170, FIG. 1C) or one or more components of the storage system (e.g., computer system 110, FIG. 1A, storage system controller 150, FIG. 1B, or cluster controller 180, FIG. 1C). In some embodiments, some of the operations of method 800 are performed at a host (e.g., computer system 110, FIG. 1A, computer system 142, FIG. 1B, or computer system 172, FIG. 1C) and information is transmitted to a storage device (e.g., storage device 120, FIG. 1A) and/or one or more subsystems of a storage system (e.g., storage system controller 150, FIG. 1B, or cluster controller 180, FIG. 1C). In some embodiments, method 800 is governed, at least in part, by instructions that are stored in a non-transitory computer readable storage medium and that are executed by one or more processors of a host (processors of host not shown in FIGS. 1A, 1B, and 1C).

In some embodiments, the host includes (812) a client on behalf of which data is stored in the storage system (e.g., data storage system 100, FIG. 1A; data storage system 140, FIG. 1B; data storage system 170, FIG. 1C). In some embodiments, the client is or includes an entity on behalf of which data is stored in the storage system. For example, in some embodiments, the host is computer system 110 (FIG. 1A) or a client process or application executed by computer system 110, or is a computer system 142 (FIG. 1B) or a client process or application executed by computer system 142, or computer system 172 (FIG. 1C) or a client process or application executed by computer system 172.

In some embodiments, the host includes (814) a storage system controller of the storage system (e.g., data storage system 140, FIG. 1B). In some embodiments, the storage system controller controls and/or coordinates operations among one or more storage devices. For example, in some embodiments, the host is storage system controller 150 (FIG. 1B). In some of these embodiments, the data storage system (e.g., data storage system 140, FIG. 1B) is called a scale-up system.

In some embodiments, the host includes (816) a cluster controller of the storage system (e.g., data storage system 170, FIG. 1C). In some embodiments, the cluster controller controls and/or coordinates operations among one or more data storage subsystems, as shown for example in FIG. 1C, where each of the data storage subsystems may be implemented as a data storage system having one or more storage devices (e.g., data storage system 140, FIG. 1B). For example, in some embodiments, the host is cluster controller 180 (FIG. 1C). In some of these embodiments, the data storage system (e.g., data storage system 170, FIG. 1C) is called a scale-out system or a clustered storage system.

At a host to which a storage device of the storage system is operatively coupled (802), the host obtains (804) one or more metrics of the storage device (e.g., storage device 120, FIG. 1A, a particular storage device 160, FIG. 1B, or a particular storage device 194, FIG. 1C), the storage device including non-volatile memory. In some embodiments, the storage device generates and/or maintains the one or more metrics of the storage device, and the host obtains the one or more metrics from the storage device. In some embodiments, one or more subsystems of a storage system distinct from the storage device (e.g., storage system controller 150, FIG. 1B, or cluster controller 180, FIG. 1C) generate and/or maintain the one or more metrics of the storage device, and the host obtains the one or more metrics from the one or more subsystems. In some embodiments, the host generates and/or maintains the one or more metrics of the storage device. In some embodiments, a metrics module (e.g., metrics module 222-2, FIG. 2A-2) is used to obtain one or more metrics of the storage device, the storage device including non-volatile memory, as described above with respect to FIG. 2A-2.

In some embodiments, the storage device comprises (818) one or more flash memory devices. In some embodiments, the storage device comprises a storage medium (e.g., storage medium 130, FIG. 1A), and the storage medium comprises one or more non-volatile storage devices, such as flash memory devices. In some embodiments, the storage medium (e.g., storage medium 130, FIG. 1A) is a single flash memory device, while in other embodiments the storage medium includes a plurality of flash memory devices. For example, in some embodiments, the storage medium includes dozens or hundreds of flash memory devices, organized in parallel memory channels, such as 16, 32 or 64 flash memory devices per memory channel, and 8, 16 or 32 parallel memory channels. In some embodiments, the non-volatile storage medium (e.g., storage medium 130, FIG. 1A) includes NAND-type flash memory or NOR-type flash memory. In other embodiments, the storage medium comprises one or more other types of non-volatile storage devices.

In some embodiments, obtaining (804) one or more metrics of the storage device includes obtaining (820) at least one metric, of the one or more metrics, for each memory portion (e.g., block, page, region, etc.) of a plurality of memory portions of the storage device. In some embodiments, at least one metric is generated for each block of a plurality of blocks of the storage device. In some embodiments, at least one metric is generated for each page of a plurality of pages of the storage device. In some embodiments, at least one metric is generated for each region of a plurality of regions of the storage device. In some embodiments, some metrics are generated on a block basis, some metrics are generated on a page basis, some metrics are generated on a region basis, and/or some metrics are generated on a storage device basis.

In some embodiments, the one or more metrics of the storage device include (822) one or more status metrics corresponding to the storage device's ability to retain data. In some embodiments, the host or a component thereof (e.g., metrics module 222-2, FIG. 2A-2) generates and/or maintains one or more status metrics for each memory portion of a plurality of memory portions (e.g., in storage medium 130, FIG. 1A) of the storage device. In some embodiments, the one or more status metrics indicate a respective memory portion's ability to retain data. In some embodiments, the one or more status metrics associated with a respective memory portion, of a plurality of memory portions of the storage device, are stored in a characterization vector corresponding to the respective memory portion. In some embodiments, the one or more status metrics stored in the characterization vector for the respective memory portion include a subset or superset of: (a) a bytes written field indicating a number of bytes of data written to pages in the respective memory portion, (b) a program-erase (P/E) cycle field indicating a current count of the number of P/E cycles performed on the respective memory portion, (c) a bit error rate (BER) field indicating a number of errors included in a codeword read from pages of the respective memory portion, and (d) other usage information indicating the health, performance, and/or endurance of the respective memory portion, as it relates to the respective memory portion's ability to retain data. In some embodiments, the one or more status metrics indicate the storage device's ability, as a whole, to retain data. For example, as the storage device ages, the one or more status metrics reflect the storage device's diminished ability to retain data (e.g., data read from the storage device includes more errors as the storage device ages).

In some embodiments, the one or more metrics of the storage device include (824) one or more performance metrics corresponding to performance of the storage device. In some embodiments, the host or a component thereof (e.g., metrics module 222-2, FIG. 2A-2) generates and/or maintains one or more performance metrics for each memory portion of a plurality of memory portions (e.g., in storage medium 130, FIG. 1A) of the storage device. In some embodiments, the one or more performance metrics correspond to performance of a respective memory portion of the plurality of memory portions. In some embodiments, the one or more performance metrics associated with a respective memory portion, of a plurality of memory portions of the storage device, are stored in a characterization vector corresponding to the respective memory portion. In some embodiments, the one or more performance metrics stored in the characterization vector for the respective memory portion include a subset or superset of: (a) a measure of latency, and (b) transaction time. In some embodiments, the one or more performance metrics correspond to performance of the storage device as a whole. For example, in some embodiments, the one or more performance metrics include a measure of latency for the storage device and/or transaction time for the storage device.

In some embodiments, the one or more metrics of the storage device include (826) one or more wear metrics corresponding to wear on the storage device. In some embodiments, the host or a component thereof (e.g., metrics module 222-2, FIG. 2A-2) generates and/or maintains one or more wear metrics for each memory portion of a plurality of memory portions (e.g., in storage medium 130, FIG. 1A) of the storage device. In some embodiments, the one or more wear metrics correspond to wear on a respective memory portion of the plurality of memory portions. In some embodiments, the one or more wear metrics associated with a respective memory portion, of a plurality of memory portions of the storage device, are stored in a characterization vector corresponding to the respective memory portion. In some embodiments, the one or more wear metrics stored in the characterization vector for the respective memory portion include a subset or superset of: (a) a count of cumulative writes to the respective memory portion, (b) a count of cumulative reads from the respective memory portion, (c) a count of P/E cycles performed on the respective memory portion, and (d) a BER for the respective memory portion. In some embodiments, the one or more wear metrics correspond to wear on the storage device as a whole. For example, in some embodiments, the one or more wear metrics include a count of cumulative writes to the storage device, a count of cumulative reads from the storage device, a count of P/E cycles performed on the storage device and/or a BER for the storage device.

In some embodiments, the one or more metrics of the storage device include (828) one or more time metrics. In some embodiments, the host or a component thereof (e.g., metrics module 222-2, FIG. 2A-2) generates and/or maintains one or more time metrics. In some embodiments, the one or more time metrics include a wall-clock time.

In some embodiments, the one or more metrics of the storage device include (830) values of the one or more metrics from more than one time. For example, in some embodiments, the one or more metrics of the storage device include a count of cumulative writes to the storage device at a first time and a count of cumulative writes to the storage device at a second time. In some embodiments, values of the one or more metrics from more than one time include historical knowledge of the one or more metrics. For example, in some embodiments, the one or more metrics from more than one time include a running average of the one or more metrics. In another example, historical knowledge can be used to determine (e.g., compute) one or more projected values of one or more metrics at a particular time in the future (e.g., an hour, day, week, or month in the future). In some embodiments, historical knowledge of the one or more metrics of the storage device is used to detect a trigger condition, as described below with respect to operation 806.

At a host to which a storage device of the storage system is operatively coupled (802), the host detects (806) a trigger condition in accordance with the one or more metrics of the storage device. In some embodiments, the trigger condition is detected in accordance with a non-linear and/or linear combination of the one or more metrics. In some embodiments, the trigger condition is detected in accordance with historical knowledge of the one or more metrics. In some embodiments, a trigger detection module (e.g., trigger detection module 224-2, FIG. 2A-2) is used to detect a trigger condition in accordance with the one or more metrics of the storage device, as described above with respect to FIG. 2A-2. Furthermore, in some embodiments, prior to detecting the trigger condition (806), the host detects a wear condition and reduces over-provisioning of the non-volatile memory of the storage device, without reducing declared capacity of the non-volatile memory of the storage device, as described above with respect to operation 601 of FIG. 6.

At a host to which a storage device of the storage system is operatively coupled (802), the host enables (808) an amelioration process associated with the detected trigger condition, the amelioration process to reduce declared capacity of the non-volatile memory of the storage device. In some embodiments, the amelioration process includes a process to reduce utilization by a host, a process to reduce declared capacity of the non-volatile memory of the storage device, and/or a process to advertise a reduced declared capacity. In some embodiments, the amelioration process includes altering an encoding format (e.g., from TLC to SLC and/or changing the redundancy mechanism) of at least a portion of the non-volatile memory of the storage device. In some embodiments, altering the encoding format of at least a portion of the non-volatile memory of the storage device includes setting the encoding format of an entirety of the non-volatile memory of the storage device to a low-density physical encoding format, for example SLC. For example, prior to the amelioration process the storage device includes some blocks (e.g., 98%) encoded as TLC and other blocks (e.g., 2%) encoded as SLC, and after the amelioration process all blocks are encoded using the lower-density physical encoding format, SLC. The latter example may correspond to a storage device that initially stores all client data using TLC and all storage device metadata using SLC. The amelioration process converts all of the client data from TLC to SLC without changing the encoding format of the storage device metadata (SLC). In some embodiments, an enabling module (e.g., enabling module 226-2, FIG. 2A-2) is used to enable an amelioration process associated with the detected trigger condition, the amelioration process to reduce declared capacity of the non-volatile memory of the storage device, as described above with respect to FIG. 2A-2.

In some embodiments, the amelioration process to reduce declared capacity of the non-volatile memory of the storage device includes a process to reduce utilization of the non-volatile memory of the storage device, for example as described above with respect to operation 608 of FIG. 6.

In some embodiments, enabling (808) the amelioration process associated with the detected trigger condition includes scheduling (832) the amelioration process to be performed on the storage device. For example, in some embodiments, the trigger condition feeds back to the host and the host enables the amelioration process by scheduling the amelioration process to be performed on the storage device.

In some embodiments, enabling (808) the amelioration process associated with the detected trigger condition includes determining (834) one or more parameters for the amelioration process. In some embodiments, the one or more parameters for the amelioration process include a level of urgency for the amelioration process, a target reduced declared capacity of the non-volatile memory of the storage device, and/or a target amount of reduction in utilization of the non-volatile memory of the storage device, or any combination or subset thereof. For example, in some embodiments, the one or more parameters for the amelioration process include a parameter indicating that the urgency level is high (e.g., the amelioration process needs to begin within the next hour) and a parameter indicating that at least 1 GB of storage capacity needs to be reduced in the storage device.

In some embodiments, enabling (808) the amelioration process associated with the detected trigger condition further includes conveying (836) at least a subset of the one or more parameters for the amelioration process to the storage device. For example, in some embodiments, enabling the amelioration process associated with the detected trigger condition further includes conveying to the storage device a target amount of storage capacity of the non-volatile memory that needs to be reduced in the storage device. As another example, in some embodiments, enabling the amelioration process associated with the detected trigger condition further includes conveying to the storage device which portions of the storage medium (e.g., storage medium 130, FIG. 1A) to reformat by altering an encoding format.

In some embodiments, after enabling the amelioration process (810): the host re-evaluates the trigger condition in accordance with the one or more metrics of the storage device, and (2) in accordance with a determination that the trigger condition is no longer valid, aborts the amelioration process to reduce declared capacity of the non-volatile memory of the storage device. For example, in some circumstances, the one or more metrics of the storage device may change such that the trigger condition is no longer valid (e.g., the amelioration process is no longer needed). For example, during the operation of an amelioration process (e.g., operation 606, FIG. 6), normal storage operations will continue to be performed (e.g., read, write, delete, trim, etc.). Normal storage operations include operations like trim that explicitly reduce the storage device utilization, possibly enough to merit aborting the amelioration process. Other storage activity such as garbage collection may also reduce utilization, possibly enough to merit aborting the amelioration process. In some embodiments, the trigger condition is (e.g., periodically, semi-continuously, irregularly, initially, finally, etc.) re-evaluated in accordance with the one or more metrics of the storage device, as the one or more metrics may change in value due to the amelioration process and/or normal storage operations (e.g., read, write, erase and trim or unmap operations). In some embodiments, a trigger detection module (e.g., trigger detection module 224-2, FIG. 2A-2) and/or an enabling module (e.g., enabling module 226-2, FIG. 2A-2) are used to, after enabling the amelioration process, (1) re-evaluate the trigger condition in accordance with the one or more metrics of the storage device, and (2) in accordance with a determination that the trigger condition is no longer valid, abort the amelioration process to reduce declared capacity of the non-volatile memory of the storage device, as described above with respect to FIG. 2A-2.

In some embodiments, any of the methods described above are performed by a storage system, the storage system including (1) one or more storage devices (e.g., comprising one or more non-volatile storage devices, such as flash memory devices), (2) a host to which the one or more storage devices are operatively coupled, (3) one or more processors, and (4) controller memory storing one or more programs, which when executed by the one or more processors cause the host to perform or control performance of any of the methods described herein.

In some embodiments, any of the methods described above are performed by a host system, coupled to one or more storage devices, the host system including means for performing any of the methods described herein.

In some embodiments, any operations of method 800 described above are performed by a host system comprising (1) an interface for operatively coupling to a storage system, (2) one or more processors, and (3) controller memory storing one or more programs, which when executed by the one or more processors cause the host system to perform or control performance of any of the methods described herein.

FIGS. 9A-9D illustrate a flowchart representation of a method 900 of managing a storage system, in accordance with some embodiments. At least in some embodiments, method 900 is performed by a storage system (e.g., data storage system 100, FIG. 1A, data storage system 140, FIG. 1B, or data storage system 170, FIG. 1C) or one or more components of the storage system (e.g., computer system 110, FIG. 1A, storage system controller 150, FIG. 1B, or cluster controller 180, FIG. 1C). In some embodiments, method 900 is governed by instructions that are stored in a non-transitory computer readable storage medium and that are executed by one or more processors of a storage system, such as the one or more processing units (CPUs) 152-1 of system management module 151-1, shown in FIGS. 1B and 2B-1, the one or more processing units (CPUs) 182-1 of cluster management module 181-1, shown in FIGS. 1C and 2C-1, or one or more processors of an included host (e.g., computer system 110, FIG. 1A), shown in FIG. 2A-2. For ease of explanation, the following describes method 900 as performed by a storage system (e.g., data storage system 100, FIG. 1A, data storage system 140, FIG. 1B, or data storage system 170, FIG. 1C). However, those skilled in the art will appreciate that in other embodiments, one or more of the operations described in method 900 are performed by one or more subsystems of the storage system distinct from the storage device (e.g., storage system controller 150, FIG. 1B or cluster controller 180, FIG. 1C).

A storage system (e.g., data storage system 100, FIG. 1A, data storage system 140, FIG. 1B, or data storage system 170, FIG. 1C) obtains, (902) for each storage device (e.g., storage device 120, FIG. 1A, or any of storage devices 160-1 to 160-m of FIG. 1B, or any of storage devices 194-1 to 194-n or 194-j to 194-k of FIG. 1C) of a plurality of storage devices of the storage system, one or more metrics of the storage device, the storage device including non-volatile memory. Although FIG. 1A only shows one storage device 120, in some embodiments, data storage system 100 of FIG. 1A includes a plurality of storage devices, of which storage device 120 is one example. In some embodiments, the storage device generates and/or maintains the one or more metrics of the storage device, and the storage system obtains the one or more metrics from the storage device. In some embodiments, one or more subsystems of a storage system distinct from the storage device (e.g., storage system controller 150, FIG. 1B, or cluster controller 180, FIG. 1C) generate and/or maintain the one or more metrics of the storage device, and the storage system obtains the one or more metrics from the one or more subsystems. In some embodiments, a metrics module (e.g., metrics module 222, FIGS. 2A-1 and 2A-2; metrics module 252-1, FIG. 2B-1; or metrics module 282-1, FIG. 2C-1) is used to obtain, for each storage device of a plurality of storage devices of the storage system, one or more metrics of the storage device, the storage device including non-volatile memory, as described above with respect to FIGS. 2A-1, 2A-2, 2B-1, and 2C-1.

In some embodiments, obtaining (902) one or more metrics of a respective storage device (e.g., storage device 120 of FIG. 1A, a respective storage device 160 of FIG. 1B, or a respective storage device 194 of FIG. 1C) of the plurality of storage devices of the storage system includes obtaining (912) at least one metric, of the one or more metrics, for each memory portion of a plurality of memory portions of the respective storage device. In some embodiments, at least one metric is generated for each block of a plurality of blocks of the respective storage device. In some embodiments, at least one metric is generated for each page of a plurality of pages of the respective storage device. In some embodiments, at least one metric is generated for each region of a plurality of regions of the respective storage device. In some embodiments, some metrics are generated on a block basis, some metrics are generated on a page basis, some metrics are generated on a region basis, and/or some metrics are generated on a storage device basis.

In some embodiments, the one or more metrics of the respective storage device include (914) one or more status metrics corresponding to the respective storage device's ability to retain data. In some embodiments, the storage system or a component thereof (e.g., metrics module 222-1, FIG. 2A-1, of the respective storage device; metrics module 252-1, FIG. 2B-1, of storage system controller 150; or metrics module 282-1, FIG. 2C-1, of cluster controller 180) generates and/or maintains one or more status metrics for each memory portion of a plurality of memory portions (e.g., in storage medium 130, FIG. 1A) of the respective storage device. In some embodiments, the one or more status metrics indicate a respective memory portion's ability to retain data. In some embodiments, the one or more status metrics associated with a respective memory portion, of a plurality of memory portions of the respective storage device, are stored in a characterization vector corresponding to the respective memory portion. In some embodiments, the one or more status metrics stored in the characterization vector for the respective memory portion include a subset or superset of: (a) a bytes written field indicating a number of bytes of data written to pages in the respective memory portion, (b) a program-erase (P/E) cycle field indicating a current count of the number of P/E cycles performed on the respective memory portion, (c) a bit error rate (BER) field indicating a number of errors included in a codeword read from pages of the respective memory portion, and (d) other usage information indicating the health, performance, and/or endurance of the respective memory portion, as it relates to the respective memory portion's ability to retain data. In some embodiments, the one or more status metrics indicate the respective storage device's ability, as a whole, to retain data. For example, as the respective storage device ages, the one or more status metrics reflect the respective storage device's diminished ability to retain data (e.g., data read from the respective storage device includes more errors as the respective storage device ages).

In some embodiments, the one or more metrics of the respective storage device include (916) one or more performance metrics corresponding to performance of the respective storage device. In some embodiments, the storage system or a component thereof (e.g., metrics module 222-1, FIG. 2A-1, of the respective storage device; metrics module 252-1, FIG. 2B-1, of storage system controller 150; or metrics module 282-1, FIG. 2C-1, of cluster controller 180) generates and/or maintains one or more performance metrics for each memory portion of a plurality of memory portions (e.g., in storage medium 130, FIG. 1A) of the respective storage device. In some embodiments, the one or more performance metrics correspond to performance of a respective memory portion of the plurality of memory portions. In some embodiments, the one or more performance metrics associated with a respective memory portion, of a plurality of memory portions of the respective storage device, are stored in a characterization vector corresponding to the respective memory portion. In some embodiments, the one or more performance metrics stored in the characterization vector for the respective memory portion include a subset or superset of: (a) a measure of latency, and (b) transaction time. In some embodiments, the one or more performance metrics correspond to performance of the respective storage device as a whole. For example, in some embodiments, the one or more performance metrics include a measure of latency for the respective storage device and/or transaction time for the respective storage device.

In some embodiments, the one or more metrics of the respective storage device include (918) one or more wear metrics corresponding to wear on the respective storage device. In some embodiments, the storage system or a component thereof (e.g., metrics module 222-1, FIG. 2A-1, of the respective storage device; metrics module 252-1, FIG. 2B-1, of storage system controller 150; or metrics module 282-1, FIG. 2C-1, of cluster controller 180) generates and/or maintains one or more wear metrics for each memory portion of a plurality of memory portions (e.g., in storage medium 130, FIG. 1A) of the respective storage device. In some embodiments, the one or more wear metrics correspond to wear on a respective memory portion of the plurality of memory portions. In some embodiments, the one or more wear metrics associated with a respective memory portion, of a plurality of memory portions of the respective storage device, are stored in a characterization vector corresponding to the respective memory portion. In some embodiments, the one or more wear metrics stored in the characterization vector for the respective memory portion include a subset or superset of: (a) a count of cumulative writes to the respective memory portion, (b) a count of cumulative reads from the respective memory portion, (c) a count of P/E cycles performed on the respective memory portion, and (d) a BER for the respective memory portion. In some embodiments, the one or more wear metrics correspond to wear on the respective storage device as a whole. For example, in some embodiments, the one or more wear metrics include a count of cumulative writes to the respective storage device, a count of cumulative reads from the respective storage device, a count of P/E cycles performed on the respective storage device and/or a BER for the respective storage device.

In some embodiments, the one or more metrics of the respective storage device include (920) one or more time metrics. In some embodiments, the storage system or a component thereof (e.g., metrics module 222-1, FIG. 2A-1, of the respective storage device; metrics module 252-1, FIG. 2B-1, of storage system controller 150; or metrics module 282-1, FIG. 2C-1, of cluster controller 180) generates and/or maintains one or more time metrics. In some embodiments, the one or more time metrics include a wall-clock time.

In some embodiments, the one or more metrics of the respective storage device include (922) values of the one or more metrics from more than one time. For example, in some embodiments, the one or more metrics of the respective storage device include a count of cumulative writes to the respective storage device at a first time and a count of cumulative writes to the respective storage device at a second time. In some embodiments, values of the one or more metrics from more than one time include historical knowledge of the one or more metrics. For example, in some embodiments, the one or more metrics from more than one time include a running average of the one or more metrics. In another example, historical knowledge can be used to determine (e.g., compute) one or more projected values of one or more metrics at a particular time in the future (e.g., an hour, day, week, or month in the future). In some embodiments, historical knowledge of the one or more metrics of the respective storage device is used to detect a trigger condition, as described below with respect to operation 904.

The storage system detects (904) a trigger condition for reducing declared capacity of the non-volatile memory of a respective storage device of the plurality of storage devices of the storage system, the trigger condition detected in accordance with the one or more metrics of one or more storage devices of the plurality of storage devices. Alternatively, in some embodiments, the trigger condition detected in accordance with the one or more metrics of one or more storage devices of the plurality of storage devices is a trigger condition for reducing declared capacity of the non-volatile memory of a subset (e.g., one or more, including all) of the one or more storage devices, and the associated amelioration process described below with respect to operation 908 is an amelioration process to reduce declared capacity of the non-volatile memory of a subset (e.g., one or more, including all) of the one or more storage devices. In some embodiments, the trigger condition is detected in accordance with a non-linear and/or linear combination of the one or more metrics. In some embodiments, the trigger condition is detected in accordance with historical knowledge of the one or more metrics. In some embodiments, a trigger detection module (e.g., trigger detection module 224, FIGS. 2A-1 and 2A-2; trigger detection module 254-1, FIG. 2B-1; or trigger detection module 284-1, FIG. 2C-1) is used to detect a trigger condition for reducing declared capacity of the non-volatile memory of a respective storage device of the plurality of storage devices of the storage system, the trigger condition detected in accordance with the one or more metrics of one or more storage devices of the plurality of storage devices, as described above with respect to FIGS. 2A-1, 2A-2, 2B-1, and 2C-1. Examples of trigger conditions are discussed above with reference to FIG. 6. Furthermore, in some embodiments, prior to detecting the trigger condition (904), the storage system detects a wear condition and reduces over-provisioning of the non-volatile memory of the respective storage device, without reducing declared capacity of the non-volatile memory of the respective storage device, as described above with respect to operation 601 of FIG. 6.

In some embodiments, one or more metrics from the plurality of storage devices of the storage system are combined to detect the trigger condition. For example, it may be advantageous to examine the rate of change of historical wear metrics such as P/E cycle counts in the plurality of storage devices in order to allow the amelioration process sufficient time to complete before any one device reaches a wear limit.

In some embodiments, the respective storage device comprises (906) one or more flash memory devices. In some embodiments, the respective storage device comprises a storage medium (e.g., storage medium 130, FIG. 1A), and the storage medium comprises one or more non-volatile storage devices, such as flash memory devices. In some embodiments, the storage medium (e.g., storage medium 130, FIG. 1A) is a single flash memory device, while in other embodiments the storage medium includes a plurality of flash memory devices. For example, in some embodiments, the storage medium includes dozens or hundreds of flash memory devices, organized in parallel memory channels, such as 16, 32 or 64 flash memory devices per memory channel, and 8, 16 or 32 parallel memory channels. In some embodiments, the non-volatile storage medium (e.g., storage medium 130, FIG. 1A) includes NAND-type flash memory or NOR-type flash memory. In other embodiments, the storage medium comprises one or more other types of non-volatile storage devices.

The storage system enables (908) an amelioration process associated with the detected trigger condition, the amelioration process to reduce declared capacity of the non-volatile memory of the respective storage device. In some embodiments, the amelioration process includes altering an encoding format (e.g., from TLC to SLC and/or changing the redundancy mechanism) of at least a portion of the non-volatile memory of the respective storage device. In some embodiments, altering the encoding format of at least a portion of the non-volatile memory of the storage device includes setting the encoding format of an entirety of the non-volatile memory of the storage device to a low-density physical encoding format, for example SLC. For example, prior to the amelioration process the storage device includes some blocks (e.g., 98%) encoded as TLC and other blocks (e.g., 2%) encoded as SLC, and after the amelioration process all blocks are encoded using the lower-density physical encoding format, SLC. The latter example may correspond to a storage device that initially stores all client data using TLC and all storage device metadata using SLC. The amelioration process converts all of the client data from TLC to SLC without changing the encoding format of the storage device metadata (SLC).

In some embodiments, the amelioration process includes a process to reduce utilization by a host, a process to reduce declared capacity of the non-volatile memory of the respective storage device, and/or a process to advertise a reduced declared capacity. In some embodiments, an enabling module (e.g., enabling module 226, FIGS. 2A-1 and 2A-2; enabling module 256-1, FIG. 2B-1; or enabling module 286-1, FIG. 2C-1) is used to enable an amelioration process associated with the detected trigger condition, the amelioration process to reduce declared capacity of the non-volatile memory of the respective storage device, as described above with respect to FIGS. 2A-1, 2A-2, 2B-1, and 2C-1.

In some embodiments, enabling the amelioration process associated with the detected trigger condition includes (924) notifying a host (e.g., computer system 110, FIG. 1A, computer system 142, FIG. 1B, computer system 172, FIG. 1C, storage system controller 150, FIG. 1B, and/or cluster controller 180, FIG. 1C) to which the respective storage device is operatively coupled of the trigger condition. In some embodiments, notifying the host of the trigger condition includes notifying the host with an unsolicited communication. For example, in some embodiments, the unsolicited communication includes an interrupt communication.

In some embodiments, the host includes (926) a client on behalf of which data is stored in the storage system (e.g., data storage system 100, FIG. 1A; data storage system 140, FIG. 1B; data storage system 170, FIG. 1C). In some embodiments, the client is or includes an entity on behalf of which data is stored in the storage system. For example, in some embodiments, the host is (1) computer system 110 (FIG. 1A) or a client process, module or application executed by computer system 110, (2) computer system 142 (FIG. 1B) or a client process or application executed by computer system 142, and/or (3) computer system 172 (FIG. 1C) or (4) a client process, module or application executed by computer system 172.

In some embodiments, the host includes (928) a storage system controller of the storage system (e.g., data storage system 140, FIG. 1B). In some embodiments, the storage system controller controls and/or coordinates operations among one or more storage devices. For example, in some embodiments, the host is storage system controller 150

(FIG. 1B). In some of these embodiments, the data storage system (e.g., data storage system 140, FIG. 1B) is called a scale-up system.

In some embodiments, the host includes (930) a cluster controller of the storage system (e.g., data storage system 170, FIG. 1C). In some embodiments, the cluster controller controls and/or coordinates operations among one or more data storage subsystems, as shown for example in FIG. 1C, where each of the data storage subsystems may be implemented as a data storage system having one or more storage devices (e.g., data storage system 140, FIG. 1B). For example, in some embodiments, the host is cluster controller 180 (FIG. 1C). In some of these embodiments, the data storage system (e.g., data storage system 170, FIG. 1C) is called a scale-out system.

In some embodiments, enabling the amelioration process associated with the detected trigger condition includes (932): (1) receiving a query from a host (e.g., computer system 110, FIG. 1A, computer system 142, FIG. 1B, computer system 172, FIG. 1C, storage system controller 150, FIG. 1B, and/or cluster controller 180, FIG. 1C) to which the respective storage device is operatively coupled, and (2) in response to receiving the query, reporting the trigger condition. For example, in some embodiments, computer system 142 (FIG. 1B) polls for the trigger condition and storage system controller 150 (FIG. 1B) receives the query from computer system 142 and in response to receiving the query, reports the trigger condition. As another example, in some embodiments, computer system 172 (FIG. 1C) polls for the trigger condition and cluster controller 150 (FIG. 1C) receives the query from computer system 172 and in response to receiving the query, reports the trigger condition. As yet another example, in some embodiments, the host polls for the trigger condition and the respective storage device receives the query from the host and in response to receiving the query, reports the trigger condition.

In some embodiments, enabling the amelioration process associated with the detected trigger condition includes (934): (1) receiving a command from a host (e.g., computer system 110, FIG. 1A, computer system 142, FIG. 1B, computer system 172, FIG. 1C, storage system controller 150, FIG. 1B, and/or cluster controller 180, FIG. 1C) to which the respective storage device is operatively coupled, and (2) in response to receiving the command, sending a response to the command and a notification of the trigger condition. In some embodiments, the command includes an I/O (input/output) request. In some embodiments, the I/O request includes a read request from the respective storage device and/or a write request to the respective storage device. In some embodiments, the command includes a request for temperature of the respective storage device. In some embodiments, the command includes a request for some other status of the respective storage device. In some embodiments, the notification of the trigger condition is piggy-backed on a response to the command from the host. For example, in some embodiments, the host issues a read request for data from the respective storage device, and the respective storage device (1) receives the read request from the host, and (2) in response to receiving the read request, the respective storage device sends data corresponding to the read request and a notification of the trigger condition. As another example, in some embodiments, the host (e.g., computer system 142, FIG. 1B; or computer system 172, FIG. 1C) issues a read request for data, and the storage system or one or more components of the storage system (e.g., storage system controller 150, FIG. 1B; or cluster controller 180, FIG. 1C) (1) receives the read request from the host, and (2) in response to receiving the read request, the storage system or one or more components of the storage system sends data corresponding to the read request and a notification of the trigger condition.

In some embodiments, enabling the amelioration process associated with the detected trigger condition includes (936): (1) receiving a command from a host (e.g., computer system 110, FIG. 1A, computer system 142, FIG. 1B, computer system 172, FIG. 1C, storage system controller 150, FIG. 1B, and/or cluster controller 180, FIG. 1C) to which the respective storage device is operatively coupled, and (2) in response to receiving the command, sending a response to the command and a notification that prompts the host to obtain information with respect to the trigger condition. In some embodiments, the command includes an I/O (input/output) request. In some embodiments, the I/O request includes a read request from the respective storage device and/or a write request to the respective storage device. In some embodiments, the command includes a request for temperature of the respective storage device. In some embodiments, the command includes a request for some other status of the respective storage device. In some embodiments, the notification that prompts the host to obtain information with respect to the trigger condition is piggy-backed on a response to the command from the host. For example, in some embodiments, the host issues a read request for data from the respective storage device, and the respective storage device (1) receives the read request from the host, and (2) in response to receiving the read request, the respective storage device sends data corresponding to the read request and a notification (e.g., by setting a notification bit) that prompts the host to obtain information with respect to the trigger condition. As another example, in some embodiments, the host (e.g., computer system 142, FIG. 1B; or computer system 172, FIG. 1C) issues a read request for data, and the storage system or one or more components of the storage system (e.g., storage system controller 150, FIG. 1B; or cluster controller 180, FIG. 1C) (1) receives the read request from the host, and (2) in response to receiving the read request, the respective storage device sends data corresponding to the read request and a notification (e.g., by setting a notification bit) that prompts the host to obtain information with respect to the trigger condition. In some embodiments, the mechanism used for returning such a notification when responding to a command from the host is a SCSI deferred error or deferred error response code.

Although a few examples of notification are described here, those skilled in the art will appreciate that the embodiments described herein may be extended to other notification methods, such as notification methods described herein with reference to method 1000.

In some embodiments, enabling the amelioration process associated with the detected trigger condition includes (938) scheduling the amelioration process to be performed on the respective storage device. For example, in some embodiments, the trigger condition feeds back to storage system controller 150 (FIG. 1B) and storage system controller 150 enables the amelioration process by scheduling the amelioration process to be performed on the respective storage device. As another example, in some embodiments, the trigger condition feeds back to cluster controller 180 (FIG. 1C) and cluster controller 180 enables the amelioration process by scheduling the amelioration process to be performed on the respective storage device.

In some embodiments, enabling the amelioration process associated with the detected trigger condition includes (940) determining one or more parameters for the amelioration process. In some embodiments, the one or more parameters for the amelioration process include a level of urgency for the amelioration process and a targeted amount of storage capacity of the non-volatile memory that needs to be reduced in the respective storage device. For example, in some embodiments, the one or more parameters for the amelioration process include a parameter indicating that the urgency level is high (e.g., the amelioration process needs to begin within the next hour) and a parameter indicating that 1 GB of storage capacity needs to be reduced in the respective storage device.

In some embodiments, enabling the amelioration process associated with the detected trigger condition further includes (942) reporting at least a subset of the one or more parameters for the amelioration process. For example, in some embodiments, enabling the amelioration process associated with the detected trigger condition further includes reporting a targeted amount of storage capacity of the non-volatile memory that needs to be reduced in the respective storage device.

In some embodiments, the obtaining, the enabling, or both the obtaining and the enabling are performed (944) by one or more subsystems of the storage system distinct from the plurality of storage devices. For example, in some of these embodiments, the obtaining, the enabling, or both the obtaining and the enabling are performed by a storage system controller (e.g., storage system controller 150, FIG. 1B) of the storage system (e.g., data storage system 140, FIG. 1B). As another example, in some of these embodiments, the obtaining, the enabling, or both the obtaining and the enabling are performed by a cluster controller (e.g., cluster controller 180, FIG. 1C) of the storage system (e.g., data storage system 170, FIG. 1C). In some embodiments, method 900, or at least the performing operation 902 and/or enabling operation 908 of method 900, is governed by instructions that are stored in a non-transitory computer readable storage medium and that are executed by one or more processors of a device, such as the one or more processing units (CPUs) 152-1 of system management module 151-1, shown in FIGS. 1B and 2B-1 or the one or more processing units (CPUs) 182-1 of cluster management module 181-1, shown in FIGS. 1C and 2C-1.

In some embodiments, after enabling the amelioration process (910): the storage system re-evaluates the trigger condition in accordance with the one or more metrics of the one or more storage devices of the plurality of storage devices, and (2) in accordance with a determination that the trigger condition is no longer valid, aborts the amelioration process to reduce declared capacity of the non-volatile memory of the respective storage device. For example, in some embodiments, the one or more metrics may change such that the trigger condition is no longer present (e.g., the amelioration process is no longer needed). For example, normal storage operations (read, write, trim, etc.) performed coincident in time with the amelioration process may cause the metrics to change so that the trigger condition is no longer present. In some embodiments, a trigger detection module (e.g., trigger detection module 224, FIGS. 2A-1 and 2A-2; trigger detection module 254-1, FIG. 2B-1; or trigger detection module 284-1, FIG. 2C-1) and/or an enabling module (e.g., enabling module 226, FIGS. 2A-1 and 2A-2; enabling module 256-1, FIG. 2B-1; or enabling module 286-1, FIG. 2C-1) are used to, after enabling the amelioration process, (1) re-evaluate the trigger condition in accordance with the one or more metrics of the one or more storage devices of the plurality of storage devices, and (2) in accordance with a determination that the trigger condition is no longer valid, abort the amelioration process to reduce declared capacity of the non-volatile memory of the respective storage device, as described above with respect to FIGS. 2A-1, 2A-2, 2B-1, and 2C-1.

In some embodiments, any of the method described above are performed by a storage system, the storage system including (1) non-volatile memory, (2) one or more processors, and (3) controller memory storing one or more programs, which when executed by the one or more processors cause the storage system to perform or control performance of any of the methods described herein.

In some embodiments, any of the methods described above are performed by a storage system including means for performing any of the methods described herein.

In some embodiments, any of the methods described above are performed by a storage system, the storage system including (1) a plurality of storage devices, (2) one or more subsystems having one or more processors, and (3) memory storing one or more programs, which when executed by the one or more processors cause the one or more subsystems to perform or control performance of any of the methods described herein.

Figure 10A:
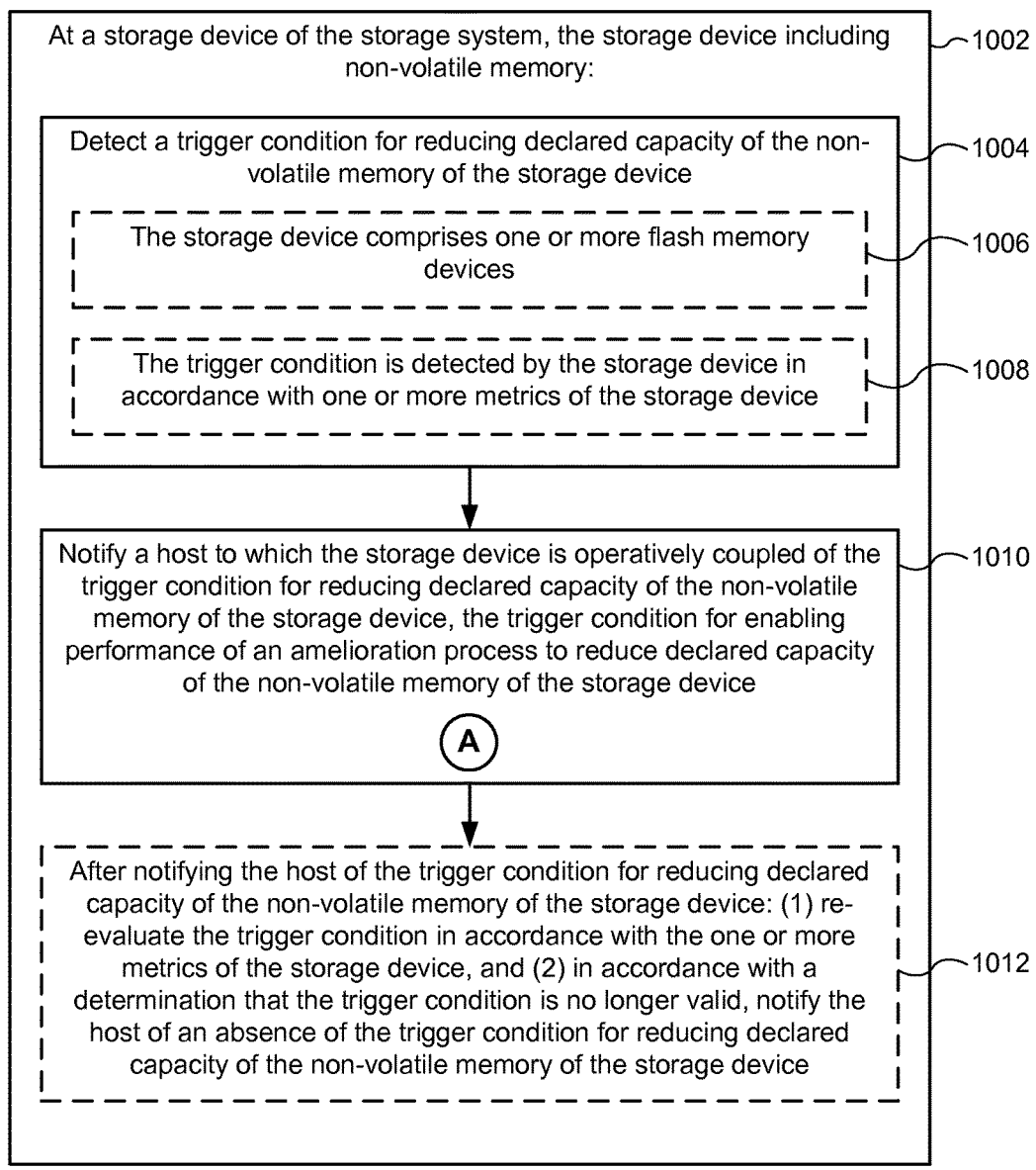
FIGS. 10A-10C illustrate a flowchart representation of a method of managing a storage system, in accordance with some embodiments.
Figure 10B:
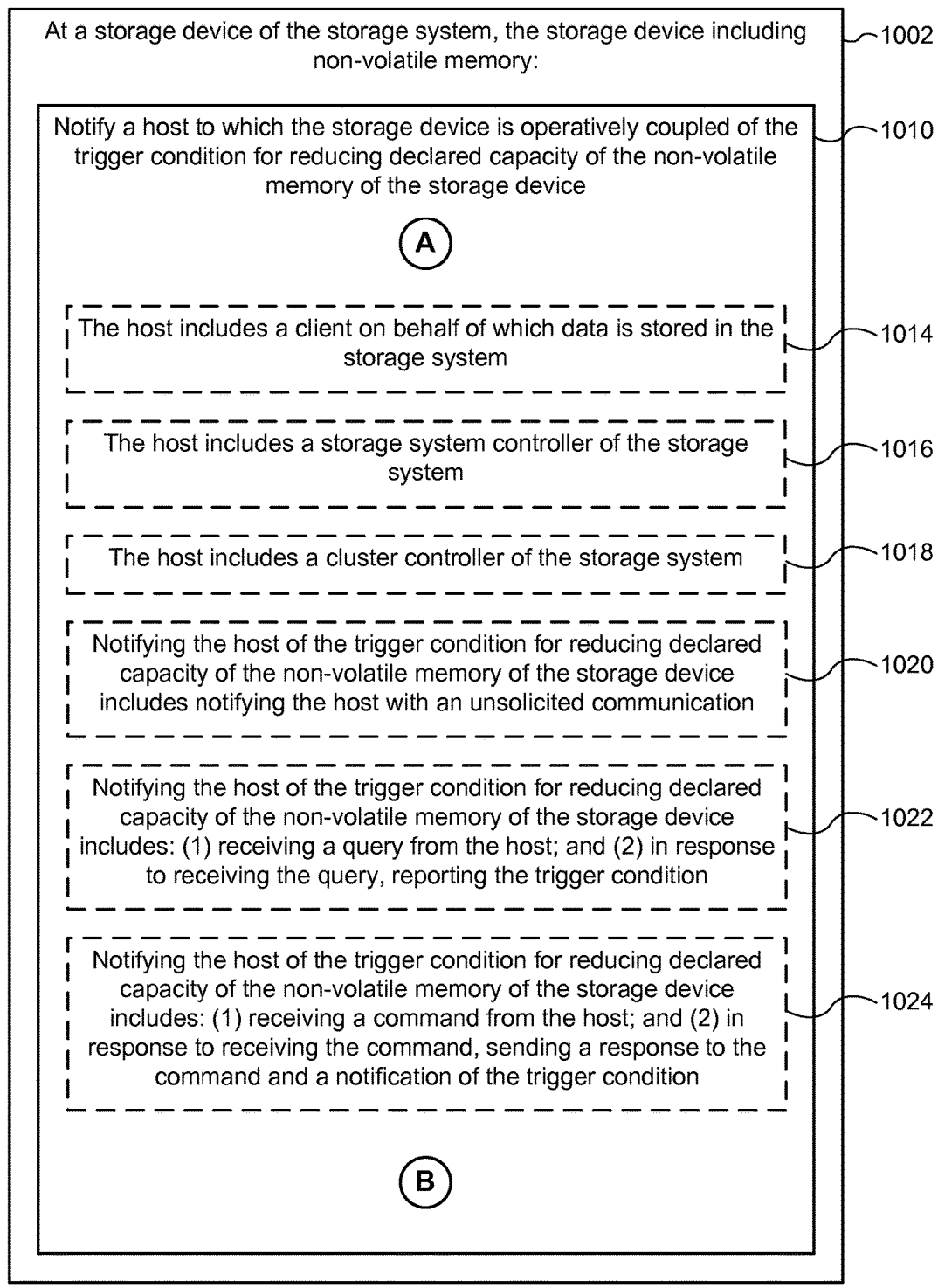
Figure 10C:
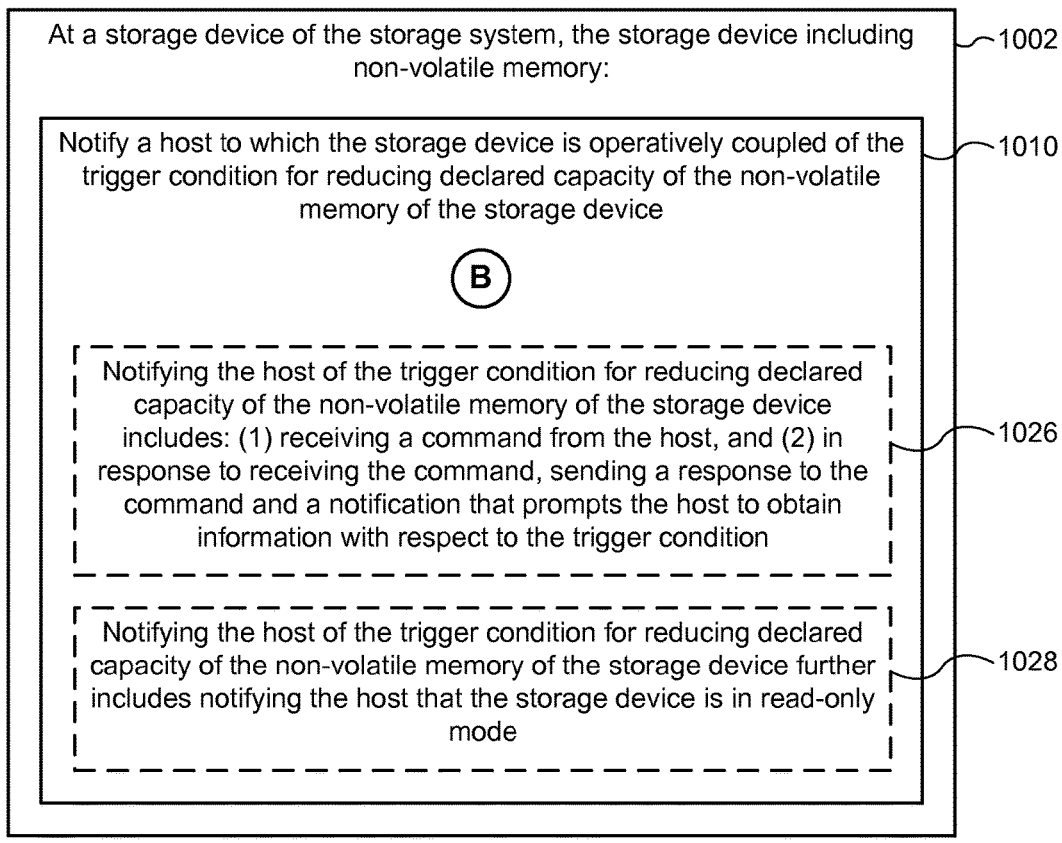

FIGS. 10A-10C illustrate a flowchart representation of a method 1000 of managing a storage system, in accordance with some embodiments. At least in some embodiments, method 1000 is performed by a storage device (e.g., storage device 120, FIG. 1A, storage device 160, FIG. 1B, or storage device 194, FIG. 1C) or one or more components of the storage device (e.g., storage controller 124, FIG. 1A), wherein the storage device is operatively coupled with a host system (e.g., computer system 110, FIG. 1A, computer system 142, FIG. 1B, computer system 172, FIG. 1C, storage system controller 150, FIG. 1B, or cluster controller 180, FIG. 1C). In some embodiments, method 1000 is governed by instructions that are stored in a non-transitory computer readable storage medium and that are executed by one or more processors of a device, such as the one or more processing units (CPUs) 122-1 of management module 121-1, shown in FIGS. 1A and 2A-1. In some embodiments, method 1000 is performed by a storage system (e.g., data storage system 100, FIG. 1A, data storage system 140, FIG. 1B, and/or data storage system 170, FIG. 1C) or one or more components of the storage system (e.g., storage device 120, FIG. 1A, storage device 160, FIG. 1B, or storage device 194, FIG. 1C). In some embodiments, some of the operations of method 1000 are performed at a storage device (e.g., storage device 120, FIG. 1A, storage device 160, FIG. 1B, or storage device 194, FIG. 1C) and information is transmitted to a host (e.g., computer system 110, FIG. 1A, computer system 142, FIG. 1B, computer system 172, FIG. 1C, storage system controller 150, FIG. 1B, or cluster controller 180, FIG. 1C). For ease of explanation, the following describes method 1000 as performed by a storage device (e.g., storage device 120, FIG. 1A) of a storage system (e.g., data storage system 100, FIG. 1A). However, those skilled in the art will appreciate that in other embodiments, one or more of the operations described in method 1000 are performed by a storage device of another storage system (e.g., storage device 160 of data storage system 140, FIG. 1B, or storage device 194 of data storage system 170, FIG. 1C).

At a storage device of the storage system, the storage device including non-volatile memory (1002), the storage device (e.g., storage device 120, FIG. 1A) detects (1004) a trigger condition for reducing declared capacity of the non-volatile memory of the storage device. In some embodiments, the trigger condition is detected in accordance with a non-linear and/or linear combination of one or more metrics of the storage device. In some embodiments, the trigger condition is detected in accordance with historical knowledge of the one or more metrics, as described above with respect to operation 602 of FIG. 6. In some embodiments, the trigger condition is detected when the storage device transitions from normal operation to read-only mode. In some embodiments, a trigger detection module (e.g., trigger detection module 224-1, FIG. 2A-1) is used to detect a trigger condition for reducing declared capacity of the non-volatile memory of the storage device, as described above with respect to FIG. 2A-1. Furthermore, in some embodiments, prior to detecting the trigger condition (1004), the storage device detects a wear condition and reduces over-provisioning of the non-volatile memory of the storage device, without reducing declared capacity of the non-volatile memory of the storage device, as described above with respect to operation 601 of FIG. 6.

In some embodiments, the amelioration process to reduce declared capacity of the non-volatile memory of the storage device includes a process to reduce utilization of the non-volatile memory of the storage device, for example as described above with respect to operation 608 of FIG. 6.

In some embodiments, the storage device comprises (1006) one or more flash memory devices. In some embodiments, the storage device comprises a storage medium (e.g., storage medium 130, FIG. 1A), and the storage medium comprises one or more non-volatile storage devices, such as flash memory devices. In some embodiments, the storage medium (e.g., storage medium 130, FIG. 1A) is a single flash memory device, while in other embodiments the storage medium includes a plurality of flash memory devices. For example, in some embodiments, the storage medium includes dozens or hundreds of flash memory devices, organized in parallel memory channels, such as 16, 32 or 64 flash memory devices per memory channel, and 8, 16 or 32 parallel memory channels. In some embodiments, the non-volatile storage medium (e.g., storage medium 130, FIG. 1A) includes NAND-type flash memory or NOR-type flash memory. In other embodiments, the storage medium comprises one or more other types of non-volatile storage devices.

In some embodiments, the trigger condition is (1008) detected by the storage device in accordance with one or more metrics of the storage device. In some embodiments, the one or more metrics of the storage device include one or more status metrics corresponding to the storage device's ability to retain data, one or more performance metrics corresponding to performance of the storage device, one or more wear metrics corresponding to wear on the storage device, and/or one or more time metrics, as described above with respect to operation 602 of FIG. 6. Additional example of metrics of a storage device are described herein with respect to method 900. Examples of trigger conditions are discussed above with reference to FIG. 6.

At a storage device of the storage system, the storage device including non-volatile memory (1002), the storage device (e.g., storage device 120, FIG. 1A) notifies (1010) a host to which the storage device is operatively coupled of the trigger condition for reducing declared capacity of the non-volatile memory of the storage device, the trigger condition for enabling performance of an amelioration process to reduce declared capacity of the non-volatile memory of the storage device. In some embodiments, a notification module (e.g., notification module 228-1, FIG. 2A-1) is used to notify a host to which the storage device is operatively coupled of the trigger condition for reducing declared capacity of the non-volatile memory of the storage device, as described above with respect to FIG. 2A-1.

In some embodiments, the host includes (1014) a client on behalf of which data is stored in the storage system (e.g., data storage system 100, FIG. 1A; data storage system 140, FIG. 1B; data storage system 170, FIG. 1C). In some embodiments, the client is or includes an entity on behalf of which data is stored in the storage system. For example, in some embodiments, the host is (1) computer system 110 (FIG. 1A) or a client process, module or application executed by computer system 110, (2) computer system 142 (FIG. 1B) or a client process, module or application executed by computer system 142, and/or (3) computer system 172 (FIG. 1C) or a client process, module or application executed by computer system 172.

In some embodiments, the host includes (1016) a storage system controller of the storage system (e.g., data storage system 140, FIG. 1B). In some embodiments, the storage system controller controls and/or coordinates operations among one or more storage devices. For example, in some embodiments, the host is storage system controller 150 (FIG. 1B). In some of these embodiments, the data storage system (e.g., data storage system 140, FIG. 1B) is called a scale-up system.

In some embodiments, the host includes (1018) a cluster controller of the storage system (e.g., data storage system 170, FIG. 1C). In some embodiments, the cluster controller controls and/or coordinates operations among one or more data storage subsystems, as shown for example in FIG. 1C, where each of the data storage subsystems may be implemented as a data storage system having one or more storage devices (e.g., data storage system 140, FIG. 1B). For example, in some embodiments, the host is cluster controller 180 (FIG. 1C). In some of these embodiments, the data storage system (e.g., data storage system 170, FIG. 1C) is called a scale-out system, sometimes known as a clustered storage system.

In some embodiments, notifying (1010) the host of the trigger condition for reducing declared capacity of the non-volatile memory of the storage device includes notifying (1020) the host (e.g., computer system 110, FIG. 1A, computer system 142, FIG. 1B, computer system 172, FIG. 1C, storage system controller 150, FIG. 1B, and/or cluster controller 180, FIG. 1C) with an unsolicited communication. For example, in some embodiments, the unsolicited communication includes an interrupt communication. As another example, in some embodiments, the unsolicited communication includes a remote direct memory access (RDMA). As yet another example, in some embodiments, the unsolicited communication includes a TCP connection request. In some embodiments, the unsolicited communication includes any other form of unsolicited communication.

In some embodiments, notifying (1010) the host of the trigger condition for reducing declared capacity of the non-volatile memory of the storage device includes (1022): (1) receiving a query from the host (e.g., computer system 110, FIG. 1A, computer system 142, FIG. 1B, computer system 172, FIG. 1C, storage system controller 150, FIG. 1B, and/or cluster controller 180, FIG. 1C), and (2) in response to receiving the query, reporting the trigger condition. For example, in some embodiments, the host polls for the trigger condition and the storage device receives the query from the host and in response to receiving the query, reports the trigger condition.

In some embodiments, notifying (1010) the host of the trigger condition for reducing declared capacity of the non-volatile memory of the storage device includes (1024):

(1) receiving a command from the host (e.g., computer system 110, FIG. 1A, computer system 142, FIG. 1B, computer system 172, FIG. 1C, storage system controller 150, FIG. 1B, and/or cluster controller 180, FIG. 1C), and (2) in response to receiving the command, sending a response to the command and a notification of the trigger condition. In some embodiments, the command includes an I/O (input/output) request. In some embodiments, the I/O request includes a read request from the storage device and/or a write request to the storage device. In some embodiments, the command includes a request for temperature of the storage device. In some embodiments, the command includes a request for some other status of the storage device. In some embodiments, the notification of the trigger condition is piggy-backed on a response to the command from the host. For example, in some embodiments, the host issues a read request for data from the storage device, and the storage device (1) receives the read request from the host, and (2) in response to receiving the read request, the storage device sends data corresponding to the read request and a notification of the trigger condition.

In some embodiments, notifying (1010) the host of the trigger condition for reducing declared capacity of the non-volatile memory of the storage device includes (1026): (1) receiving a command from the host (e.g., computer system 110, FIG. 1A, computer system 142, FIG. 1B, computer system 172, FIG. 1C, storage system controller 150, FIG. 1B, and/or cluster controller 180, FIG. 1C), and (2) in response to receiving the command, sending a response to the command and a notification that prompts the host to obtain information with respect to the trigger condition. In some embodiments, the command includes an I/O (input/output) request. In some embodiments, the I/O request includes a read request from the storage device and/or a write request to the storage device. In some embodiments, the command includes a request for temperature of the storage device. In some embodiments, the command includes a request for some other status of the storage device. In some embodiments, the notification that prompts the host to obtain information with respect to the trigger condition is piggy-backed on a response to the command from the host. For example, in some embodiments, the host issues a read request for data from the storage device, and the storage device (1) receives the read request from the host, and (2) in response to receiving the read request, the storage device sends data corresponding to the read request and a notification (e.g., by setting a notification bit) that prompts the host to obtain information with respect to the trigger condition. In some embodiments, the mechanism used for returning a notification when responding to a command from the host is a SCSI deferred error or deferred error response code.

In some embodiments, notifying (1010) the host of the trigger condition for reducing declared capacity of the non-volatile memory of the storage device further includes notifying (1028) the host (e.g., computer system 110, FIG. 1A, computer system 142, FIG. 1B, computer system 172, FIG. 1C, storage system controller 150, FIG. 1B, and/or cluster controller 180, FIG. 1C) that the storage device is in read-only mode. In some embodiments, notifying the host that the storage device is in read-only mode includes notifying the host that the storage device is not accepting any more write commands. In some embodiments, notifying the host that the storage device is in read-only mode includes sending one or more rejections of write commands.

In some embodiments, after notifying the host of the trigger condition for reducing declared capacity of the non-volatile memory of the storage device (1012), the storage device (1) re-evaluates the trigger condition in accordance with the one or more metrics of the storage device, and (2) in accordance with a determination that the trigger condition is no longer valid, notifies the host of an absence of the trigger condition for reducing declared capacity of the non-volatile memory of the storage device. For example, in some circumstances, the one or more metrics of the storage device may change such that the trigger condition is no longer valid (e.g., the amelioration process is no longer needed). For example, during the operation of an amelioration process (e.g., operation 606, FIG. 6), normal storage operations will continue to be performed (e.g., read, write, delete, trim, etc.). Normal storage operations include operations like trim that explicitly reduce the storage device utilization, possibly enough to merit aborting the amelioration process. Other storage activity such as garbage collection may also reduce utilization, possibly enough to merit aborting the amelioration process.

In some embodiments, the trigger condition (e.g., periodically, semi-continuously, initially, finally, occasionally or irregularly) is recomputed or re-evaluated in accordance with the one or more metrics of the storage device, as the one or more metrics may change in value due to the amelioration process and/or normal storage operations (e.g., read, write, erase and trim or unmap operations). In some embodiments, a trigger detection module (e.g., trigger detection module 224-1, FIG. 2A-1) and/or a notification module (e.g., notification module 228-1, FIG. 2A-1) are used to, after notifying the host of the trigger condition for reducing declared capacity of the non-volatile memory of the storage device: (1) re-evaluate the trigger condition in accordance with the one or more metrics of the storage device, and (2) in accordance with a determination that the trigger condition is no longer valid, notify the host of an absence of the trigger condition for reducing declared capacity of the non-volatile memory of the storage device, as described above with respect to FIG. 2A-1.

In some embodiments, any operations of method 1000 described above are performed by a storage device, the storage device including (1) non-volatile memory (e.g., comprising one or more non-volatile storage devices, such as flash memory devices) (2) one or more processors, and (3) controller memory (e.g., non-volatile memory or volatile memory in or coupled to the controller) storing one or more programs, which when executed by the one or more processors cause the storage device to perform or control performance of any of the methods described herein.

In some embodiments, any operations of method 1000 described above are performed by a storage device including means for performing any of the methods described herein.

In some embodiments, any operations of method 1000 described above are performed by a storage system comprising (1) a storage medium (e.g., comprising one or more non-volatile storage devices, such as flash memory devices) (2) one or more processors, and (3) memory (e.g., non-volatile memory or volatile memory in the storage system) storing one or more programs, which when executed by the one or more processors cause the storage system to perform or control performance of any of the methods described herein.

Figure 11A:
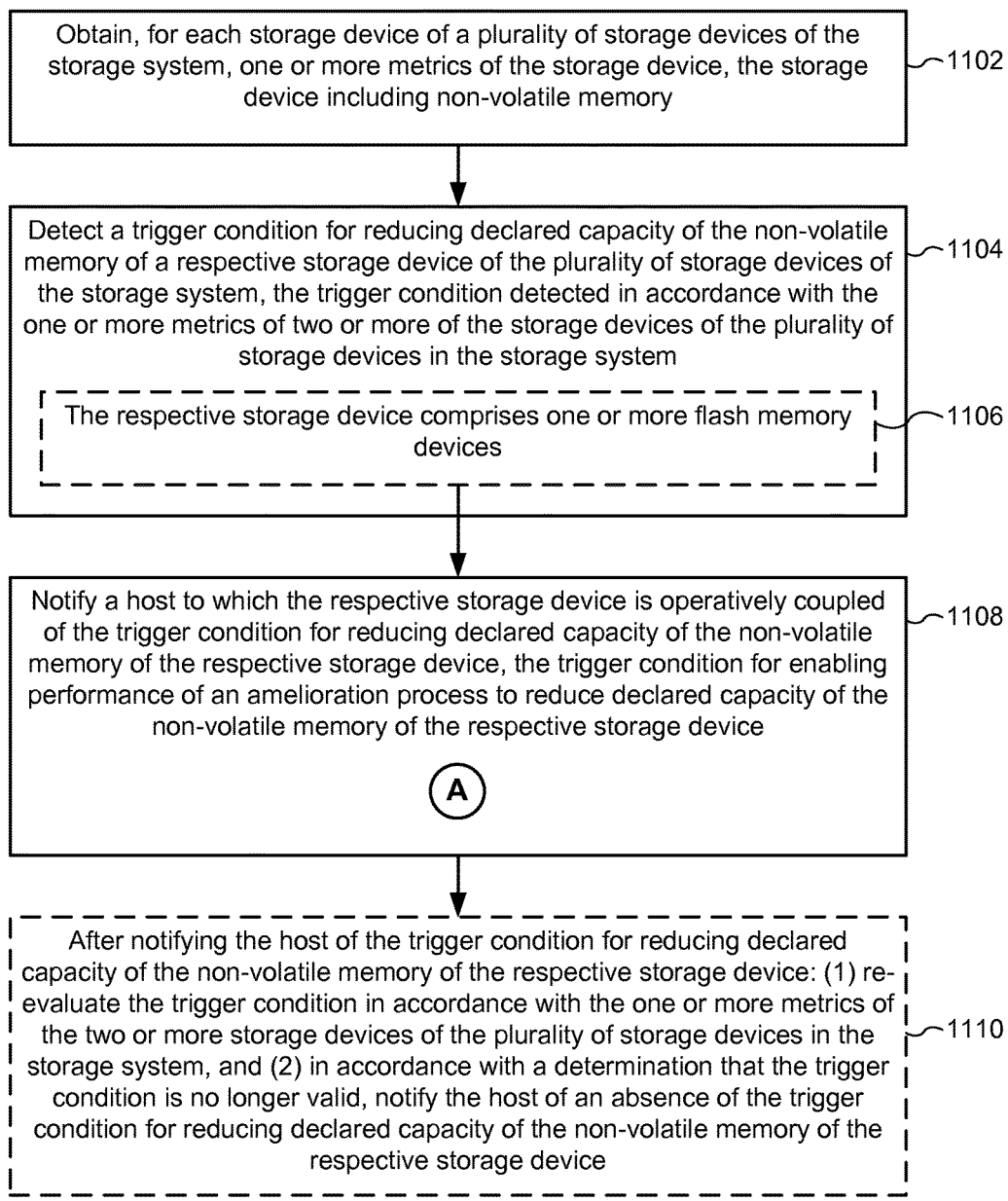
FIGS. 11A-11C illustrate a flowchart representation of a method of managing a storage system, in accordance with some embodiments.
Figure 11B:
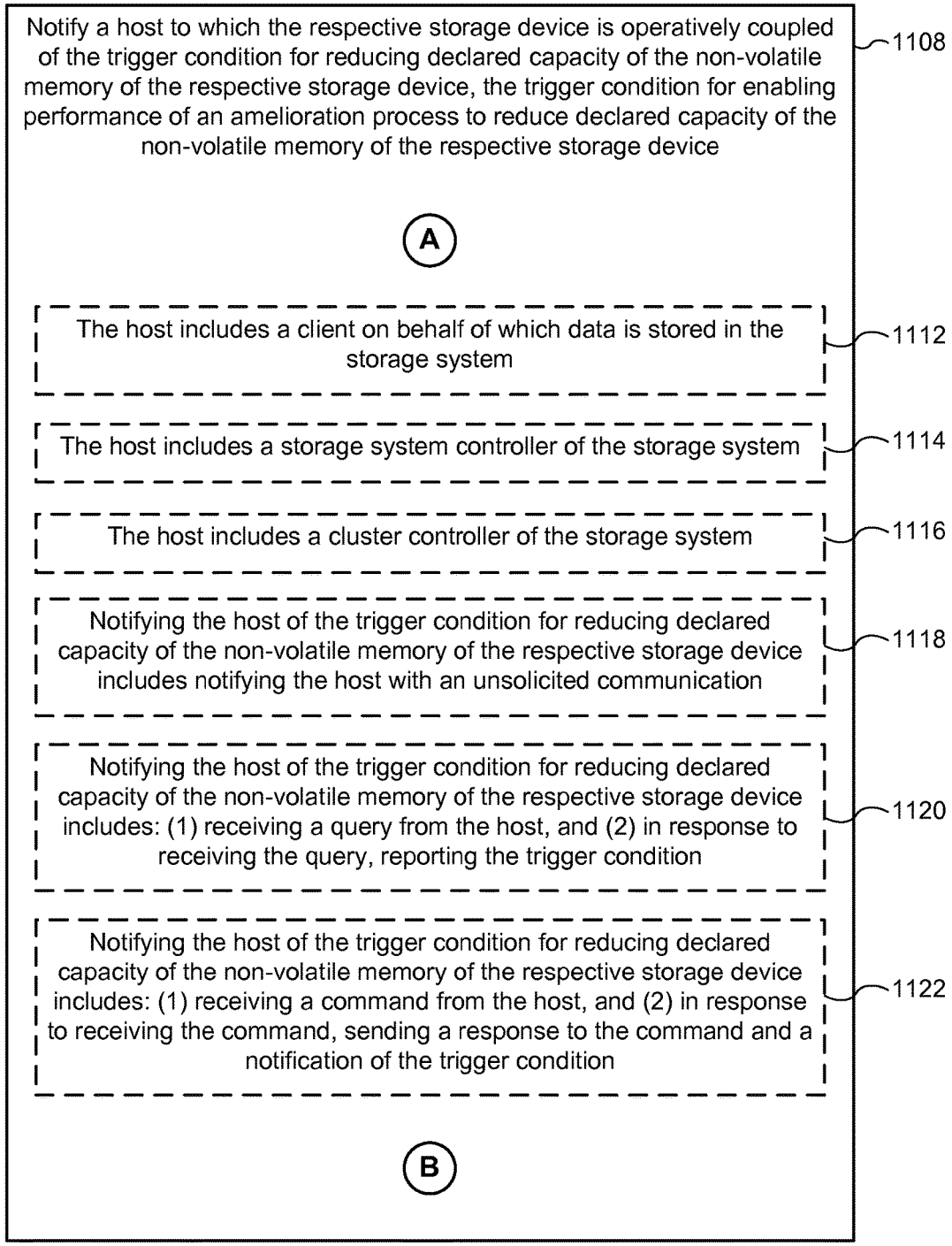
Figure 11C:
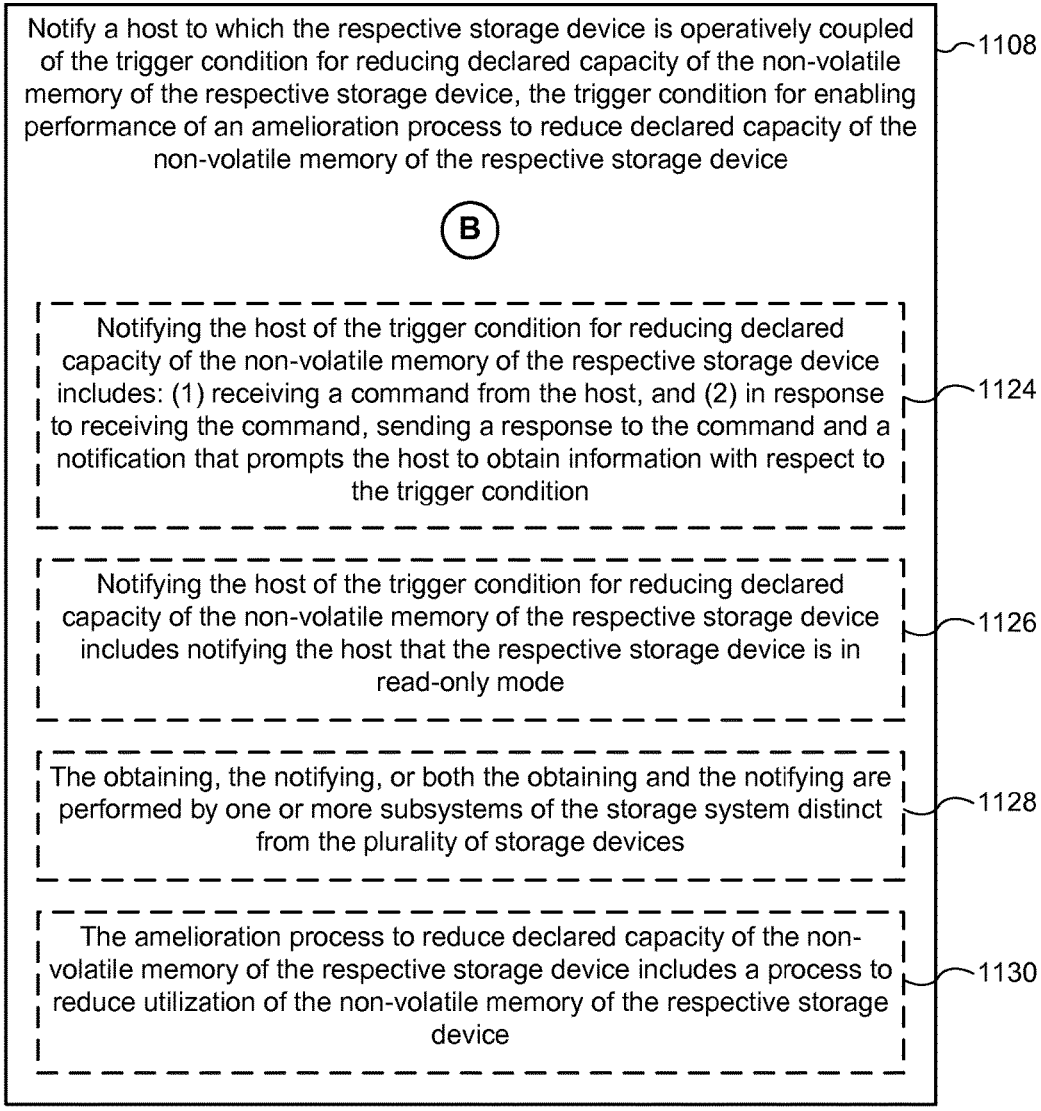

FIGS. 11A-11C illustrate a flowchart representation of a method 1100 of managing a storage system, in accordance with some embodiments. At least in some embodiments, method 1100 is performed by a storage system (e.g., data storage system 100, FIG. 1A, data storage system 140, FIG. 1B, or data storage system 170, FIG. 1C) or one or more components of the storage system (e.g., computer system 110, FIG. 1A, storage system controller 150, FIG. 1B, or cluster controller 180, FIG. 1C). In some embodiments, method 1100 is governed by instructions that are stored in a non-transitory computer readable storage medium and that are executed by one or more processors of a storage system, such as the one or more processing units (CPUs) 152-1 of system management module 151-1, shown in FIGS. 1B and 2B-1, the one or more processing units (CPUs) 182-1 of cluster management module 181-1, shown in FIGS. 1C and 2C-1, or one or more processors of an included host (e.g., computer system 110, FIG. 1A), shown in FIG. 2A-2. For ease of explanation, the following describes method 1100 as performed by a storage system (e.g., data storage system 100, FIG. 1A, data storage system 140, FIG. 1B, or data storage system 170, FIG. 1C). However, those skilled in the art will appreciate that in other embodiments, one or more of the operations described in method 1100 are performed by one or more subsystems of the storage system distinct from the storage device (e.g., storage system controller 150, FIG. 1B or cluster controller 180, FIG. 1C).

A storage system (e.g., data storage system 100, FIG. 1A, data storage system 140, FIG. 1B, or data storage system 170, FIG. 1C) obtains (1102), for each storage device (e.g., storage device 120, FIG. 1A, or any of storage devices 160-1 to 160-*m* of FIG. 1B, or any of storage devices 194-1 to 194-*n* or 194-*j* to 194-*k* of FIG. 1C) of a plurality of storage devices of the storage system, one or more metrics of the storage device, the storage device including non-volatile memory. Although FIG. 1A only shows one storage device 120, in some embodiments, data storage system 100 of FIG. 1A includes a plurality of storage devices, of which storage device 120 is one example. In some embodiments, the storage device generates and/or maintains the one or more metrics of the storage device, and the storage system obtains the one or more metrics from the storage device. In some embodiments, one or more subsystems of a storage system distinct from the storage device (e.g., storage system controller 150, FIG. 1B, or cluster controller 180, FIG. 1C) generate and/or maintain the one or more metrics of the storage device, and the storage system obtains the one or more metrics from the one or more subsystems. In some embodiments, a metrics module (e.g., metrics module 222, FIGS. 2A-1 and 2A-2; metrics module 252-1, FIG. 2B-1; or metrics module 282-1, FIG. 2C-1) is used to obtain, for each storage device of a plurality of storage devices of the storage system, one or more metrics of the storage device, the storage device including non-volatile memory, as described above with respect to FIGS. 2A-1, 2A-2, 2B-1, and 2C-1.

The storage system detects (1104) a trigger condition for reducing declared capacity of the non-volatile memory of a respective storage device of the plurality of storage devices of the storage system, the trigger condition detected in accordance with the one or more metrics of two or more of the storage devices of the plurality of storage devices in the storage system. In some embodiments, the one or more metrics of the respective storage device include one or more status metrics corresponding to the respective storage device's ability to retain data, one or more performance metrics corresponding to performance of the respective storage device, one or more wear metrics corresponding to wear on the respective storage device, and/or one or more time metrics, as described above with respect to operation 602 of FIG. 6. In some embodiments, the trigger condition is detected in accordance with a non-linear and/or linear combination of the one or more metrics of the respective storage device. In some embodiments, the trigger condition is detected in accordance with historical knowledge of the one or more metrics of the respective storage device, as described above with respect to operation 602 of FIG. 6. In some embodiments, the trigger condition is detected when the respective storage device transitions from normal operation to read-only mode. In some embodiments, one or more metrics from the plurality of storage devices of the storage system are combined to detect the trigger condition. For example, it may be advantageous to examine the rate of change of historical wear metrics such as P/E cycle counts in the plurality of storage devices in order to allow the amelioration process sufficient time to complete before any one device reaches a wear limit. In some embodiments, a trigger detection module (e.g., trigger detection module 224, FIGS. 2A-1 and 2A-2; trigger detection module 254-1, FIG. 2B-1; or trigger detection module 284-1, FIG. 2C-1) is used to detect a trigger condition for reducing declared capacity of the non-volatile memory of a respective storage device of the plurality of storage devices of the storage system, the trigger condition detected in accordance with the one or more metrics of the respective storage device, as described above with respect to FIGS. 2A-1, 2A-2, 2B-1, and 2C-1. Furthermore, in some embodiments, prior to detecting the trigger condition (1104), the storage system detects a wear condition and reduces over-provisioning of the non-volatile memory of the respective storage device, without reducing declared capacity of the non-volatile memory of the respective storage device, as described above with respect to operation 601 of FIG. 6.

In some embodiments, the respective storage device comprises (1106) one or more flash memory devices. In some embodiments, the respective storage device comprises a storage medium (e.g., storage medium 130, FIG. 1A), and the storage medium comprises one or more non-volatile storage devices, such as flash memory devices. In some embodiments, the storage medium (e.g., storage medium 130, FIG. 1A) is a single flash memory device, while in other embodiments the storage medium includes a plurality of flash memory devices. For example, in some embodiments, the storage medium includes dozens or hundreds of flash memory devices, organized in parallel memory channels, such as 16, 32 or 64 flash memory devices per memory channel, and 8, 16 or 32 parallel memory channels. In some embodiments, the non-volatile storage medium (e.g., storage medium 130, FIG. 1A) includes NAND-type flash memory or NOR-type flash memory. In other embodiments, the storage medium comprises one or more other types of non-volatile storage devices.

The storage system notifies (1108) a host to which the respective storage device is operatively coupled of the trigger condition for reducing declared capacity of the non-volatile memory of the respective storage device, the trigger condition for enabling performance of an amelioration process to reduce declared capacity of the non-volatile memory of the respective storage device. In some embodiments, a notification module (e.g., notification module 228, FIGS. 2A-1 and 2A-2, notification module 258-1, FIG. 2B-1, or notification module 288-1, FIG. 2C-1) is used to notify a host to which the respective storage device is operatively coupled of the trigger condition for reducing declared capacity of the non-volatile memory of the respective storage device, the trigger condition associated with an amelioration process to reduce declared capacity of the non-volatile memory of the respective storage device, as described above with respect to FIGS. 2A-1, 2A-2, 2B-1, and 2C-1. In some embodiments, or in some circumstances, the notification of the trigger condition causes performance of the amelioration process to be enabled. Furthermore, in some embodiments, or in some circumstances, the amelioration process reduces declared capacity of two or more of the storage devices in the storage system.

In some embodiments, the host includes (1112) a client on behalf of which data is stored in the storage system (e.g., data storage system 100, FIG. 1A; data storage system 140, FIG. 1B; data storage system 170, FIG. 1C). In some embodiments, the client is or includes an entity on behalf of which data is stored in the storage system. For example, in some embodiments, the host is (1) computer system 110 (FIG. 1A) or a client process, module or application executed by computer system 110, (2) computer system 142 (FIG. 1B) or a client process, module or application executed by computer system 142, and/or (3) computer system 172 (FIG. 1C) or a client process, module or application executed by computer system 172.

In some embodiments, the host includes (1114) a storage system controller of the storage system (e.g., data storage system 140, FIG. 1B). In some embodiments, the storage system controller controls and/or coordinates operations among one or more storage devices. For example, in some embodiments, the host is storage system controller 150 (FIG. 1B). In some of these embodiments, the data storage system (e.g., data storage system 140, FIG. 1B) is called a scale-up system.

In some embodiments, the host includes (1116) a cluster controller of the storage system (e.g., data storage system 170, FIG. 1C). In some embodiments, the cluster controller controls and/or coordinates operations among one or more data storage subsystems, as shown for example in FIG. 1C, where each of the data storage subsystems may be implemented as a data storage system having one or more storage devices (e.g., data storage system 140, FIG. 1B). For example, in some embodiments, the host is cluster controller 180 (FIG. 1C). In some of these embodiments, the data storage system (e.g., data storage system 170, FIG. 1C) is called a scale-out system or a clustered storage system.

In some embodiments, notifying (1108) the host of the trigger condition for reducing declared capacity of the non-volatile memory of the respective storage device includes notifying (1118) the host (e.g., computer system 110, FIG. 1A, computer system 142, FIG. 1B, computer system 172, FIG. 1C, storage system controller 150, FIG. 1B, and/or cluster controller 180, FIG. 1C) with an unsolicited communication. For example, in some embodiments, the unsolicited communication includes an interrupt communication. As another example, in some embodiments, the unsolicited communication includes a remote direct memory access (RDMA). As yet another example, in some embodiments, the unsolicited communication includes a TCP connection request. In some embodiments, the unsolicited communication includes any other form of unsolicited communication.

In some embodiments, notifying (1108) the host of the trigger condition for reducing declared capacity of the non-volatile memory of the respective storage device includes (1120): (1) receiving a query from the host (e.g., computer system 110, FIG. 1A, computer system 142, FIG. 1B, computer system 172, FIG. 1C, storage system controller 150, FIG. 1B, and/or cluster controller 180, FIG. 1C), and (2) in response to receiving the query, reporting the trigger condition. For example, in some embodiments, the host polls for the trigger condition and the storage system receives the query from the host and in response to receiving the query, reports the trigger condition.

In some embodiments, notifying (1108) the host of the trigger condition for reducing declared capacity of the non-volatile memory of the respective storage device includes (1122): (1) receiving a command from the host (e.g., computer system 110, FIG. 1A, computer system 142, FIG. 1B, computer system 172, FIG. 1C, storage system controller 150, FIG. 1B, and/or cluster controller 180, FIG. 1C), and (2) in response to receiving the command, sending a response to the command and a notification of the trigger condition. In some embodiments, the command includes an I/O (input/output) request. In some embodiments, the I/O request includes a read request from the respective storage device and/or a write request to the respective storage device. In some embodiments, the command includes a request for temperature of the respective storage device. In some embodiments, the command includes a request for some other status of the respective storage device. In some embodiments, the notification of the trigger condition is piggy-backed on a response to the command from the host. For example, in some embodiments, the host issues a read request for data from the respective storage device, and the storage system (1) receives the read request from the host, and (2) in response to receiving the read request, the storage system sends data corresponding to the read request and a notification of the trigger condition.

In some embodiments, notifying (1108) the host of the trigger condition for reducing declared capacity of the non-volatile memory of the respective storage device includes (1124): (1) receiving a command from the host (e.g., computer system 110, FIG. 1A, computer system 142, FIG. 1B, computer system 172, FIG. 1C, storage system controller 150, FIG. 1B, and/or cluster controller 180, FIG. 1C), and (2) in response to receiving the command, sending a response to the command and a notification that prompts the host to obtain information with respect to the trigger condition. In some embodiments, the command includes an I/O (input/output) request. In some embodiments, the I/O request includes a read request from the respective storage device and/or a write request to the respective storage device. In some embodiments, the command includes a request for temperature of the respective storage device. In some embodiments, the command includes a request for some other status of the respective storage device. In some embodiments, the notification that prompts the host to obtain information with respect to the trigger condition is piggy-backed on a response to the command from the host. For example, in some embodiments, the host issues a read request for data from the respective storage device, and the storage system (1) receives the read request from the host, and (2) in response to receiving the read request, the storage system sends data corresponding to the read request and a notification (e.g., by setting a notification bit) that prompts the host to obtain information with respect to the trigger condition. In some embodiments, the mechanism used for returning a notification when responding to a command from the host is a SCSI deferred error or deferred error response code.

In some embodiments, notifying (1108) the host of the trigger condition for reducing declared capacity of the non-volatile memory of the respective storage device includes notifying (1126) the host (e.g., computer system 110, FIG. 1A, computer system 142, FIG. 1B, computer system 172, FIG. 1C, storage system controller 150, FIG. 1B, and/or cluster controller 180, FIG. 1C) that the respective storage device is in read-only mode. In some embodiments, notifying the host that the respective storage device is in read-only mode includes notifying the host that the respective storage device is not accepting any more write commands. In some embodiments, notifying the host that the respective storage device is in read-only mode includes sending one or more rejections of write commands.

In some embodiments, the obtaining, the notifying, or both the obtaining and the notifying are performed (1128) by one or more subsystems of the storage system distinct from the plurality of storage devices. For example, in some of these embodiments, the obtaining, the notifying, or both the obtaining and the notifying are performed by a storage system controller (e.g., storage system controller 150, FIG. 1B) of the storage system (e.g., data storage system 140, FIG. 1B). As another example, in some of these embodiments, the obtaining, the notifying, or both the obtaining and the notifying are performed by a cluster controller (e.g., cluster controller 180, FIG. 1C) of the storage system (e.g., data storage system 170, FIG. 1C). In some embodiments, method 1100, or at least the obtaining operation 1102 and/or the notifying operation 1108 of method 1100, is governed by instructions that are stored in a non-transitory computer readable storage medium and that are executed by one or more processors of a device, such as the one or more processing units (CPUs) 152-1 of system management module 151-1, shown in FIGS. 1B and 2B-1 or the one or more processing units (CPUs) 182-1 of cluster management module 181-1, shown in FIGS. 1C and 2C-1.

In some embodiments, the amelioration process to reduce declared capacity of the non-volatile memory of the respective storage device includes (1130) a process to reduce utilization of the non-volatile memory of the respective storage device, for example as described above with respect to operation 608 of FIG. 6.

In some embodiments, after notifying the host of the trigger condition for reducing declared capacity of the non-volatile memory of the respective storage device (1110), the storage system (1) re-evaluates the trigger condition in accordance with the one or more metrics of the two or more storage devices of the plurality of storage devices in the storage system, and (2) in accordance with a determination that the trigger condition is no longer valid, notifies the host of an absence of the trigger condition for reducing declared capacity of the non-volatile memory of the respective storage device. For example, in some circumstances, the one or more metrics of the respective storage device may change such that the trigger condition is no longer valid (e.g., the amelioration process is no longer needed). For example, during the operation of an amelioration process (e.g., operation 606, FIG. 6), normal storage operations will continue to be performed (e.g., read, write, delete, trim, etc.). Normal storage operations include operations like trim that explicitly reduce the respective storage device utilization, possibly enough to merit aborting the amelioration process. Other storage activity such as garbage collection may also reduce utilization, possibly enough to merit aborting the amelioration process.

In some embodiments, the trigger condition (e.g., periodically, semi-continuously, initially, finally, occasionally or irregularly) is recomputed or re-evaluated in accordance with the one or more metrics of the respective storage device, as the one or more metrics may change in value due to the amelioration process and/or normal storage operations (e.g., read, write, erase and trim or unmap operations). In some embodiments, a trigger detection module (e.g., trigger detection module 224, FIGS. 2A-1 and 2A-2; trigger detection module 254-1, FIG. 2B-1; or trigger detection module 284-1, FIG. 2C-1) and/or a notification module (e.g., notification module 228, FIGS. 2A-1 and 2A-2, notification module 258-1, FIG. 2B-1, or notification module 288-1, FIG. 2C-1) are used to, after notifying the host of the trigger condition for reducing declared capacity of the non-volatile memory of the respective storage device: (1) re-evaluate the trigger condition in accordance with the one or more metrics of the respective storage device, and (2) in accordance with a determination that the trigger condition is no longer valid, notify the host of an absence of the trigger condition for reducing declared capacity of the non-volatile memory of the respective storage device, as described above with respect to FIGS. 2A-1, 2A-2, 2B-1, and 2C-1.

In some embodiments, any operations of method 1100 described above are performed by a storage system, the storage system including (1) non-volatile memory (e.g., comprising one or more non-volatile storage devices, such as flash memory devices), (2) one or more processors, and (3) controller memory (e.g., non-volatile memory or volatile memory in or coupled to a controller of the storage system) storing one or more programs, which when executed by the one or more processors cause the storage system to perform or control performance of any of the methods described herein.

In some embodiments, any operations of method 1100 described above are performed by a storage system including means for performing any of the methods described herein.

In some embodiments, any operations of method 1100 described above are performed by a storage system including (1) a plurality of storage devices, (2) one or more subsystems having one or more processors, and (3) memory (e.g., non-volatile memory or volatile memory in the storage system) storing one or more programs, which when executed by the one or more processors cause the one or more subsystems to perform or control performance of any of the methods described herein.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The semiconductor memory elements located within and/or over a substrate may be arranged in two or three dimensions, such as a two dimensional memory structure or a three dimensional memory structure.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array; or two or more 2D and/or 3D memory devices, packaged together to form a stacked-chip memory device.

One of skill in the art will recognize that this invention is not limited to the two dimensional and three dimensional structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first storage device could be termed a second storage device, and, similarly, a second storage device could be termed a first storage device, without changing the meaning of the description, so long as all occurrences of the "first storage device" are renamed consistently and all occurrences of the "second storage device" are renamed consistently. The first storage device and the second storage device are both storage devices, but they are not the same storage device.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of managing a storage system, the method comprising:
   obtaining, for each storage device of a plurality of storage devices of the storage system, one or more metrics of the storage device, the storage device including non-volatile memory;
   detecting a trigger condition for reducing declared capacity of the non-volatile memory of a respective storage device of the plurality of storage devices of the storage system, wherein declared capacity is storage capacity available to a host and wherein a total storage capacity of the non-volatile memory of the respective storage device includes declared capacity and over-provisioning, the trigger condition detected in accordance with the one or more metrics of one or more storage devices of the plurality of storage devices;
   enabling an amelioration process associated with the detected trigger condition, the amelioration process to reduce declared capacity of the non-volatile memory of the respective storage device;
   prior to detecting the trigger condition, detecting a first wear condition of the non-volatile memory of the respective storage device; and
   in response to detecting the first wear condition, performing a remedial action that reduces over-provisioning of the non-volatile memory of the respective storage device without reducing declared capacity of the non-volatile memory of the respective storage device;
   wherein detecting the trigger condition comprises detecting a second wear condition distinct from the first wear condition.

2. The method of claim 1, wherein enabling the amelioration process associated with the detected trigger condition includes notifying the host to which the respective storage device is operatively coupled of the trigger condition.

3. The method of claim 1, wherein enabling the amelioration process associated with the detected trigger condition includes:
   receiving a query from the host to which the respective storage device is operatively coupled; and
   in response to receiving the query, reporting the trigger condition.

4. The method of claim 1, wherein enabling the amelioration process associated with the detected trigger condition includes:
   receiving a command from the host to which the respective storage device is operatively coupled; and
   in response to receiving the command, sending a response to the command and a notification of the trigger condition.

5. The method of claim 1, wherein enabling the amelioration process associated with the detected trigger condition includes:
   receiving a command from the host to which the respective storage device is operatively coupled; and
   in response to receiving the command, sending a response to the command and a notification that prompts the host to obtain information with respect to the trigger condition.

6. The method of claim 1, wherein the host includes a client on behalf of which data is stored in the storage system.

7. The method of claim 1, wherein the host includes a storage system controller of the storage system.

8. The method of claim 1, wherein the host includes a cluster controller of the storage system.

9. The method of claim 1, wherein enabling the amelioration process associated with the detected trigger condition includes scheduling the amelioration process to be performed on the respective storage device.

10. The method of claim 1, wherein enabling the amelioration process associated with the detected trigger condition includes determining one or more parameters for the amelioration process.

11. The method of claim 10, wherein enabling the amelioration process associated with the detected trigger condition further includes reporting at least a subset of the one or more parameters for the amelioration process.

12. The method of claim 1, wherein obtaining one or more metrics of the respective storage device includes obtaining at least one metric, of the one or more metrics, for each memory portion of a plurality of memory portions of the respective storage device.

13. The method of claim 1, wherein the one or more metrics of the respective storage device include one or more status metrics corresponding to the respective storage device's ability to retain data.

14. The method of claim 1, wherein the one or more metrics of the respective storage device include one or more performance metrics corresponding to performance of the respective storage device.

15. The method of claim 1, wherein the one or more metrics of the respective storage device include one or more wear metrics corresponding to wear on the respective storage device.

16. The method of claim 1, wherein the one or more metrics of the respective storage device include one or more time metrics.

17. The method of claim 1, wherein the one or more metrics of the respective storage device include values of the one or more metrics from more than one time.

18. The method of claim 1, further comprising:
after enabling the amelioration process:
re-evaluating the trigger condition in accordance with the one or more metrics of the one or more storage devices of the plurality of storage devices; and
in accordance with a determination that the trigger condition is no longer valid, aborting the amelioration process to reduce declared capacity of the non-volatile memory of the respective storage device.

19. The method of claim 1, wherein the obtaining, the enabling, or both the obtaining and the enabling are performed by one or more subsystems of the storage system distinct from the plurality of storage devices.

20. The method of claim 1, wherein the respective storage device comprises one or more flash memory devices.

21. A storage system, comprising:
non-volatile memory;
one or more processors; and
controller memory storing one or more programs, which when executed by the one or more processors cause the storage system to perform operations comprising:
obtaining, for each storage device of a plurality of storage devices of the storage system, one or more metrics of the storage device, the storage device including non-volatile memory;
detecting a trigger condition for reducing declared capacity of the non-volatile memory of a respective storage device of the plurality of storage devices of the storage system, wherein declared capacity is storage capacity available to a host and wherein a total storage capacity of the non-volatile memory of the respective storage device includes declared capacity and over-provisioning, the trigger condition detected in accordance with the one or more metrics of one or more storage devices of the plurality of storage devices;
enabling an amelioration process associated with the detected trigger condition, the amelioration process to reduce declared capacity of the non-volatile memory of the respective storage device;
prior to detecting the trigger condition, detecting a first wear condition of the non-volatile memory of the respective storage device; and
in response to detecting the first wear condition, performing a remedial action that reduces over-provisioning of the non-volatile memory of the respective storage device without reducing declared capacity of the non-volatile memory of the respective storage device;
wherein detecting the trigger condition comprises detecting a second wear condition distinct from the first wear condition.

22. The storage system of claim 21, wherein the one or more metrics of the respective storage device include one or more status metrics corresponding to the respective storage device's ability to retain data.

23. The storage system of claim 21, wherein the one or more metrics of the respective storage device include one or more performance metrics corresponding to performance of the respective storage device.

24. The storage system of claim 21, wherein the respective storage device comprises one or more flash memory devices.

25. A non-transitory computer readable storage medium, storing one or more programs configured for execution by one or more processors of a storage system, the one or more programs including instructions for:
obtaining, for each storage device of a plurality of storage devices of the storage system, one or more metrics of the storage device, the storage device including non-volatile memory;
detecting a trigger condition for reducing declared capacity of the non-volatile memory of a respective storage device of the plurality of storage devices of the storage system, wherein declared capacity is storage capacity available to a host and wherein a total storage capacity of the non-volatile memory of the respective storage device includes declared capacity and over-provisioning, the trigger condition detected in accordance with the one or more metrics of one or more storage devices of the plurality of storage devices;
enabling an amelioration process associated with the detected trigger condition, the amelioration process to reduce declared capacity of the non-volatile memory of the respective storage device;
prior to detecting the trigger condition, detecting a first wear condition of the non-volatile memory of the respective storage device, wherein detecting the trigger condition comprises detecting a second wear condition distinct from the first wear condition; and
in response to detecting the first wear condition, performing a remedial action that reduces over-provisioning of the non-volatile memory of the respective storage device without reducing declared capacity of the non-volatile memory of the respective storage device;
wherein detecting the trigger condition comprises detecting a second wear condition distinct from the first wear condition.

26. The non-transitory computer readable storage medium of claim 25, wherein the one or more metrics of the respective storage device include one or more status metrics corresponding to the respective storage device's ability to retain data.

27. The non-transitory computer readable storage medium of claim 25, wherein the one or more metrics of the respective storage device include one or more performance metrics corresponding to performance of the respective storage device.

28. The non-transitory computer readable storage medium of claim 25, wherein the respective storage device comprises one or more flash memory devices.

* * * * *